United States Patent
Wheeler et al.

(10) Patent No.: US 11,849,541 B2
(45) Date of Patent: *Dec. 19, 2023

(54) MODULAR WIRING SYSTEM FOR ACTUATORS

(71) Applicant: Hayward Industries, Inc., Berkeley Heights, NJ (US)

(72) Inventors: Brian J. Wheeler, Odessa, FL (US); Jay T. Niland, Sr., Mocksville, NC (US)

(73) Assignee: Hayward Industries, Inc., Berkeley Heights, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/576,475

(22) Filed: Jan. 14, 2022

(65) Prior Publication Data
US 2022/0141958 A1    May 5, 2022

Related U.S. Application Data

(63) Continuation of application No. 16/659,733, filed on Oct. 22, 2019, now Pat. No. 11,266,019.

(51) Int. Cl.
| | |
|---|---|
| *H05K 1/14* | (2006.01) |
| *H01R 12/71* | (2011.01) |
| *H01H 1/58* | (2006.01) |

(52) U.S. Cl.
CPC ........... *H05K 1/141* (2013.01); *H01H 1/5805* (2013.01); *H01R 12/716* (2013.01); *H05K 2201/10053* (2013.01)

(58) Field of Classification Search
CPC .. H05K 1/141; H05K 1/2201; H05K 1/10053; H01R 12/716

(Continued)

(56) References Cited

U.S. PATENT DOCUMENTS 6,081,085 A * 6/2000 Ohashi ................. E05F 15/695
                                                            318/266
6,489,794 B1 * 12/2002 Cram ................. G01R 1/07378
                                                            324/754.2

(Continued)

FOREIGN PATENT DOCUMENTS

KR          20140046917 A      4/2014

OTHER PUBLICATIONS

HRSN3 Model On/Off & Proportional Control Submittal Guide—Quarter-Turn Electric Actuation, Product Brochure, Hayward Industries, Inc., Jul. 2016 (8 pages).

(Continued)

*Primary Examiner* — Alexander Gilman
(74) *Attorney, Agent, or Firm* — McCarter & English, LLP

(57) ABSTRACT

Exemplary embodiments are directed to modular wiring interface boards for an actuator, the interface boards including a body, electrical terminals configured to receive a signal from a field control device, electrical contacts configured to be placed in electrical communication with a backplane electrically communicating with an actuator, switching mechanisms, and a processor. Each of the switching mechanisms is positionable in a first position and a second position. The processor reconfigures a wiring configuration of the plurality of electrical terminals to accommodate different field control devices based on the positions of the plurality of switching mechanisms. Modular wiring systems for an actuator and methods of operating an actuator are also provided.

25 Claims, 57 Drawing Sheets

(58) Field of Classification Search
USPC .......................................................... 370/360
See application file for complete search history.

(56) References Cited

U.S. PATENT DOCUMENTS

| | | | | |
|---|---|---|---|---|
| 9,055,687 | B2* | 6/2015 | Molnar | H01R 13/717 |
| 10,414,357 | B1* | 9/2019 | Sorensen | G05B 19/042 |
| 10,785,862 | B2* | 9/2020 | Viswanathan | H01L 23/3735 |
| 11,088,514 | B2* | 8/2021 | Fischer | H05K 7/1465 |
| 11,266,019 | B2* | 3/2022 | Wheeler | H05K 1/141 |
| 2001/0056516 | A1* | 12/2001 | Schollenberger | H05K 7/1472 |
| | | | | 710/305 |
| 2004/0249597 | A1* | 12/2004 | Whitehead | F24F 11/30 |
| | | | | 702/118 |
| 2005/0273205 | A1* | 12/2005 | Nickerson | A01G 25/16 |
| | | | | 700/284 |
| 2006/0141931 | A1 | 6/2006 | Da Silva Neto | |
| 2007/0162158 | A1* | 7/2007 | McCoy | H04L 69/26 |
| | | | | 700/83 |
| 2007/0236346 | A1* | 10/2007 | Helal | H04L 12/2803 |
| | | | | 340/539.22 |
| 2008/0005471 | A1* | 1/2008 | Ma | G06K 19/07 |
| | | | | 711/115 |
| 2008/0147964 | A1* | 6/2008 | Chow | G06F 21/34 |
| | | | | 711/E12.001 |
| 2009/0204731 | A1* | 8/2009 | Mulligan | G06F 1/3203 |
| | | | | 710/36 |
| 2010/0201278 | A1* | 8/2010 | Zhao | H05B 45/46 |
| | | | | 315/297 |
| 2011/0226506 | A1* | 9/2011 | Hamilton | H05K 5/0017 |
| | | | | 174/59 |
| 2012/0175225 | A1 | 7/2012 | Breen et al. | |
| 2016/0320759 | A1* | 11/2016 | Macha | G06F 11/16 |
| 2017/0205103 | A1 | 7/2017 | Newcomb | |
| 2017/0212484 | A1* | 7/2017 | Potucek | H04L 43/0817 |
| 2017/0215261 | A1* | 7/2017 | Potucek | H05B 47/105 |
| 2018/0224822 | A1* | 8/2018 | Potucek | G05B 19/042 |
| 2018/0284758 | A1* | 10/2018 | Cella | G06N 3/084 |
| 2019/0018377 | A1* | 1/2019 | Potucek | G05B 19/0421 |
| 2019/0025813 | A1* | 1/2019 | Cella | G01M 13/045 |
| 2019/0385057 | A1* | 12/2019 | Litichever | H04L 63/14 |
| 2020/0348662 | A1* | 11/2020 | Cella | G05B 23/0286 |
| 2021/0120671 | A1* | 4/2021 | Wheeler | H05K 1/141 |
| 2021/0157312 | A1* | 5/2021 | Cella | G06Q 10/063 |
| 2022/0107614 | A1* | 4/2022 | Pleva | G05B 19/042 |

OTHER PUBLICATIONS

International Search Report and Written Opinion of the International Searching Authority, dated Feb. 1, 2021, issued in connection with International Application No. PCT/US2020/056789 (16 pages).
Notice of Allowance dated Sep. 9, 2021, issued in connection with U.S. Appl. No. 16/659,733 (9 pages).
Corrected Notice of Allowability dated Sep. 17, 2021, issued in connection with U.S. Appl. No. 16/659,733 (2 pages).
Extended European Search Report dated Oct. 24, 2023, issued in connection with European Appl. No. 20879538.5 (8 pages).

* cited by examiner

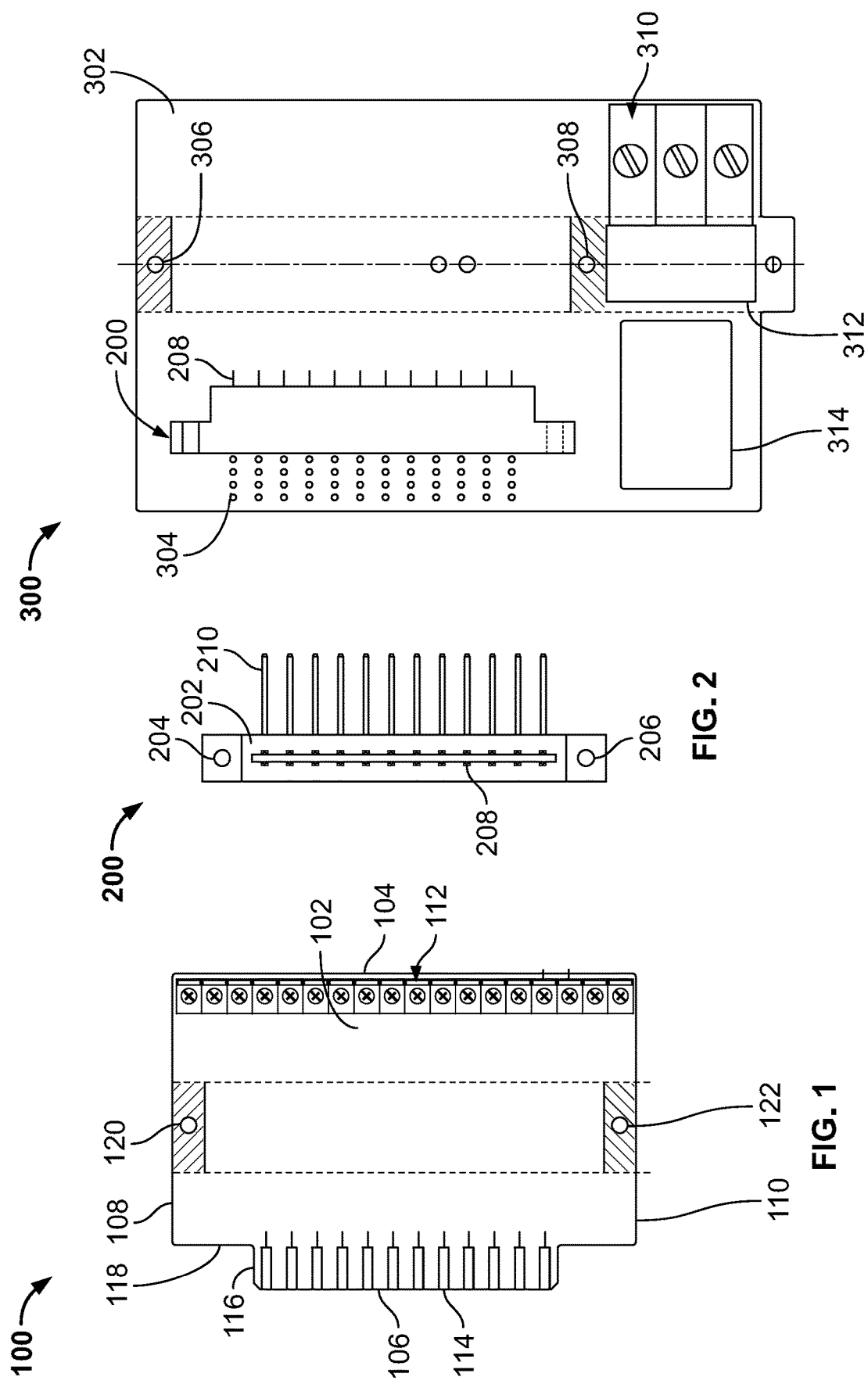

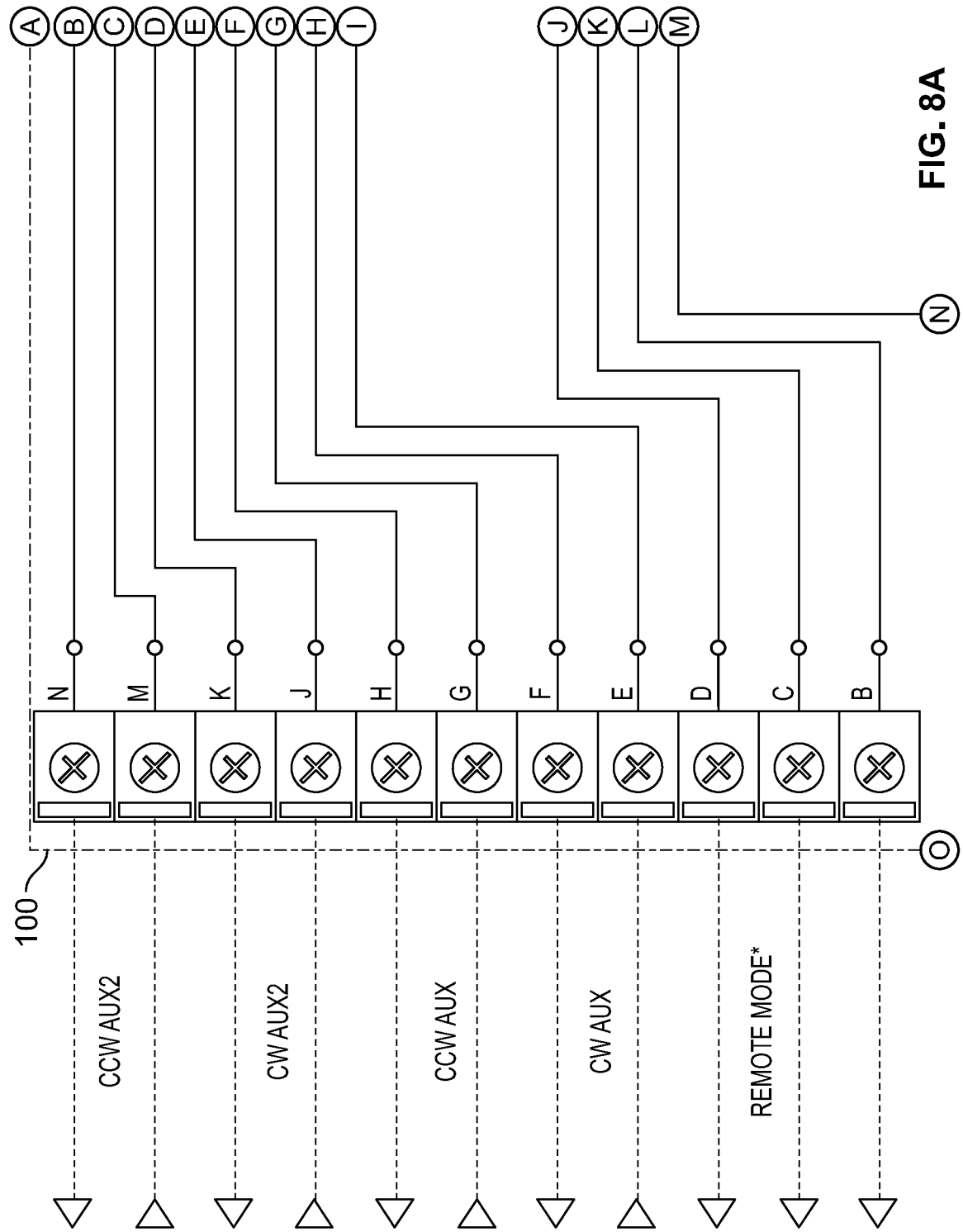

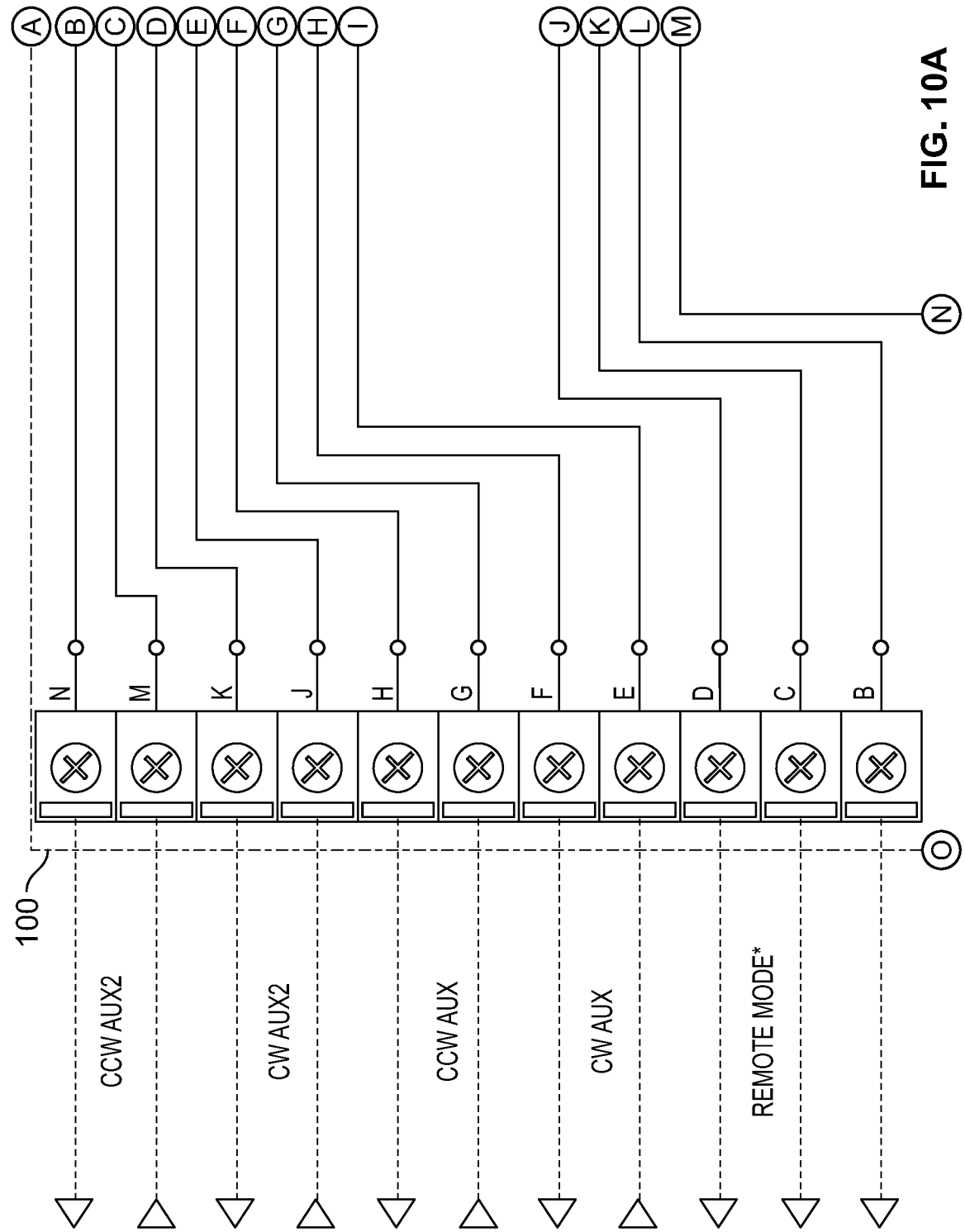

MODULAR WIRING SYSTEM FOR ACTUATORS

RELATED APPLICATIONS

The present application is a continuation of, and claims benefit of priority to, U.S. patent application Ser. No. 16/659,733, filed on Oct. 22, 2019, the entire disclosure of which is expressly incorporated by reference herein.

TECHNICAL FIELD

The present disclosure relates to modular wiring systems for actuators and, particularly, modular control wiring interface boards for electric actuators.

BACKGROUND

In the field of electric actuation for the flow control industry, electric actuators are commonly supplied with components such as a torque transmitting gear train, an electric motor, a printed circuit board (PCB), travel limit device(s) (e.g., limit switches), position control (e.g., through limit switches or a potentiometer), wiring terminals, combinations thereof or the like. Electric actuators are generally available in multi-turn or quarter-turn (e.g., 90° travel) configurations. The wiring terminals are generally provided such that the power source lines are hard-wired directly to the wiring terminals of the actuator.

Electric actuators can be supplied in different voltages depending on the requirements of the user/system and the available supply voltage. For example, the supply voltage can be direct current (e.g., 12 VDC, or 24 VDC), alternating current single phase (24 VAC, 120 VAC, or 230 VAC), or alternating current three phase (e.g., 480 VAC). Actuators are generally manufactured and configured for each specific main supply voltage. As such, the end user generally knows and specifies the available operating voltage prior to purchasing the actuator, and the actuator manufacturer supplies an actuator specifically constructed to operate off of the voltage specified by the end user.

Separate from the main supply voltage, control circuitry can be used to control the motion of the motor and provide feedback to a centralized control system. As with the main supply voltage, the control voltage is typically fixed or dedicated such that a user orders an actuator with the main supply voltage and control voltage defined, and the supplier subsequently provides an actuator hardwired for the specified main supply voltage and control voltage. The control voltage can be direct current (e.g., 12 VDC, 24 VDC, or 48 VDC), or alternating current single phase (e.g., 12 VAC, 24 VAC, 4120 VAC, or 230 VAC).

In addition to the high number of possible control voltages, there are several control wiring configurations that can be used based on how the control voltage is connected to the actuator. The different combinations of main supply voltage, control voltage, and control voltage wiring configurations are generally addressed as individual products for each combination based on the needs of the end user. In order to accommodate its customers and meet all possible supply and/or control voltage market requirements, it is possible that manufacturers and/or suppliers may market, produce, and/or stock potentially thousands of individual actuator configurations or produce specific actuators as ordered, which could result in increased inventory or extended lead times for product delivery.

Thus, despite efforts to date, a need remains for cost-effective wiring systems for actuators capable of being reconfigured to accommodate the different combinations of main supply voltages, control voltages, and control wiring. These and other needs are addressed by the modular wiring systems of the present disclosure.

SUMMARY

In accordance with embodiments of the present disclosure, exemplary modular wiring interface boards (e.g., circuit boards) for an actuator are provided. The modular wiring interface boards include a body, a plurality of electrical terminals each configured to receive a signal from a field control device, one or more electrical contacts configured to be placed in electrical communication with a backplane electrically communicating with an actuator, a plurality of switching mechanisms, and a processor (e.g., a microcontroller, a logic processor, a microprocessor, a logic controller, a digital processor, a digital data manipulation component, or any other controller capable of modifying logic signals) in electrical communication with the plurality of electrical terminals, the one or more electrical contacts, and the plurality of switching mechanisms. Each of the plurality of switching mechanisms can be positionable in a first position (e.g., an ON position) and a second position (e.g., an OFF position). The processor can reconfigure a wiring configuration of the plurality of electrical terminals to accommodate different field control devices based on the positions of the plurality of switching mechanisms.

In some embodiments, the backplane receives a main supply voltage. In some embodiments, the main supply voltage can be at least one of 12 VDC, 24 VDC, 24 VAC, 120 VAC, 240 VAC, or 480 VAC. The modular wiring interface board can be configurable for use with the main supply voltage received by the backplane. At least one of the plurality of electrical terminals can be configured to receive a control voltage. In some embodiments, the control voltage can be at least one of 12 VDC, 12 VAC, 24 VAC, 24 VDC, 48 VDC, 120 VAC, or 230 VAC. In some embodiments, each of the switching mechanisms can be a dual in-line package (DIP) switch. In some embodiments, each of the switching mechanisms can be at least one of a dual in-line package (DIP) switch, a rotary switch, a header and jumper system, or an auto-sensing/auto-selecting microprocessor.

In some embodiments, the wiring configuration of the modular wiring interface board can be at least one of a 2-wire single contact closure interface, a 3-wire inch/jog interface, a 3-wire momentary interface, or a 4-wire momentary with stop interface. In some embodiments, the modular wiring interface board can include two switching mechanisms. In such embodiments, for a 2-wire single contact closure interface wiring configuration, a first switch of the plurality of switching mechanisms can be positioned in the second position (e.g., an OFF position), and a second switch of the plurality of switching mechanisms can be positioned in the second position. In such embodiments, for a 3-wire inch/jog interface wiring configuration, a first switch of the plurality of switching mechanisms can be positioned in the first position (e.g., an ON position), and a second switch of the plurality of switching mechanisms can be positioned in the second position. In such embodiments, for a 3-wire momentary interface wiring configuration, a first switch of the plurality of switching mechanisms can be positioned in the second position, and a second switch of the plurality of switching mechanisms can be positioned in the first position. In such embodiments, for a 4-wire momentary with stop interface wiring configuration, a first switch of the plurality of switching mechanisms can be positioned in the first position, and a second switch of the plurality of switching mechanisms can be positioned in the first position.

In some embodiments, the modular wiring interface board can include four switching mechanisms. In such embodiments, for a 2-wire single contact closure interface wiring configuration, a first switch of the plurality of switching mechanisms can be positioned in the second position, a second switch of the plurality of switching mechanisms can be positioned in the second position, a third switch of the plurality of switching mechanisms can be positioned in the second position, and a fourth switch of the plurality of switching mechanisms can be positioned in the second position. In such embodiments, for a 3-wire inch/jog interface wiring configuration, a first switch of the plurality of switching mechanisms can be positioned in the second position, a second switch of the plurality of switching mechanisms can be positioned in the second position, a third switch of the plurality of switching mechanisms can be positioned in the first position, and a fourth switch of the plurality of switching mechanisms can be positioned in the second position. In such embodiments, for a 3-wire momentary interface wiring configuration, a first switch of the plurality of switching mechanisms can be positioned in the second position, a second switch of the plurality of switching mechanisms can be positioned in the second position, a third switch of the plurality of switching mechanisms can be positioned in the second position, and a fourth switch of the plurality of switching mechanisms can be positioned in the first position. In such embodiments, for a 4-wire momentary with stop interface wiring configuration, a first switch of the plurality of switching mechanisms can be positioned in the second position, a second switch of the plurality of switching mechanisms can be positioned in the second position, a third switch of the plurality of switching mechanisms can be positioned in the first position, and a fourth switch of the plurality of switching mechanisms can be positioned in the first position. It should be understood that for each of the wiring configurations, the first and second switching mechanisms can be maintained in the second position (e.g., an OFF position), with only the combination of positions of the third and fourth switching mechanisms being used to reconfigure the interface board for the desired wiring configuration.

In some embodiments, the modular wiring interface board can include electrical isolating components configured to isolate all input and/or all output signals of the modular wiring interface board. The electrical isolating components can include at least one opto-relay and at least one opto-isolator. In some embodiments, the processor can be a complex programmable logic device (CPLD).

In accordance with embodiments of the present disclosure, modular wiring systems for an actuator are provided. The modular wiring systems include a backplane configured to be placed in electrical communication with an actuator, an edge board connector configured to be placed in electrical communication with the backplane, and a modular wiring interface board configured to be placed in electrical communication with the edge board connector. The modular wiring interface board includes a body, a plurality of electrical terminals each configured to receive a signal from a field control device, one or more electrical contacts configured to be placed in electrical communication with the backplane electrically communicating with the actuator, a plurality of switching mechanisms, and a processor in electrical communication with the plurality of electrical terminals, the one or more electrical contacts, and the plurality of switching mechanisms. Each of the plurality of switching mechanisms can be positionable in a first position (e.g., an ON position) and a second position (e.g., an OFF position). The processor can reconfigure a wiring configuration of the plurality of electrical terminals to accommodate different field control devices based on the positions of the plurality of switching mechanisms.

The modular wiring interface board can be removable from the edge board connector of the backplane and can be replaceable. In some embodiments, the backplane can receive a main supply voltage. In some embodiments, the main supply voltage can be at least one of 12 VDC, 24 VDC, 24 VAC, 120 VAC, 240 VAC, or 480 VAC. The modular wiring interface board can be configurable for use with the main supply voltage received by the backplane. At least one of the plurality of electrical terminals can be configured to receive a control voltage. In some embodiments, the control voltage can be at least one of 12 VDC, 12 VAC, 24 VAC, 24 VDC, 48 VDC, 120 VAC, or 230 VAC. In some embodiments, each of the switching mechanisms can be a dual in-line package (DIP) switch. In some embodiments, each of the switching mechanisms can be at least one of a dual in-line package (DIP) switch, a rotary switch, a header and jumper system, or an auto-sensing/auto-selecting microprocessor.

In some embodiments, the wiring configurations of the modular wiring interface board can be at least one of a 2-wire single contact closure interface, a 3-wire inch/jog interface, a 3-wire momentary interface, or a 4-wire momentary with stop interface. In some embodiments, the modular wiring interface board can include two switching mechanisms. In such embodiments, for a 2-wire single contact closure interface wiring configuration, a first switch of the plurality of switching mechanisms can be positioned in the second position, and a second switch of the plurality of switching mechanisms can be positioned in the second position. In such embodiments, for a 3-wire inch/jog interface wiring configuration, a first switch of the plurality of switching mechanisms can be positioned in the first position, and a second switch of the plurality of switching mechanisms can be positioned in the second position. In such embodiments, for a 3-wire momentary interface wiring configuration, a first switch of the plurality of switching mechanisms can be positioned in the second position, and a second switch of the plurality of switching mechanisms can be positioned in the first position. In such embodiments, for a 4-wire momentary with stop interface wiring configuration, a first switch of the plurality of switching mechanisms can be positioned in the first position, and a second switch of the plurality of switching mechanisms can be positioned in the first position.

In some embodiments, the modular wiring interface board can include four switching mechanisms. In such embodiments, for a 2-wire single contact closure interface wiring configuration, a first switch of the plurality of switching mechanisms can be positioned in the second position, a second switch of the plurality of switching mechanisms can be positioned in the second position, a third switch of the plurality of switching mechanisms can be positioned in the second position, and a fourth switch of the plurality of switching mechanisms can be positioned in the second position. In such embodiments, for a 3-wire inch/jog interface wiring configuration, a first switch of the plurality of switching mechanisms can be positioned in the second position, a second switch of the plurality of switching mechanisms can be positioned in the second position, a third switch of the plurality of switching mechanisms can be positioned in the first position, and a fourth switch of the plurality of switching mechanisms can be positioned in the second position. In such embodiments, for a 3-wire momentary interface wiring configuration, a first switch of the plurality of switching mechanisms can be positioned in the second position, a second switch of the plurality of switching mechanisms can be positioned in the second position, a third switch of the plurality of switching mechanisms can be positioned in the second position, and a fourth switch of the plurality of switching mechanisms can be positioned in the first position. In such embodiments, for a 4-wire momentary with stop interface wiring configuration, a first switch of the plurality of switching mechanisms can be positioned in the second position, a second switch of the plurality of switching mechanisms can be positioned in the second position, a third switch of the plurality of switching mechanisms can be positioned in the first position, and a fourth switch of the plurality of switching mechanisms can be positioned in the first position. It should be understood that for each of the wiring configurations, the first and second switching mechanisms can be maintained in the second position, with only the combination of positions of the third and fourth switching mechanisms being used to reconfigure the interface board for the desired wiring configuration.

In some embodiments, the modular wiring interface board can include electrical isolating components configured to isolate all input and all output signals of the modular wiring interface board. The electrical isolating components can include at least one opto-relay and at least one opto-isolator. In some embodiments, the processor can be a complex programmable logic device (CPLD).

In some embodiments, the modular wiring system can include a 5-wire interface board configured to be placed in electrical communication with the backplane. The 5-wire interface board can include a body, a plurality of electrical terminals each configured to receive a signal from a field control device, and one or more electrical contacts configured to be placed in electrical communication with the backplane electrically communicating with the actuator. The electrical terminals of the 5-wire interface board can be directly connected to electrical contacts of the edge board device without incorporation of switching mechanisms.

In accordance with embodiments of the present disclosure, exemplary methods of operating an actuator are provided. The methods include electrically connecting a modular wiring interface board to an actuator. The modular wiring interface board includes a body, a plurality of electrical terminals, one or more electrical contacts configured to be placed in electrical communication with the backplane electrically communicating with the actuator, a plurality of switching mechanisms, and a processor in electrical communication with the plurality of electrical terminals, the one or more electrical contacts, and the plurality of switching mechanisms. The methods include providing a signal from a field control device to at least one of the plurality of electrical terminals. The methods include providing a main supply voltage to the backplane. The methods include positioning each of the plurality of switching mechanisms in a first position (e.g., an ON position) or a second position (e.g., an OFF position). The methods include reconfiguring a wiring configuration of the plurality of electrical terminals with the processor to accommodate different field control devices based on the positions of the plurality of switching mechanisms.

In some embodiments, the wiring configuration of the modular wiring interface board can be at least one of a 2-wire single contact closure interface, a 3-wire inch/jog interface, a 3-wire momentary interface, or a 4-wire momentary with stop interface. In some embodiments, the modular wiring interface board can include two switching mechanisms. In such embodiments, for a 2-wire single contact closure interface wiring configuration, the methods can include positioning a first switch of the plurality of switching mechanisms in the second position (e.g., an OFF position), and positioning a second switch of the plurality of switching mechanisms in the second position. In such embodiments, for a 3-wire inch/jog interface wiring configuration, the methods can include positioning a first switch of the plurality of switching mechanisms in the first position (e.g., an ON position), and positioning a second switch of the plurality of switching mechanisms in the second position. In such embodiments, for a 3-wire momentary interface wiring configuration, the methods can include positioning a first switch of the plurality of switching mechanisms in the second position, and positioning a second switch of the plurality of switching mechanisms in the first position. In such embodiments, for a 4-wire momentary with stop interface wiring configuration, the methods can include positioning a first switch of the plurality of switching mechanisms in the first position, and positioning a second switch of the plurality of switching mechanisms in the first position.

In some embodiments, the modular wiring interface board can include four switching mechanisms. In such embodiments, the methods can include positioning a first switch of the plurality of switching mechanisms in the second position, positioning a second switch of the plurality of switching mechanisms in the second position, positioning a third switch of the plurality of switching mechanisms in the second position, and positioning a fourth switch of the plurality of switching mechanisms in the second position for a 2-wire single contact closure interface wiring configuration. In such embodiments, the methods can include positioning a first switch of the plurality of switching mechanisms in the second position, positioning a second switch of the plurality of switching mechanisms in the second position, positioning a third switch of the plurality of switching mechanisms in the first position, and positioning a fourth switch of the plurality of switching mechanisms in the second position for a 3-wire inch/jog interface wiring configuration. In such embodiments, the methods can include positioning a first switch of the plurality of switching mechanisms in the second position, positioning a second switch of the plurality of switching mechanisms in the second position, positioning a third switch of the plurality of switching mechanisms in the second position, and positioning a fourth switch of the plurality of switching mechanisms in the first position for a 3-wire momentary interface wiring configuration. In such embodiments, the methods can include positioning a first switch of the plurality of switching mechanisms in the second position, positioning a second switch of the plurality of switching mechanisms in the second position, positioning a third switch of the plurality of switching mechanisms in the first position, and positioning a fourth switch of the plurality of switching mechanisms in the first position for a 4-wire momentary with stop interface wiring configuration. It should be understood that for each of the wiring configurations, the first and second switching mechanisms can be maintained in the second position, with only the combination of positions of the third and fourth switching mechanisms being used to reconfigure the interface board for the desired wiring configuration.

In accordance with embodiments of the present disclosure, an exemplary method of operating an actuator is provided. The method includes electrically connecting a backplane of a modular wiring system with an actuator. The method includes electrically connecting an edge board connector of the modular wiring system with the backplane. The method includes electrically connecting a modular wiring interface board of the modular wiring system with the edge board connector. The modular wiring interface board includes a body, a plurality of electrical terminals, one or more electrical contacts configured to be placed in electrical communication with the backplane electrically communicating with the actuator, a plurality of switching mechanisms, and a processor (e.g., a microcontroller, a logic processor, a microprocessor, a logic controller, a digital processor, a digital data manipulation component, or any other controller capable of modifying logic signals) in electrical communication with the plurality of electrical terminals, the one or more electrical contacts, and the plurality of switching mechanisms. The method includes positioning the plurality of switching mechanisms in a first position (e.g., an ON position) or a second position (e.g., an OFF position). The method includes reconfiguring a wiring configuration of the plurality of electrical terminals with the processor to accommodate different field control devices based on the positions of the plurality of switching mechanisms.

In accordance with embodiments of the present disclosure, an exemplary method of configuring an actuator with a modular wiring system is provided. The modular wiring system includes a backplane configured to be placed in electrical communication with an actuator, an edge board connector configured to be placed in electrical communication with the backplane, and a modular wiring interface board configured to be placed in electrical communication with the edge board connector. The modular wiring interface board includes a body, a plurality of electrical terminals each configured to receive a signal from a field control device, one or more electrical contacts configured to be placed in electrical communication with the backplane electrically communicating with the actuator, a plurality of switching mechanisms, and a processor (e.g., a microcontroller, a logic processor, a microprocessor, a logic controller, a digital processor, a digital data manipulation component, or any other controller capable of modifying logic signals) in electrical communication with the plurality of electrical terminals, the one or more electrical contacts, and the plurality of switching mechanisms. The method includes positioning the plurality of switching mechanisms in a first position or a second position. The method includes reconfiguring a wiring configuration of the plurality of electrical terminals with the processor to accommodate different field control devices based on the positions of the plurality of switching mechanisms.

Other features will become apparent from the following detailed description considered in conjunction with the accompanying drawings. It is to be understood, however, that the drawings are designed as an illustration only and not as a definition of the limits of the invention.

BRIEF DESCRIPTION OF THE DRAWINGS

To assist those of skill in the art in making and using the disclosed modular wiring systems, reference is made to the accompanying figures, wherein:

FIG. 1 shows a top view of an exemplary modular wiring interface board according to the present disclosure;

FIG. 2 shows a top view of an exemplary edge board connector according to the present disclosure;

FIG. 3 shows a top view of an exemplary backplane according to the present disclosure;

FIGS. 8A-8F show a wiring diagram of a backplane and modular wiring interface board for a 24 VAC/VDC supply voltage for 2-wire single contact closure, 3-wire inch/jog, 3-wire momentary, or 4-wire momentary with stop interfaces with external power supply according to the present disclosure;

FIGS. 10A-10F show a wiring diagram of a backplane and modular wiring interface board for a 24 VAC/VDC supply voltage for a 5-wire interface with local control according to the present disclosure;

DETAILED DESCRIPTION

Figure 4:
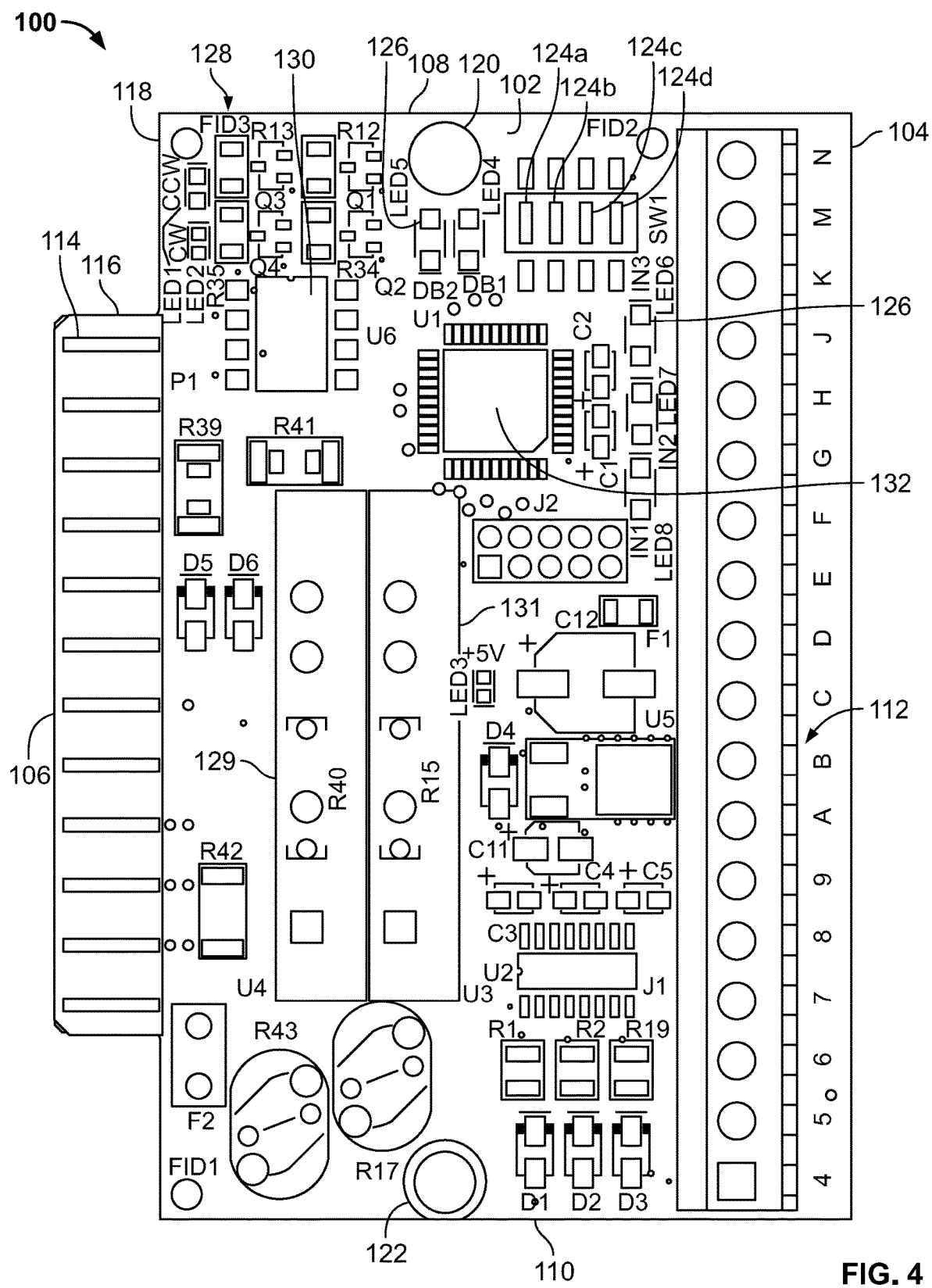
FIG. 4 shows a top diagrammatic view of the modular wiring interface board of FIG. 1.

It should be understood that the relative terminology used herein, such as "front," "rear," "left," "top," "bottom," "vertical," and "horizontal" is solely for the purposes of clarity and designation and is not intended to limit the invention to embodiments having a particular position and/or orientation. Accordingly, such relative terminology should not be construed to limit the scope of the present invention. In addition, it should be understood that the invention is not limited to embodiments having specific dimensions. Thus, any dimensions provided herein are merely for an exemplary purpose and are not intended to limit the invention to embodiments having particular dimensions. Although discussed herein with respect to the flow control industry, it should be understood that the exemplary systems can be used with any type of actuator controls. As discussed herein, the terms clockwise and counter-clockwise refer to rotational movement for a valve coupled to an actuator as viewed from the top down on the device as the valve turns, with clockwise rotational movement moving the valve into or toward a closed position and counter-clockwise movement moving the valve into or toward an open position. As discussed herein, fully open and fully closed are terms used in reference to the open or closed position of the valve to which the actuator is coupled.

With reference to FIGS. 1-3, top views of an exemplary modular wiring interface board 100 (hereinafter "interface board 100"), an exemplary edge board connector 200, and an exemplary backplane 300 are provided (collectively referred to herein as a "modular wiring system" or "system"). The edge board connector 200 mounts and electrically couples to the backplane 300, as shown in FIG. 3. The interface board 100 can be removably plugged into the edge board connector 200 to electrically couple the interface board 100 with the edge board connector 200 (and the backplane 300 via the edge board connector 200). In some embodiments, rather than being electrically connected to an actuator, the interface board 100 can be incorporated into the actuator itself. Although the backplane 300 is illustrated as substantially rectangular in configuration, in some embodiments, the backplane 300 can be, e.g., rectangular, square, round, oblong, or the like, based on the configuration and/or dimensions of the device into which the backplane 300 is fitted.

The interface board 100 provides a modular, pluggable/insertable wiring interface allowing a single actuator to be used with different wiring configurations, e.g., 2-wire single contact closure, 3-wire inch/jog, 3-wire momentary, 4-wire momentary with stop, and 5-wire standard. Particularly, the interface board 100 includes electronic components and/or circuitry that enable the interface board 100 to be used with each of the wiring configuration requirements. The different wiring configurations can be provided on a single board or can be provided on different boards, e.g., one board for the 2-wire single contact closure interface, one board for the 3-wire inch/job interface, or the like. As will be discussed in greater detail below, the different wiring configurations can be selected through the use of switches (e.g., dual in-line package (DIP) switches, a switch panel, or the like) and a programmable logic device. Different combinations of the switch positions results in one of the noted wiring configurations. A standard "base" actuator can thereby be converted into an actuator capable of being used with each of the different control wiring requirements.

As discussed herein, the 2-wire control wiring configuration allows an actuator to drive fully open (FO), or fully closed (FC). Fully open and fully closed are terms used in the valve actuation industry in reference to the open or closed position of the valve to which the actuator is coupled. In terms of operating direction, quarter-turn actuators are generally designed for counter-clockwise (CCW) rotation to open, and clockwise (CW) rotation to close. The actuator either drives fully open or fully closed, and completes a full 90° rotation to the end of the respective cycle. The only way to reverse direction with the 2-wire control wiring configuration is to wait until the actuator completes its full 90° cycle, and then respond to the reverse signal or command.

As discussed herein, the 3-wire inch/jog control wiring configuration has two contact closures and allows the actuator to be driven CW or CCW, as long as the respective contact is closed or the actuator reaches its end-of-travel position. If the contact is closed and then suddenly opened, the motion of the actuator stops, leaving the actuator in the position it was in when the contact was opened. If the contact is subsequently closed again, the actuator continues to travel in the direction of rotation of the initial command. The actuator can thereby be moved incrementally (e.g., jogged, inched, or the like) in the direction of rotation until the desired position is reached. In some embodiments, the contact command can be manual (e.g., via a local control mechanism located at or near the actuator). In some embodiments, the contact command can be automatic (e.g., via a remote command). For example, for a remote command, a programmable logic controller (PLC) and/or a supervisory control and data acquisition (SCADA) system can be used. The 3-wire inch/jog control wiring configuration can accept external 120 VAC or 24 VAC/VDC commands, or internal 24 VDC commands. In the 3-wire inch/jog control wiring configuration, the actuator can be commanded to start and stop (e.g., inch along) in the direction of travel. The actuator can also be fully stopped at any increment along the 90° rotation and either restarted in the same direction, or the direction of rotation can be reversed. As an example, the 3-wire inch/jog control wiring configuration can be used to position a disc of a butterfly valve to achieve a particular flow rate within a pipe, or system, and the flow can be dialed in by inching or jogging (e.g., stopping/starting in small increments) the actuator along the direction of rotation until the desired flow rate is achieved, at which point the actuator would be left in the desired position.

As discussed herein, the 3-wire momentary control wiring configuration has two contact closures. However, a momentary closure command drives the actuator either CW or CCW. There is no stop command in the 3-wire momentary control wiring configuration (as compared to the 3-wire inch/jog configuration). The distinction from the 3-wire inch/jog configuration is that once the drive command is initiated with the 3-wire momentary control wiring configuration, the actuator continues running in the initial direction of rotation and attempts to complete the full cycle in either the CW or CCW direction. If a reverse command is given during the original cycle, the actuator pauses before reversing the operating direction, and then attempts to drive fully to the end of stroke in the reverse direction. In the 3-wire momentary control wiring configuration, the actuator can never be fully stopped in mid-rotation.

As discussed herein, the 4-wire momentary with stop control wiring configuration is similar to the 3-wire momentary control wiring configuration, except that the 4-wire momentary with stop control wiring configuration incorporates a stop command. The actuator can thereby be fully stopped during rotation. The actuator must receive a stop command in order to stop rotation. Once stopped, the actuator can either be held in the position where the actuator was stopped, the direction of rotation can be reversed, or the operation of the actuator can be restarted to continue rotating in the original direction.

As discussed herein, the 5-wire standard wiring configuration is the same as the 3-wire inch/jog control wiring configuration (e.g., ability to start, stop, continue, and/or reverse the actuator). However, with the 5-wire standard wiring configuration, control commands are provided internally from the actuator power supply, and there is no direct wiring of external power to the control wiring terminals.

Turning back to FIG. 1, the interface board 100 includes a body 102 with a first side 104 (e.g., a right side), an opposing second side 106 (e.g., a left side), a first edge 108 (e.g., a top side), and a bottom edge 110 (e.g., a bottom side). FIG. 1 shows the top surface of the interface board 100, with the bottom surface not visible. The first side 104 can include a plurality of electrical terminals 112 disposed adjacent to and along the entire or nearly entire length of the first side 104. In some embodiments, the interface board 100 can include eighteen terminals 112. The opposing side 106 can include a plurality of contacts 114 on both the top and bottom surfaces of the interface board 100. In some embodiments, the top surface of the interface board 100 can include twelve electrical contacts 114 (e.g., contact fingers), and the bottom surface of the interface board 100 can include twelve electrical contacts 114, with the contacts of the top and bottom surface electrically separated from each other.

The interface board 100 can include a protrusion 116 extending from an edge 118 parallel to the first side 104, with the outermost surface of the protrusion 116 defining the second side 106. The contacts 114 can be disposed along the length of the protrusion 116 in a spaced manner. The protrusion 116 and contacts 114 can be configured to be inserted into and/or electrically coupled with complementary contacts or slots of the edge board connector 200. The interface board 100 can include mounting holes 120, 122 on opposing sides of the interface board 100 and disposed adjacent to the edges 108, 110 for securing the interface board 100 to the backplane 300. The detachable configuration of the interface board 100 relative to the backplane 300 and edge board connector 200 allows for the system to be easily maintained and for a damaged interface board 100 to be replaced (or interchanged) without requiring replacement of the entire system.

With reference to FIG. 2, the edge board connector 200 includes a body 202 with mounting holes 204, 206 on opposing sides of the body 202. The edge board connector 200 includes a slot 208 (or pins) along one side, which is configured to at least partially receive and/or electrically couple with the contacts 114 of the interface board 100. The edge board connector 200 includes pins 210 extending from the body 202. The pins 210 are configured to electrically couple (e.g., be soldered to) the backplane 300. The pins 210 can extend from a perpendicularly disposed surface of the body 202 relative to the slot 208.

With reference to FIG. 3, the backplane 300 includes a card 302 (e.g., a body) that can be mounted to the frame of an actuator having the edge board connector 200, a switching power supply, and main supply voltage wiring terminals. The edge board connector 200 can be mounted to a top surface of the backplane 300 as illustrated in FIG. 3. Rows of openings 304 in the backplane 300 allow for the position of the edge board connector 200 to be customized. Mounting holes 306, 308 can be used to mount the interface board 100 to the backplane 300 when the interface board 100 is inserted into the slot 208 with the contacts 114 of the interface board 100 electrically couple with the edge board connector 200, e.g., with contacts internal to the slot 208. The backplane 300 includes electrical terminals 310 (e.g., three terminals) disposed on the top surface of the backplane 300. The backplane 300 includes a main power terminal block 312 for distributing power to the actuator, and a DC switching power supply 314.

Figure 5:
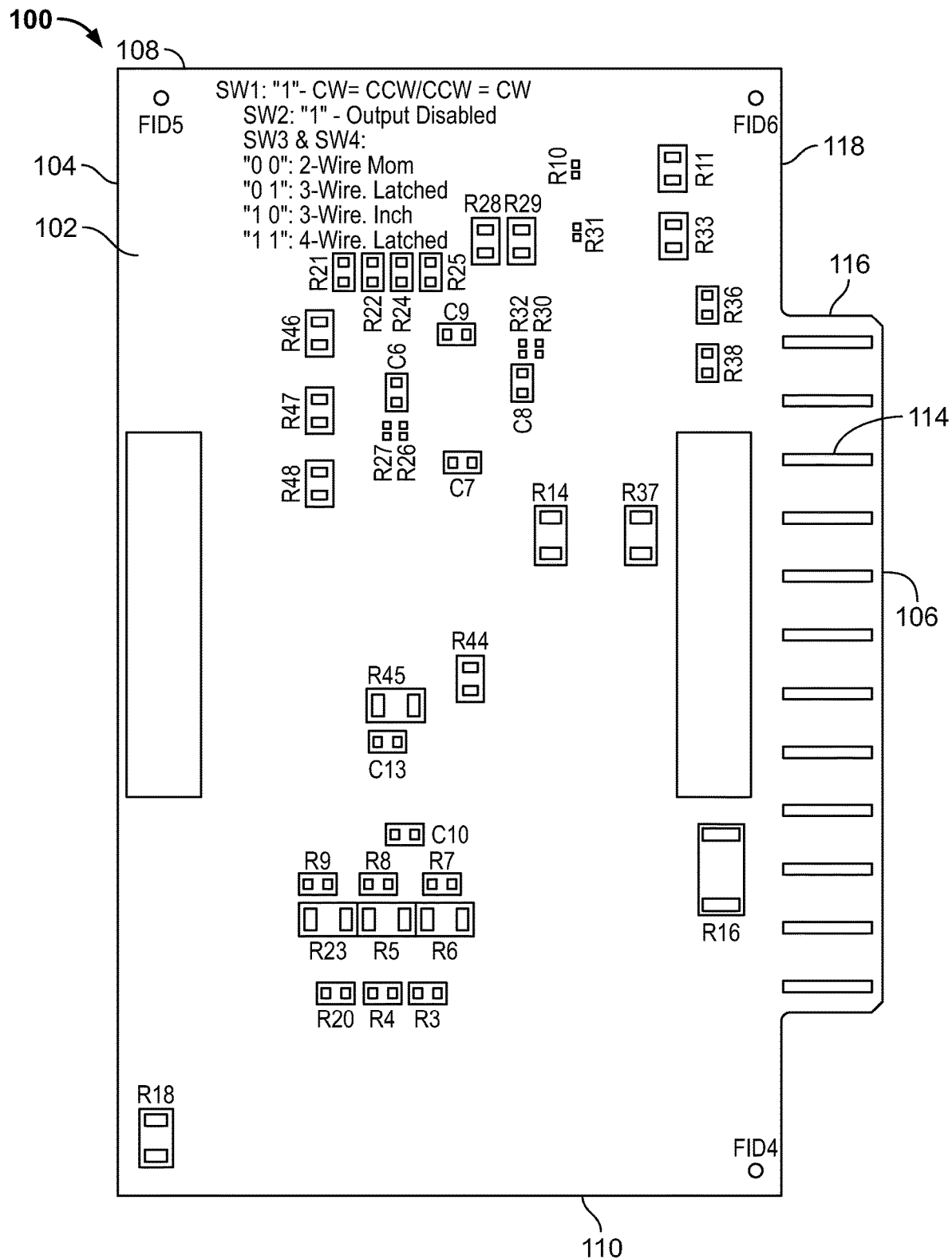
FIG. 5 shows a bottom diagrammatic view of the modular wiring interface board of FIG. 1.
Figure 6A:
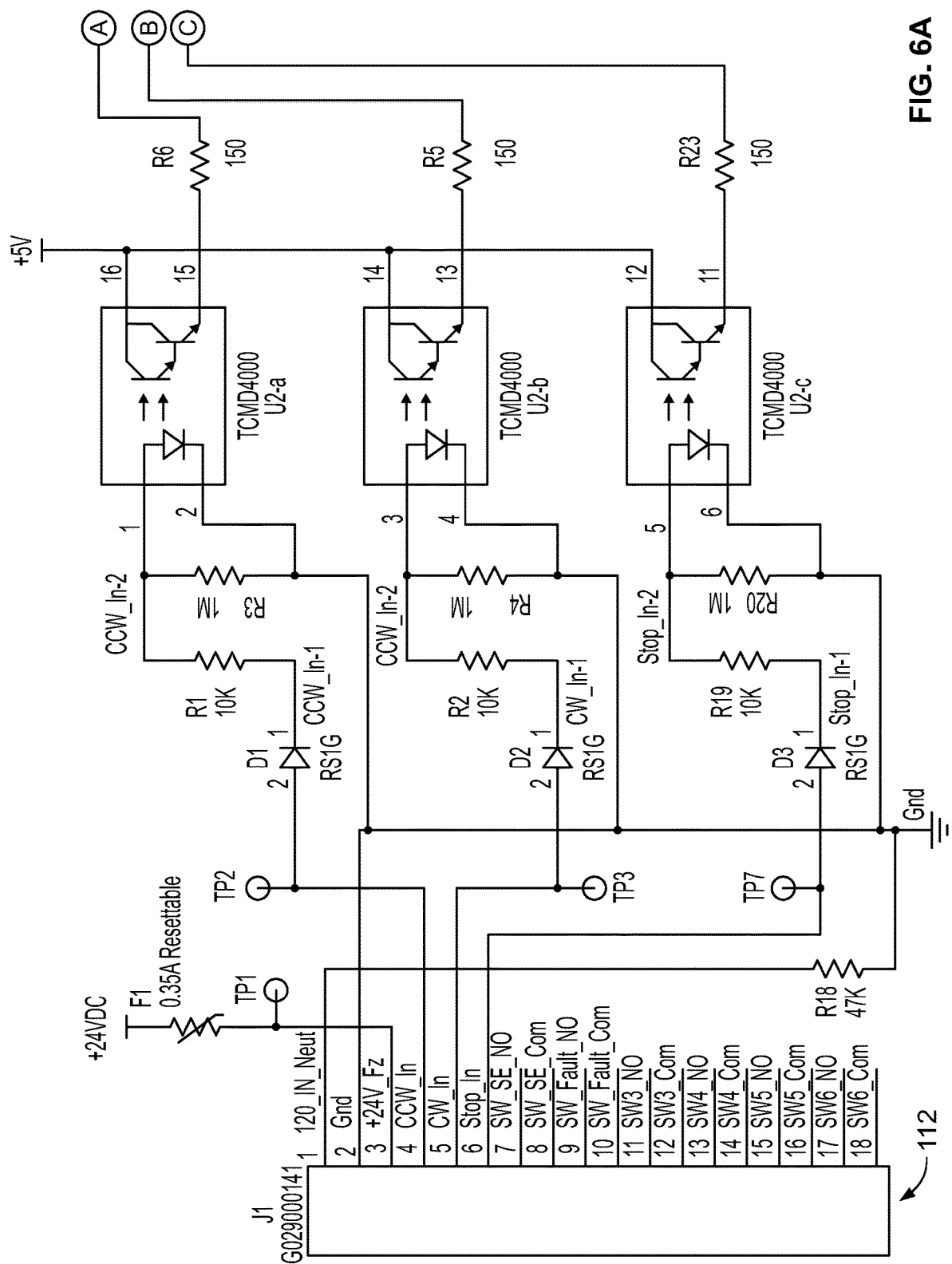
FIGS. 6A-6F show a wiring diagram of an exemplary modular wiring interface board for 2-wire single contact closure, 3-wire inch/jog, 3-wire momentary, and 4-wire momentary with stop interfaces according to the present disclosure.
Figure 6B:
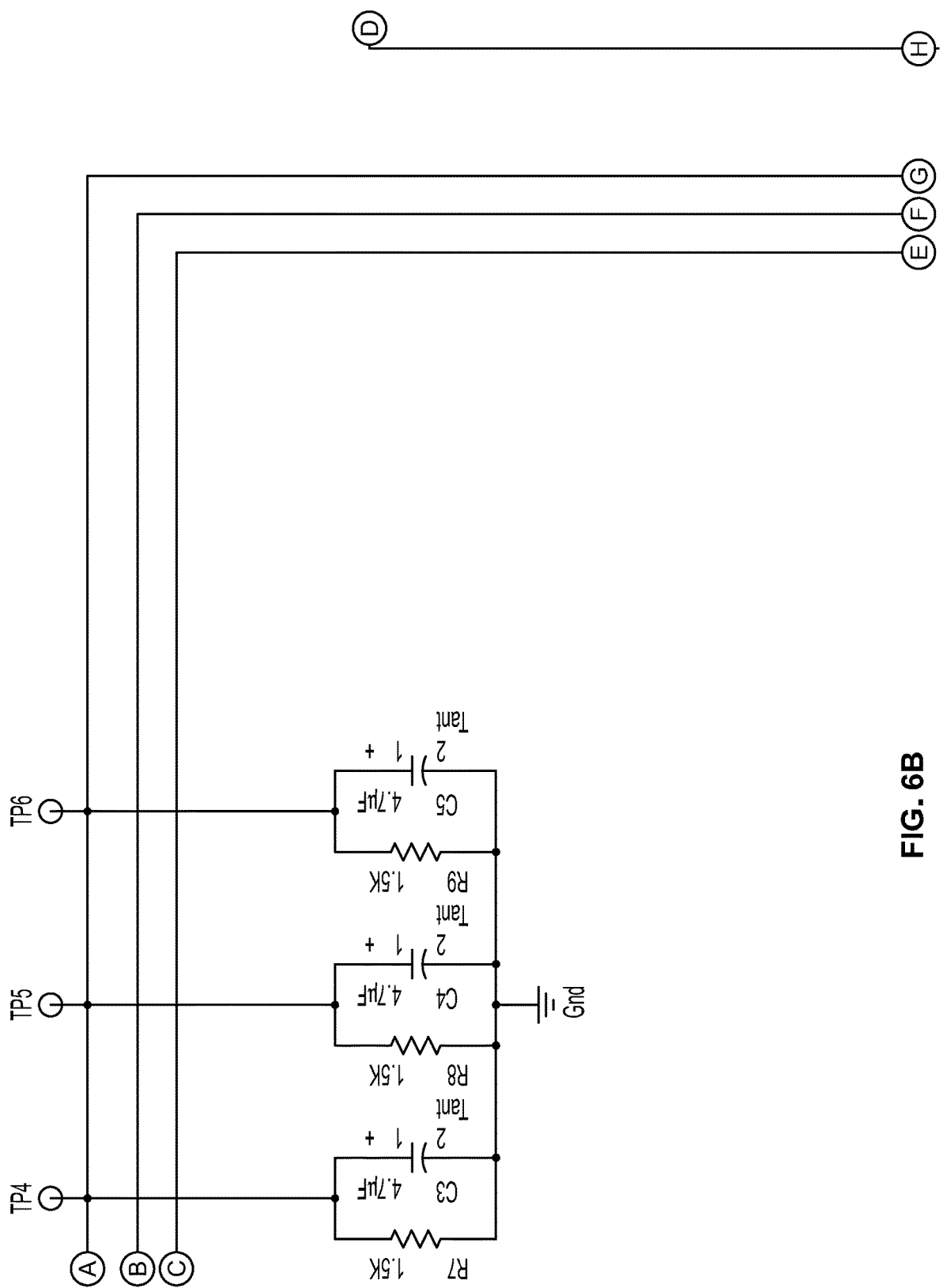
Figure 6C:
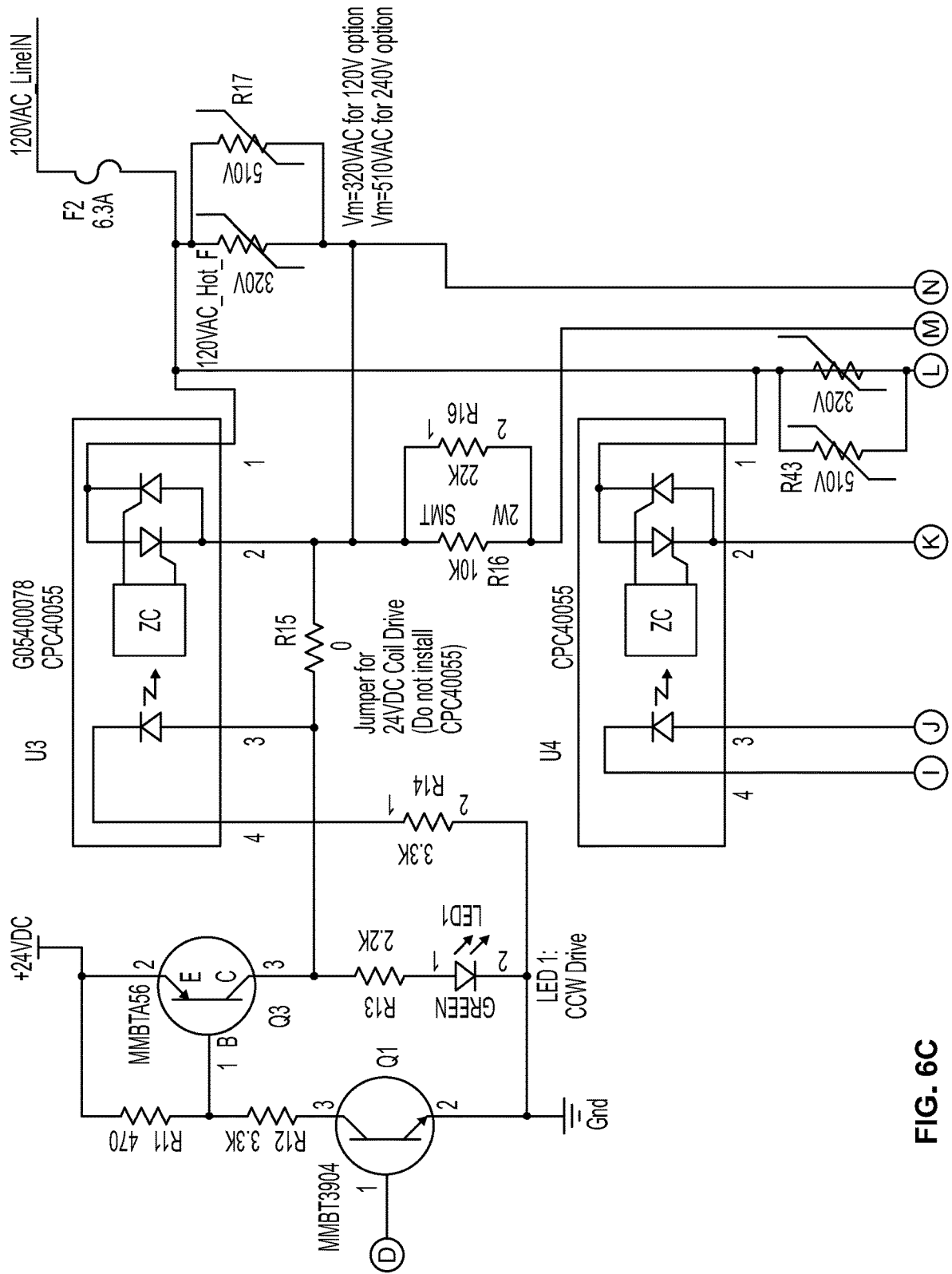
Figure 6D:
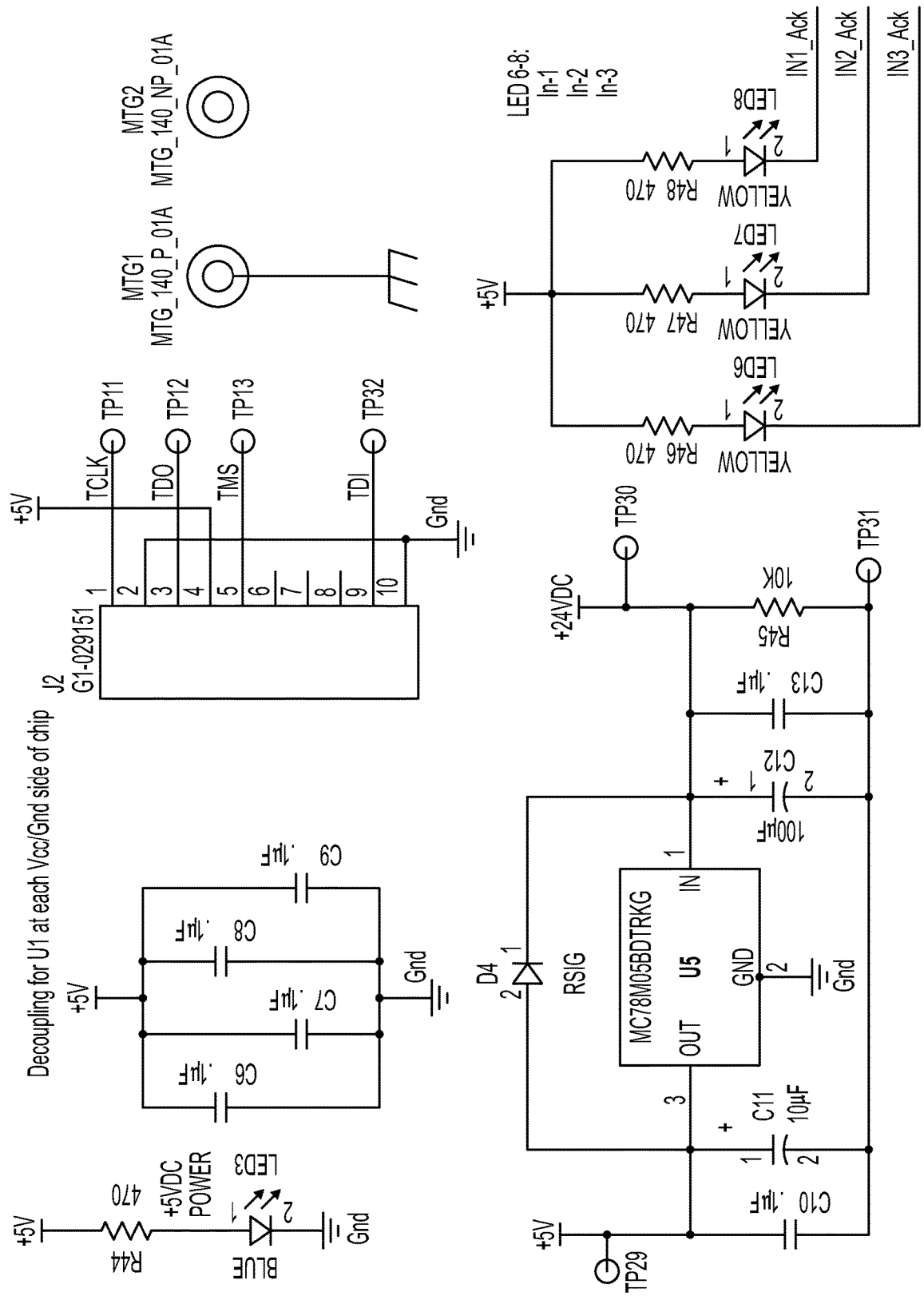
Figure 6E:
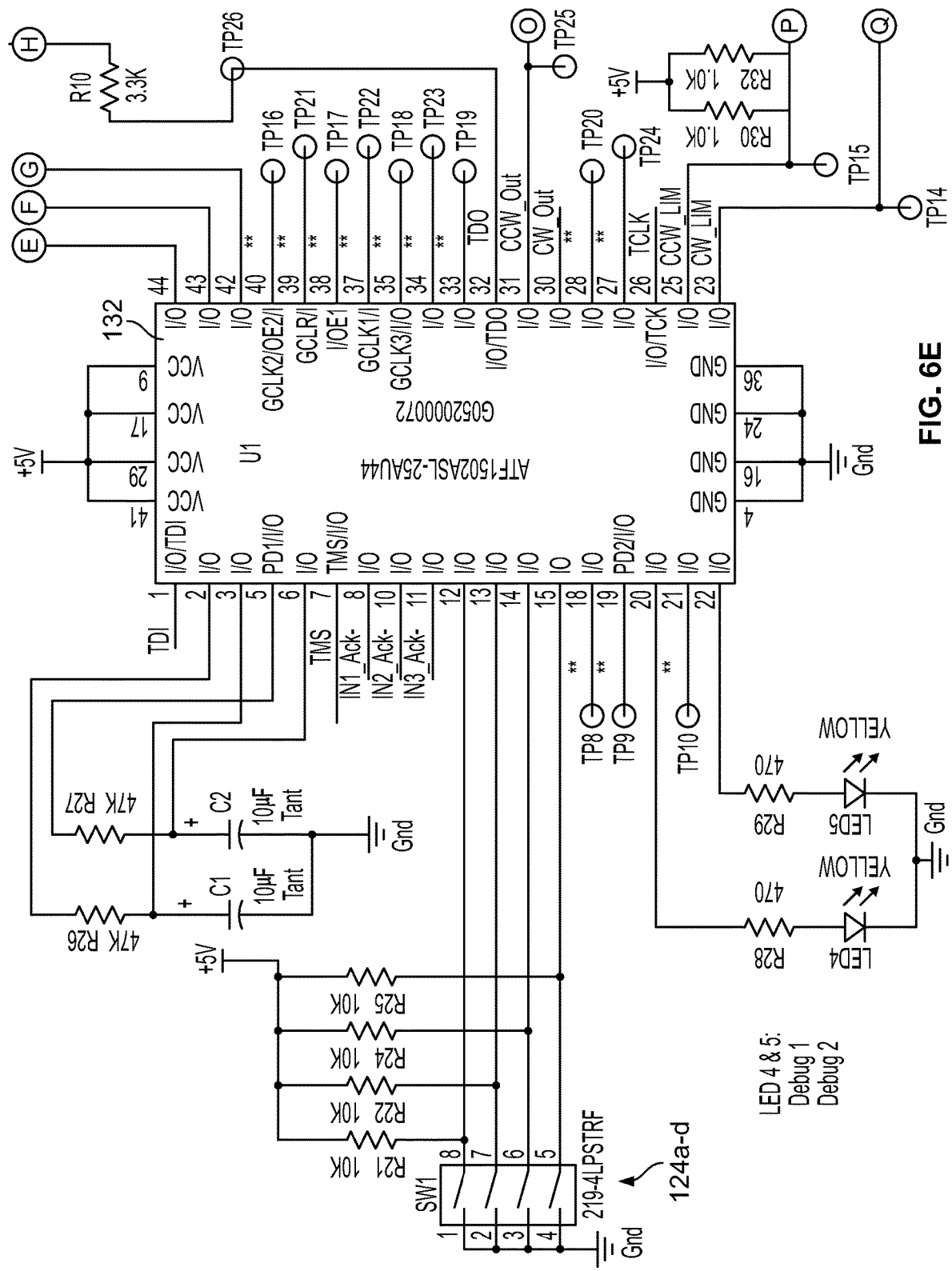
Figure 6F:
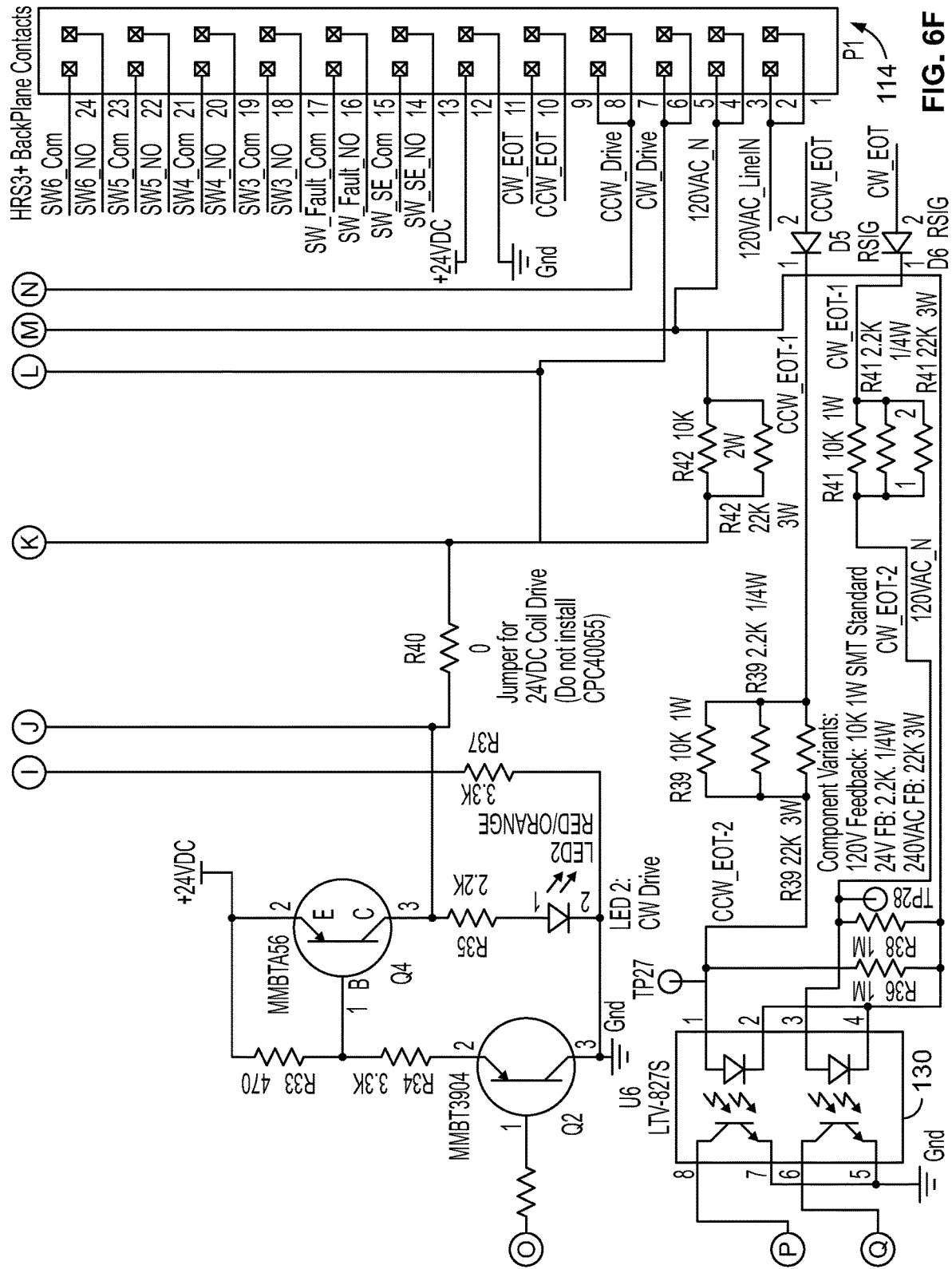
Figure 7A:
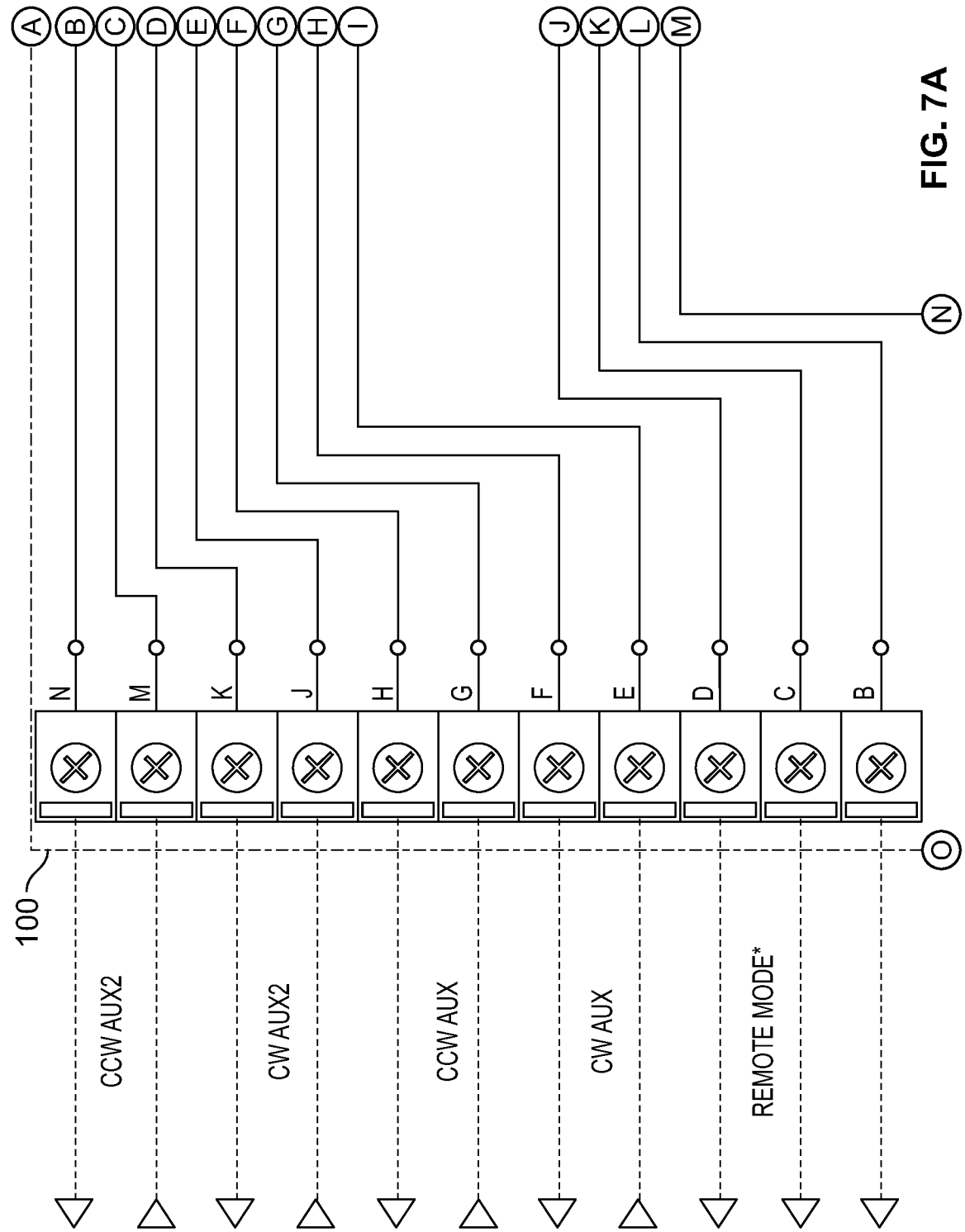
FIGS. 7A-7E show a wiring diagram of a backplane and modular wiring interface board for a 24 VAC/VDC supply voltage for 2-wire single contact closure, 3-wire inch/jog, 3-wire momentary, or 4-wire momentary with stop interfaces with internal power supply according to the present disclosure.
Figure 7B:
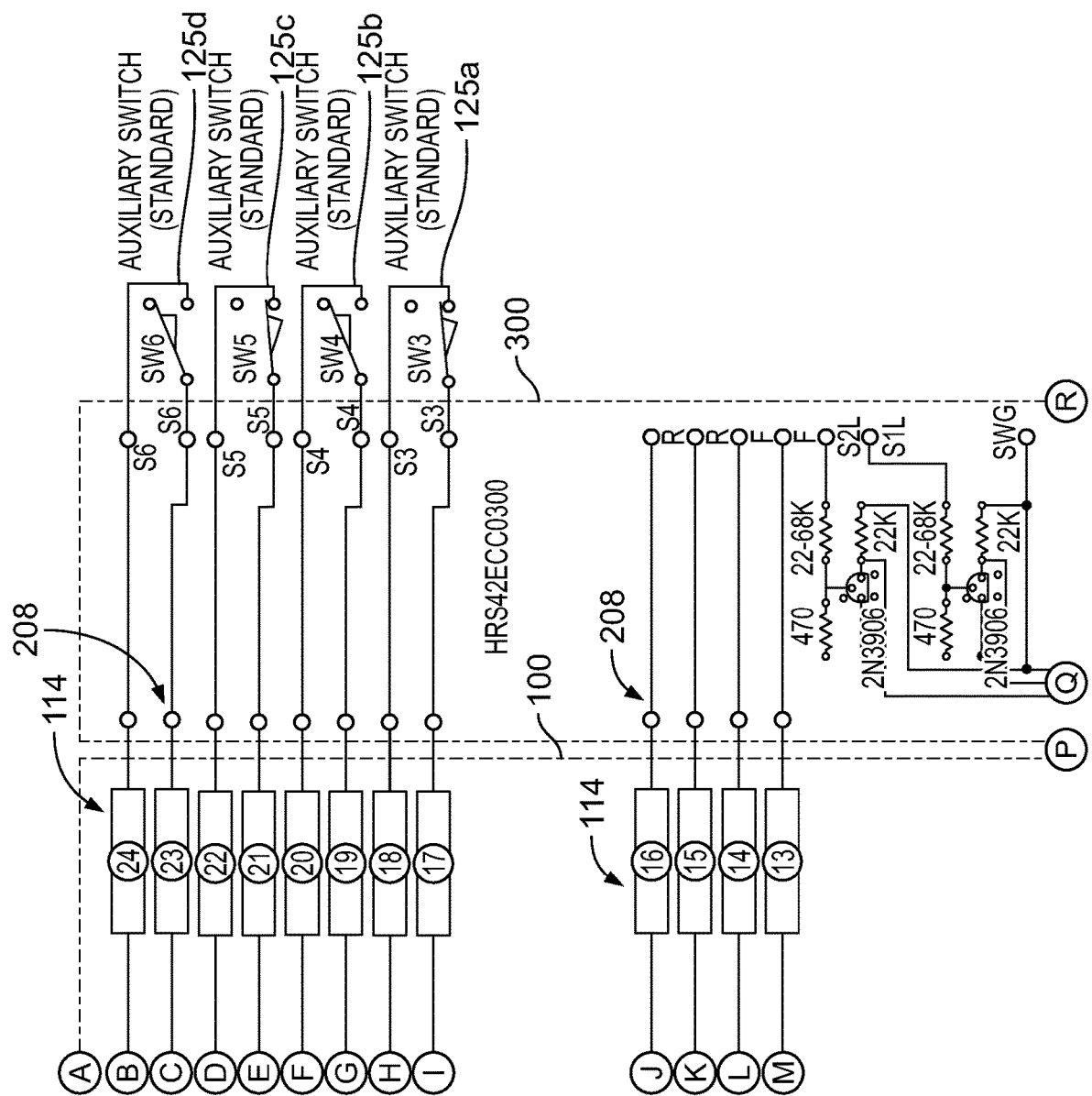
Figure 7C:
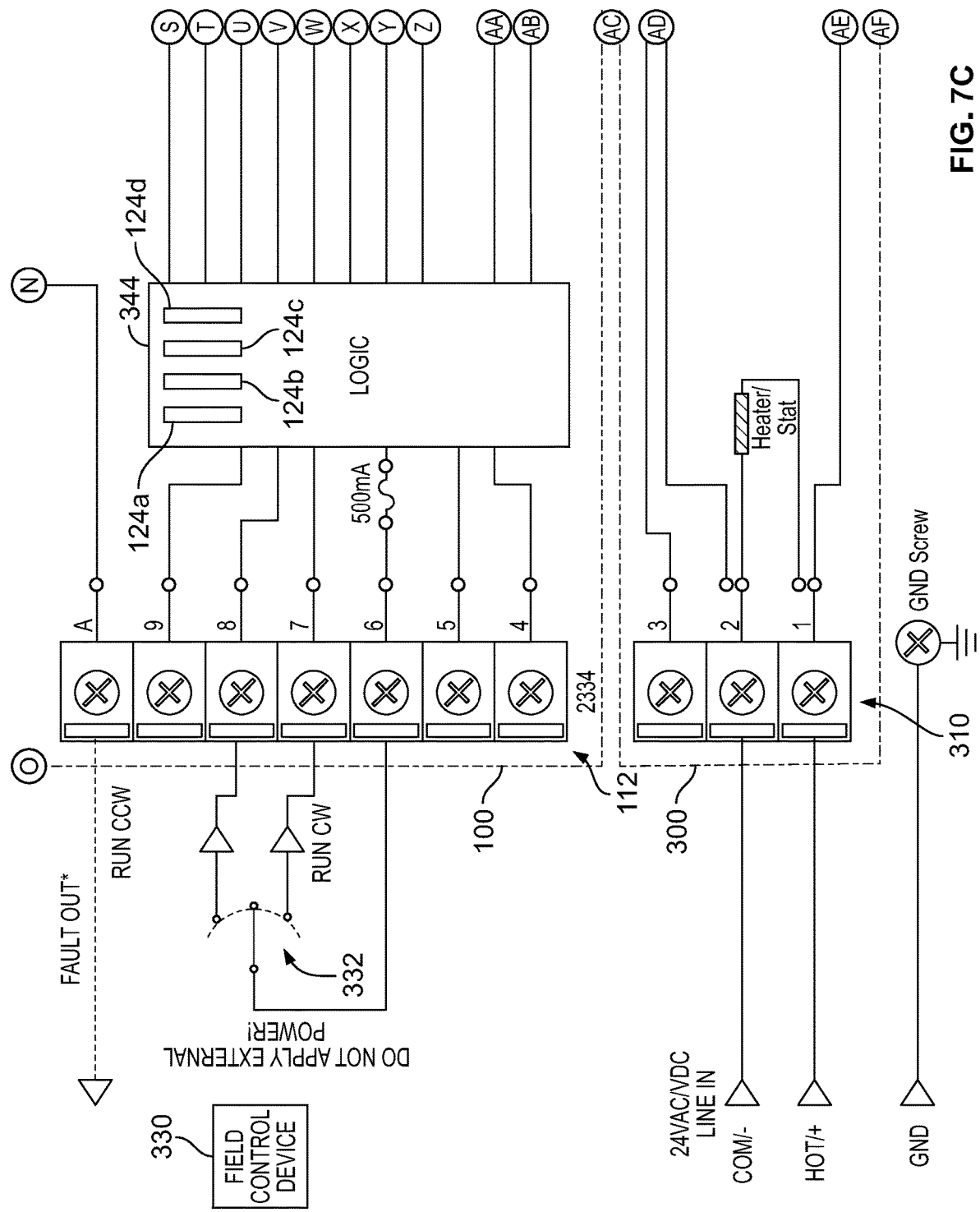
Figure 7D:
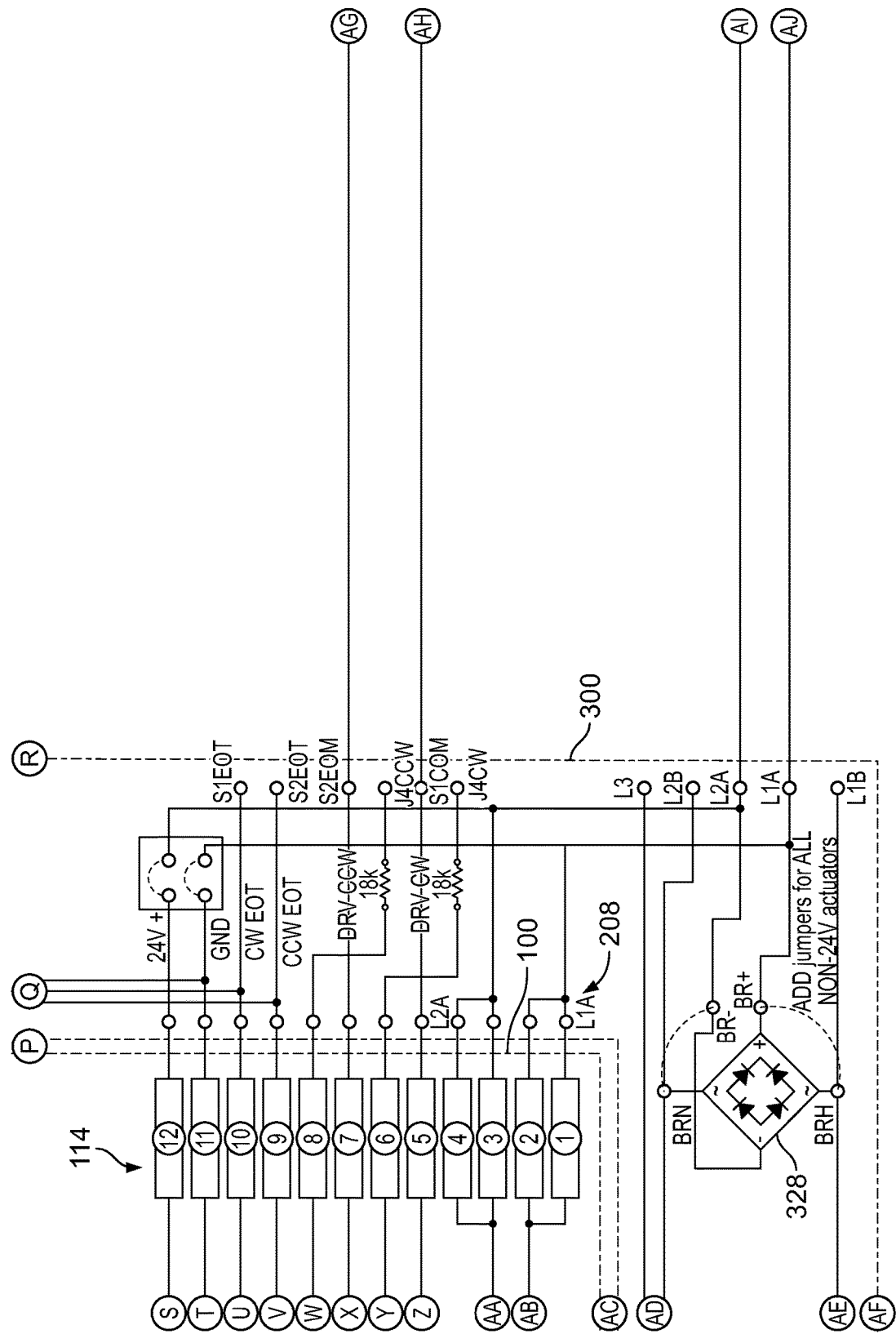
Figure 7E:
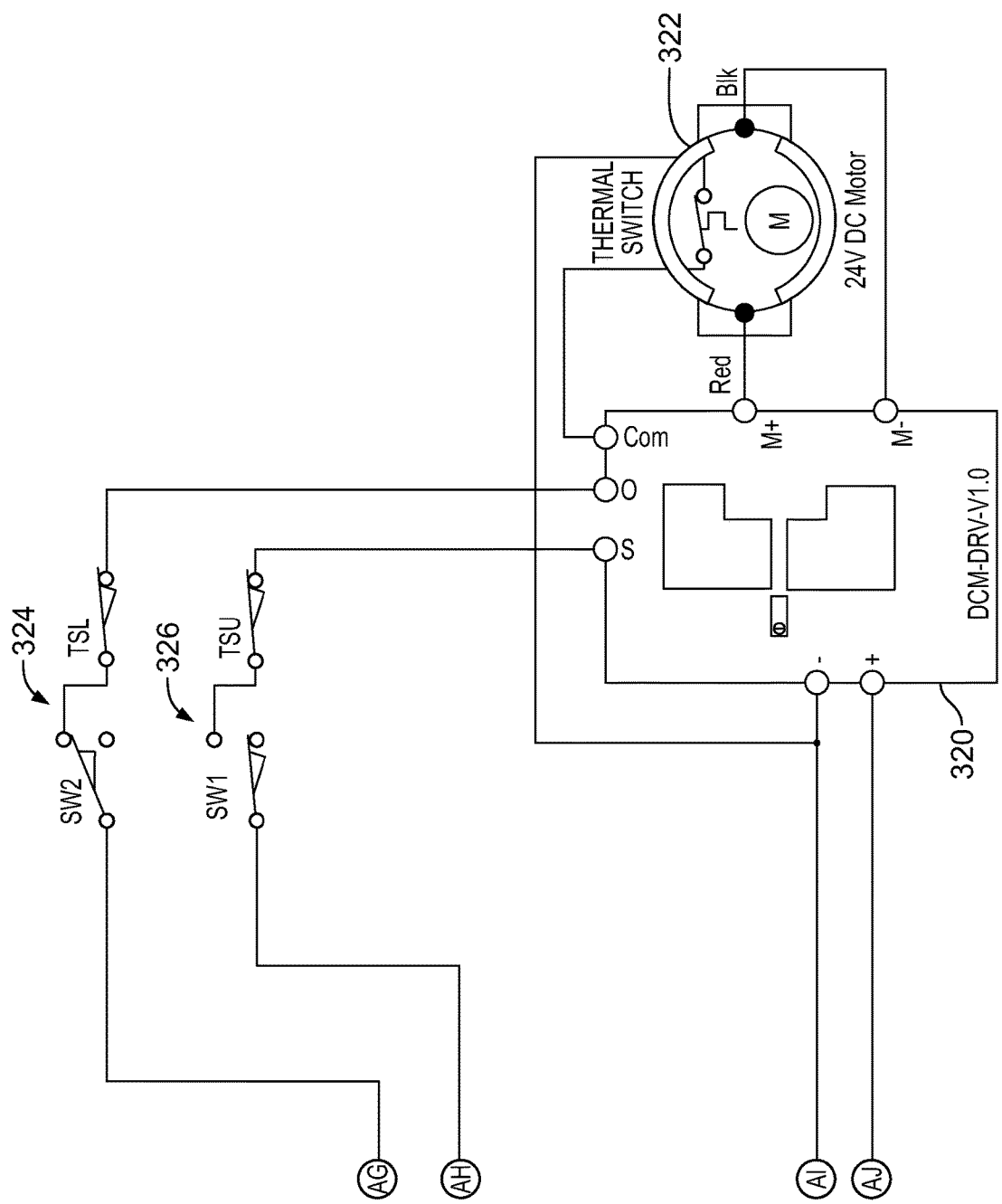
Figure 8B:
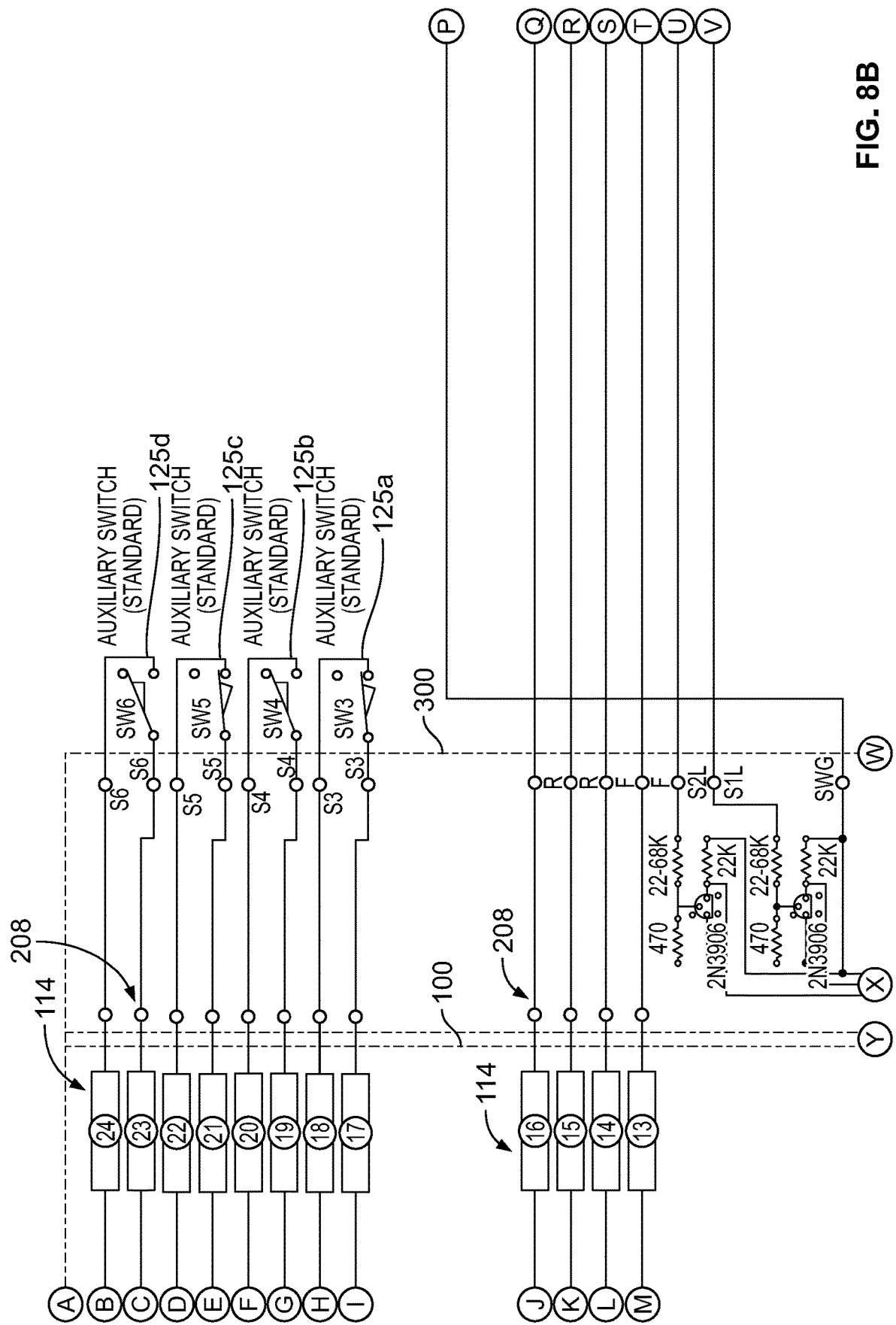
Figure 8C:
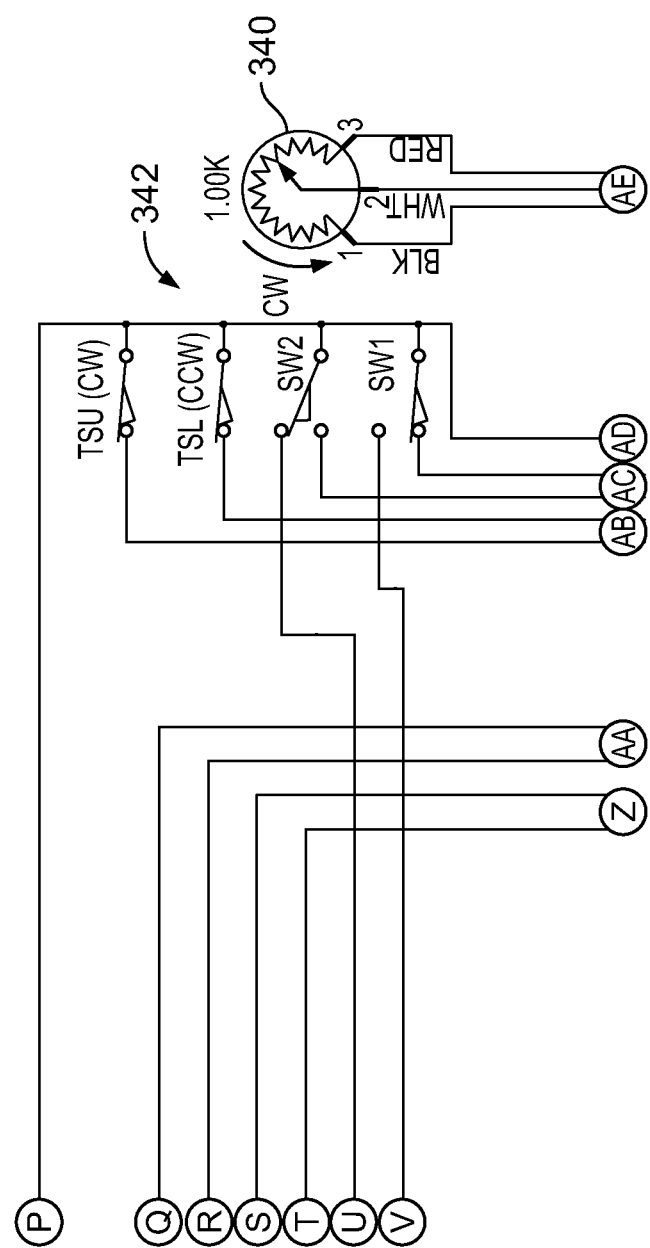
Figure 8D:
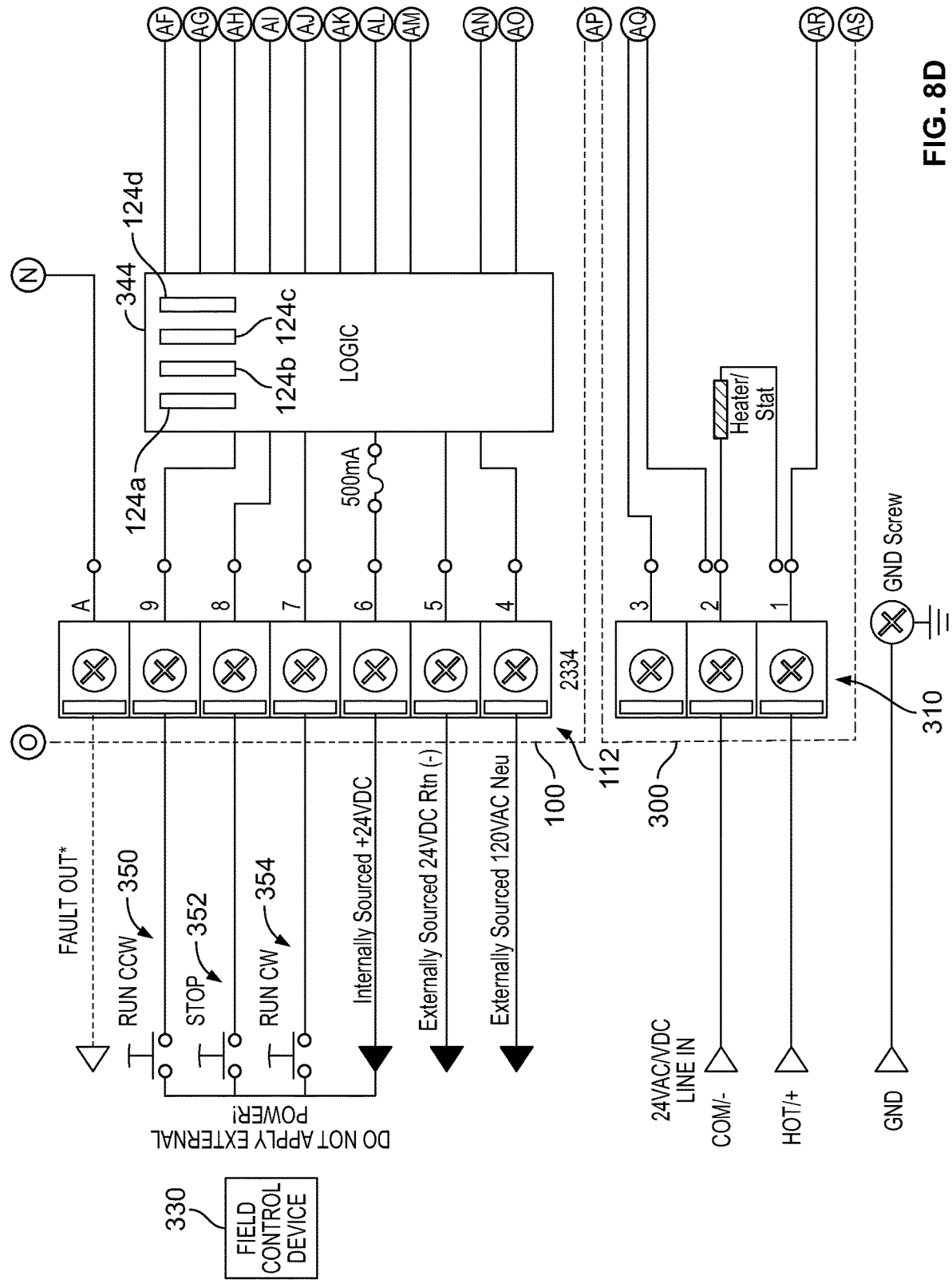
Figure 8E:
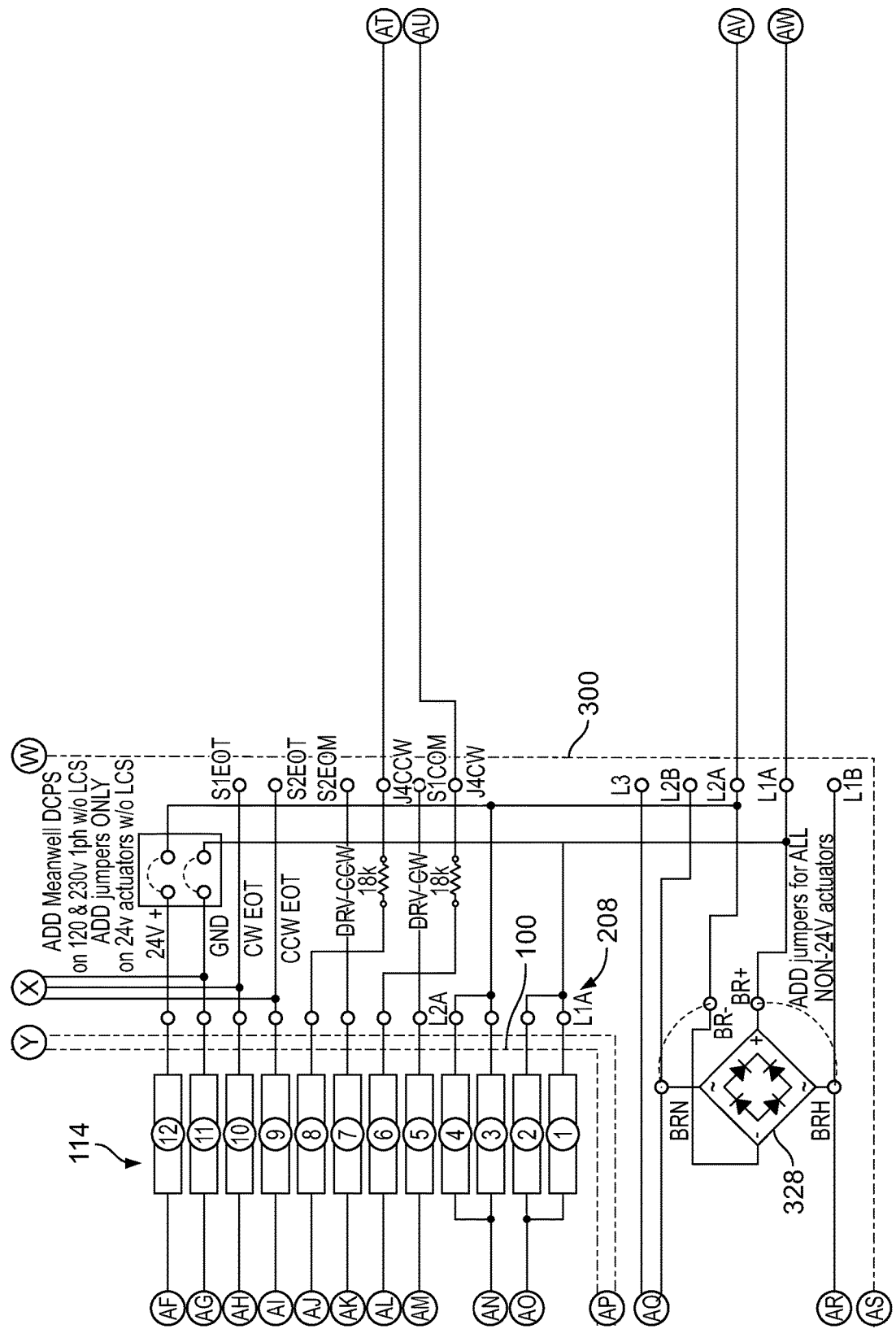
Figure 8F:
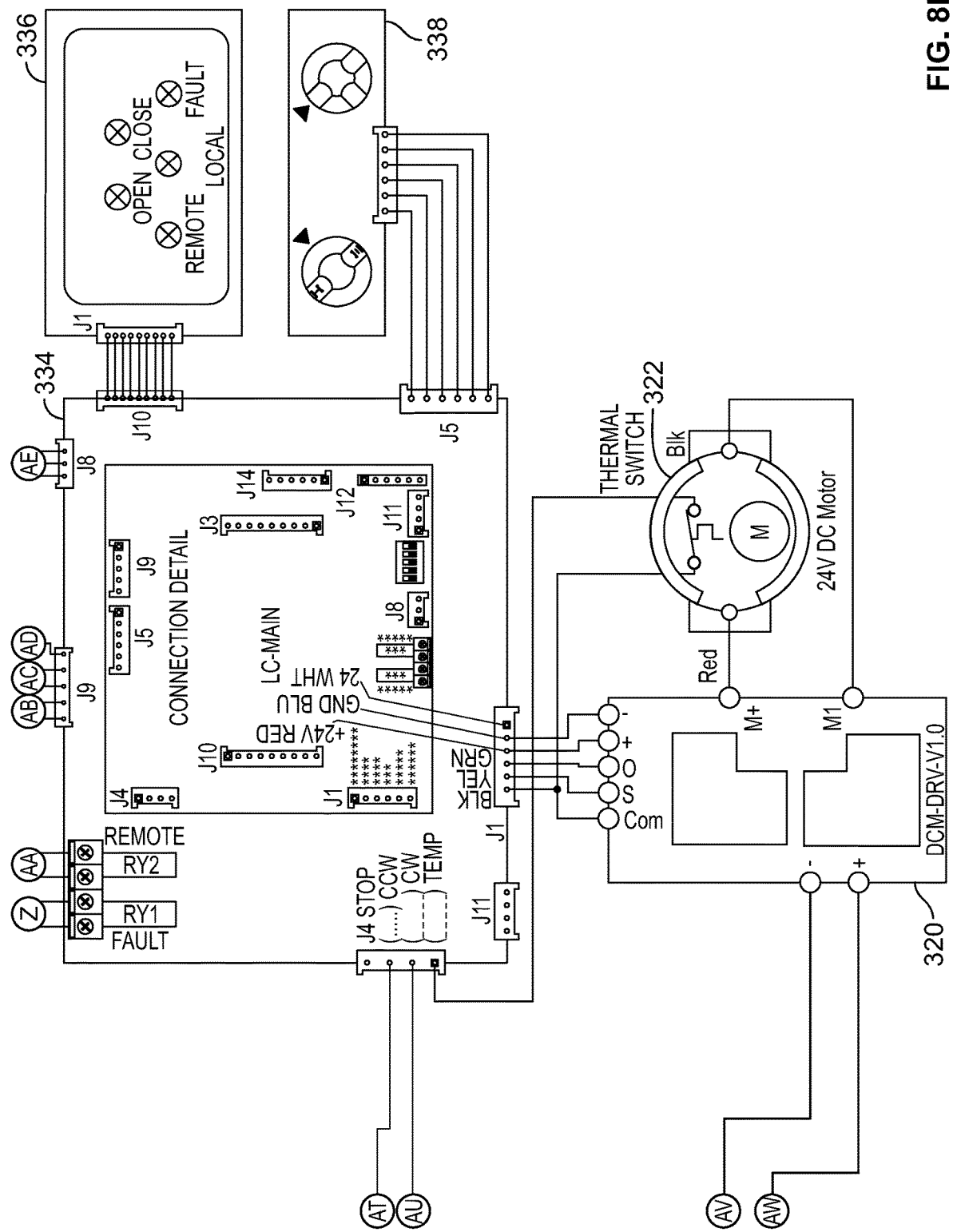
Figure 9A:
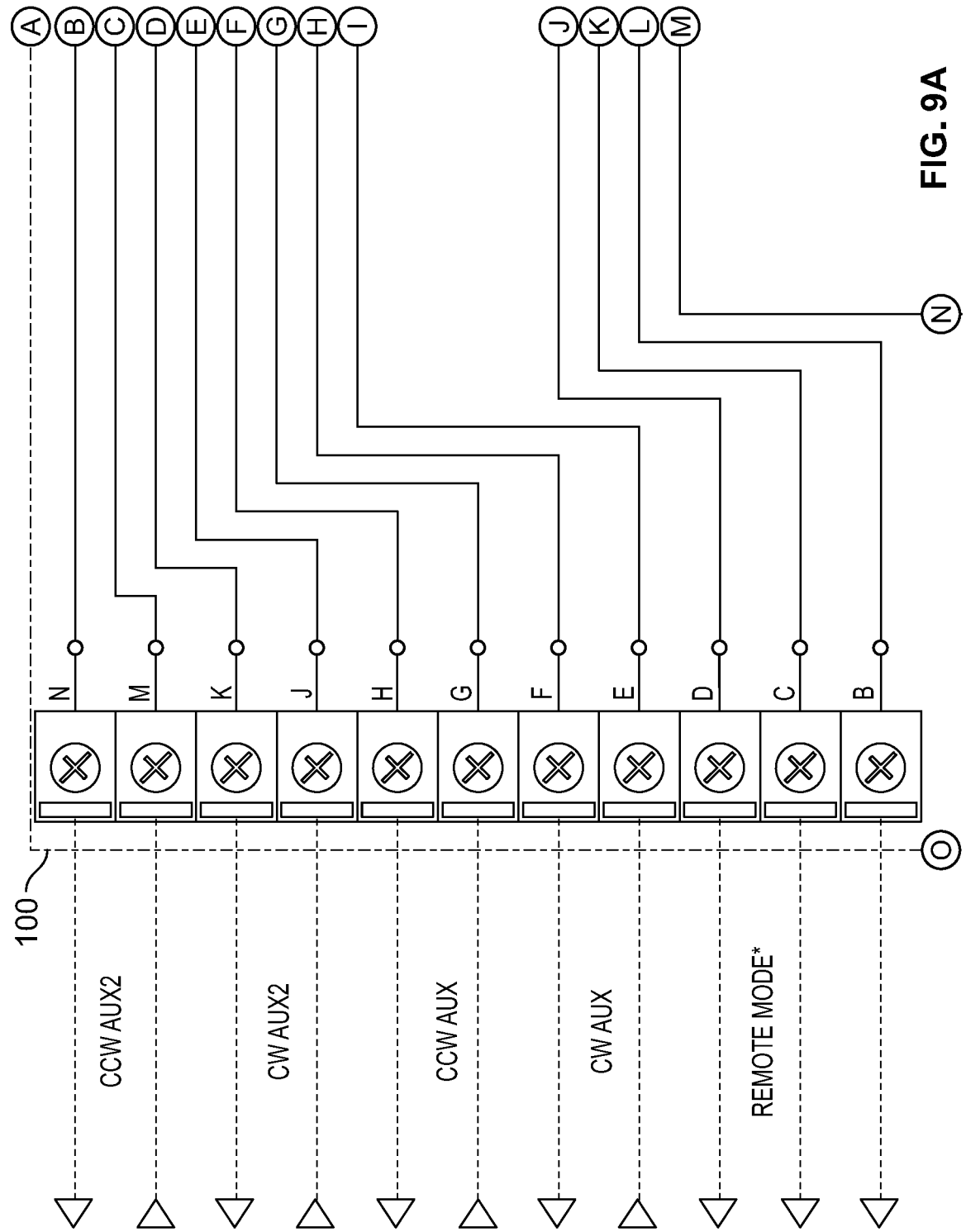
FIGS. 9A-9E show a wiring diagram of a backplane and modular wiring interface board for a 24 VAC/VDC supply voltage for a 5-wire interface without local control according to the present disclosure.
Figure 9B:
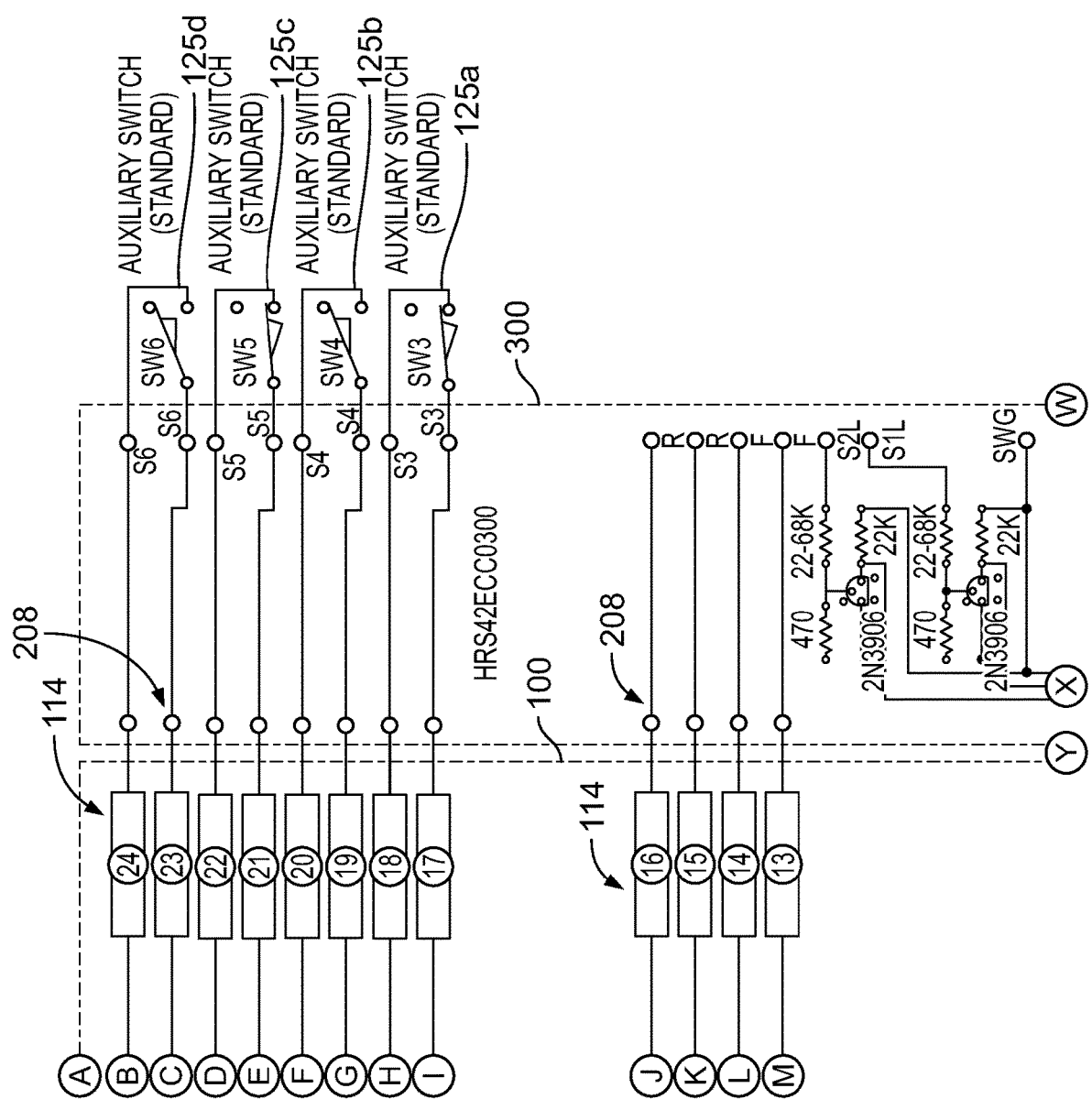
Figure 9C:
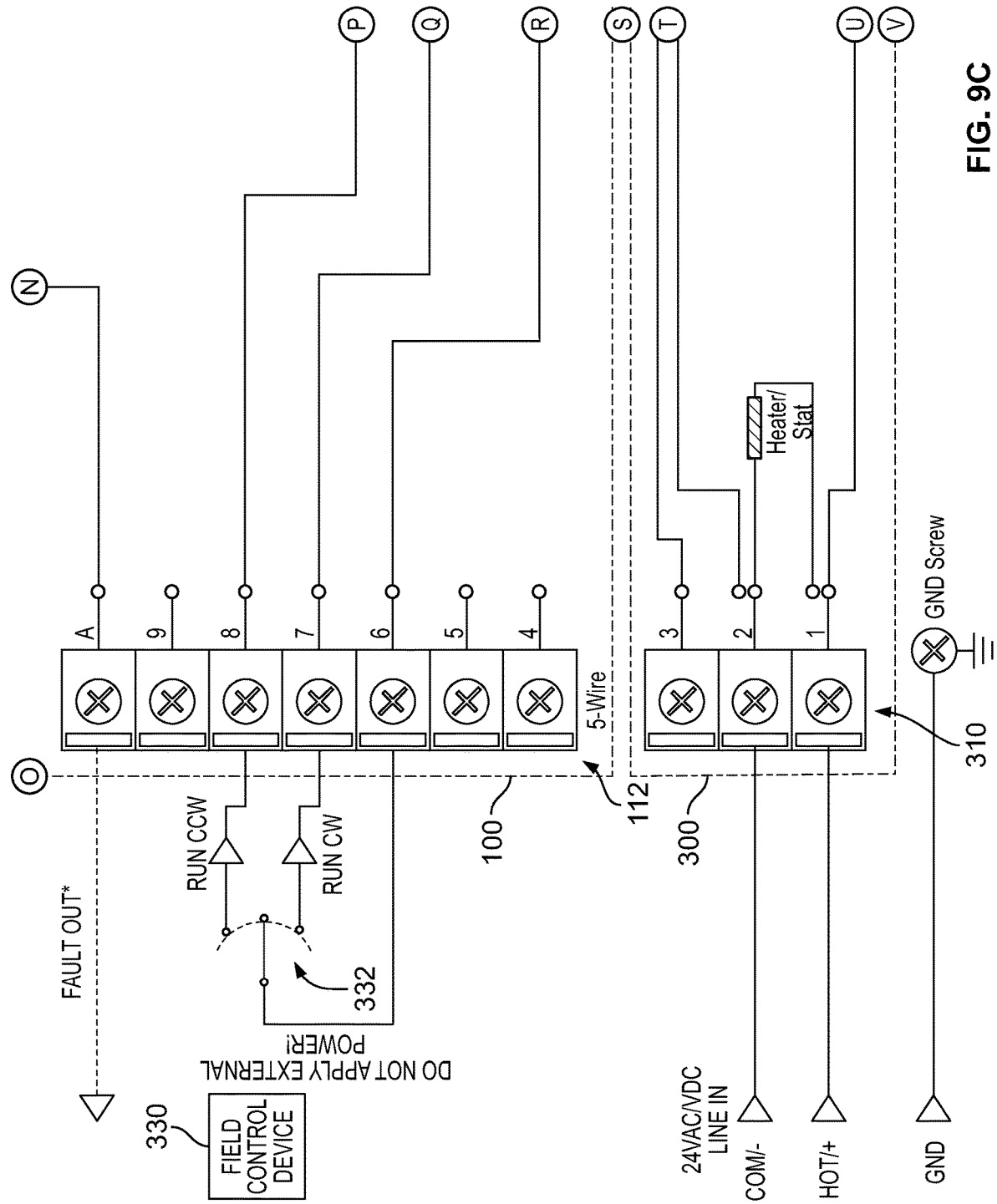
Figure 9D:
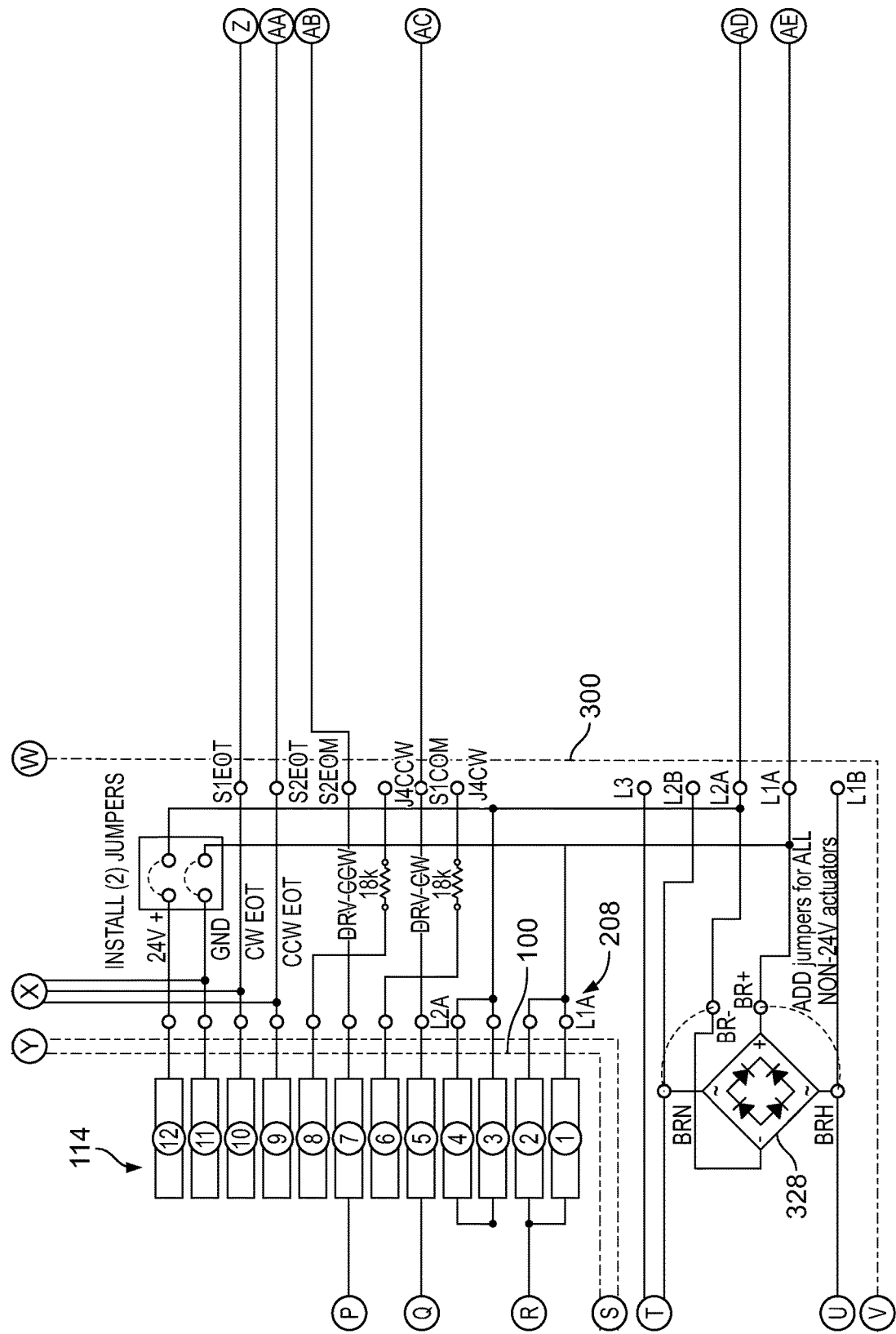
Figure 9E:
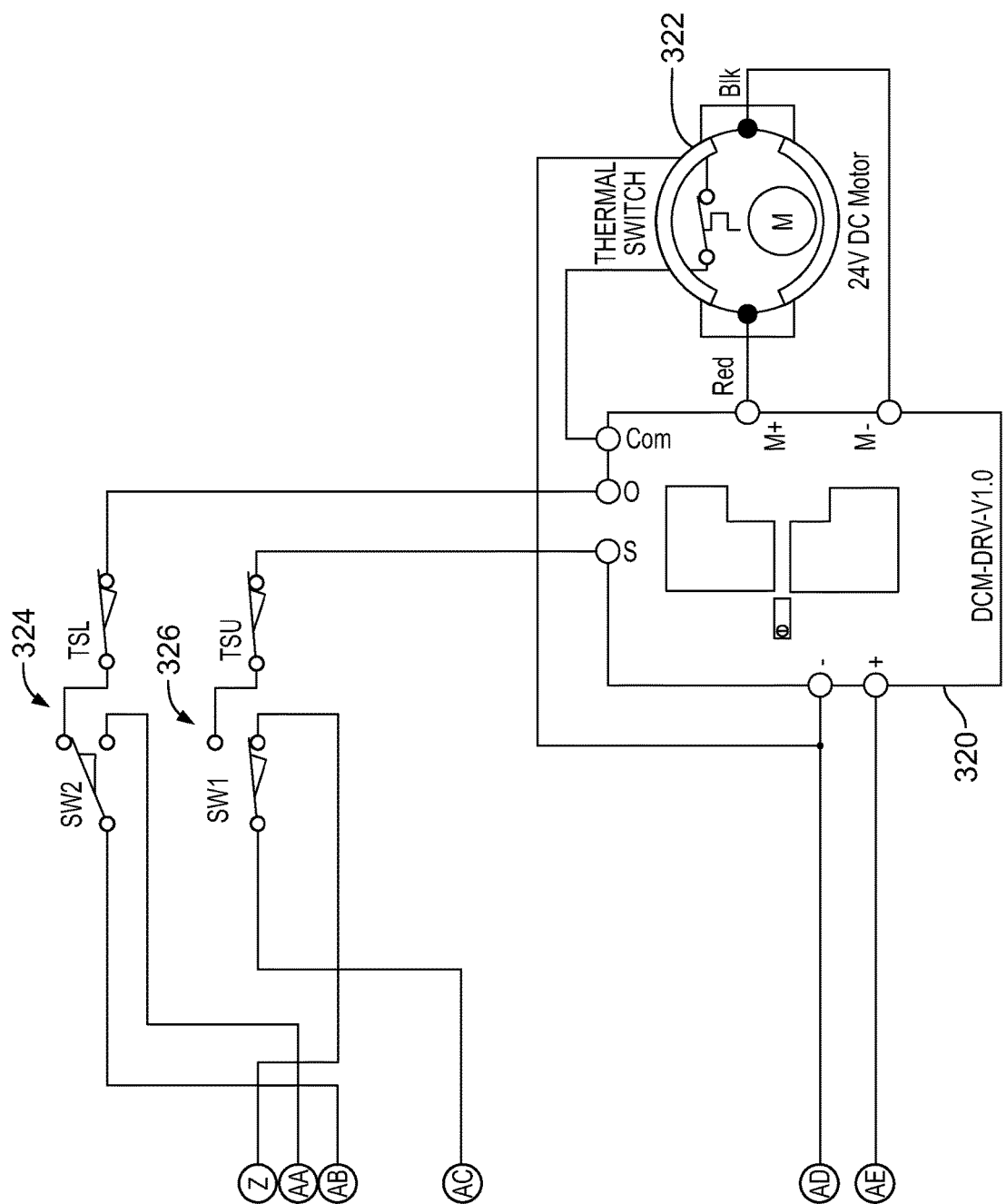
Figure 10B:
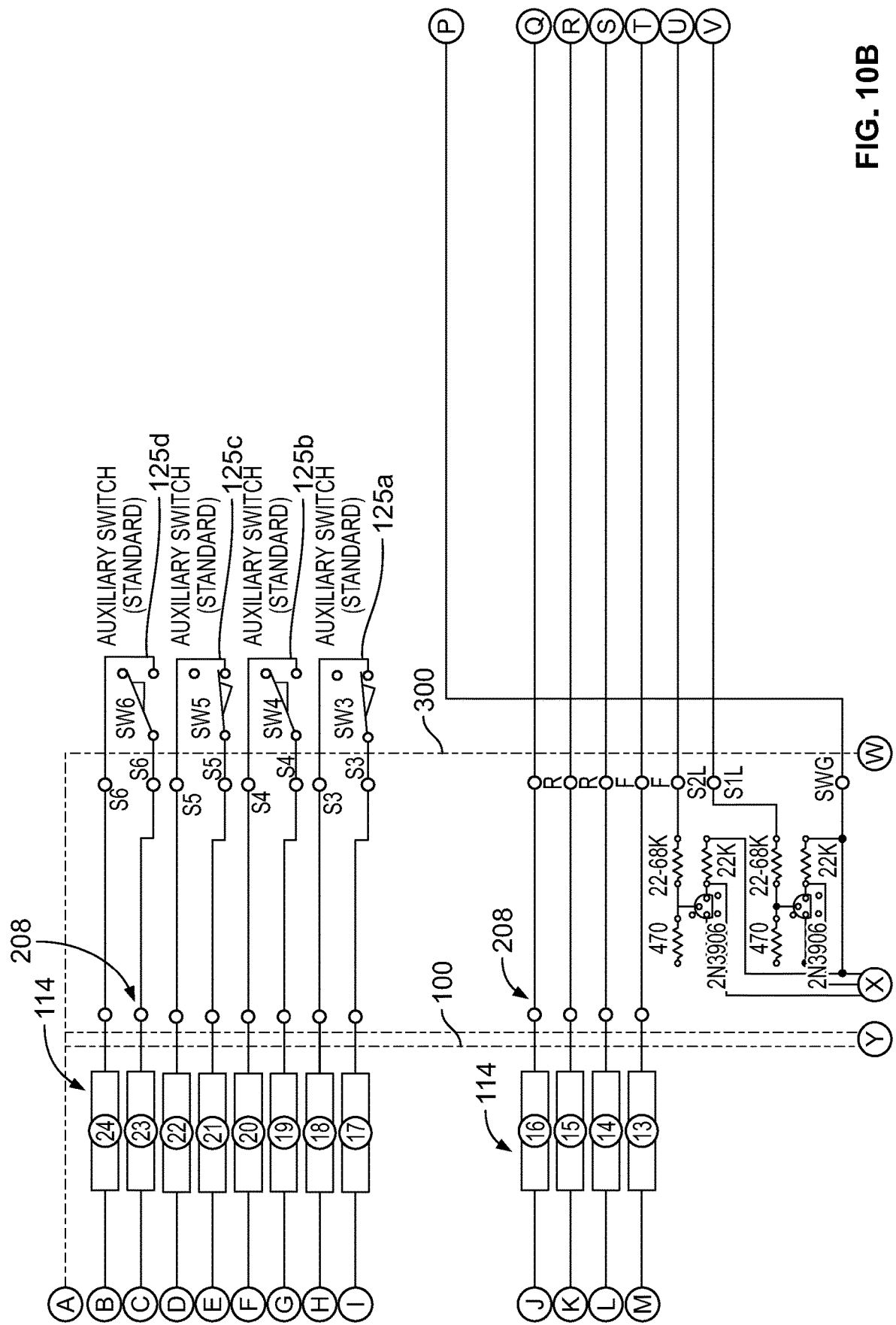
Figure 10C:
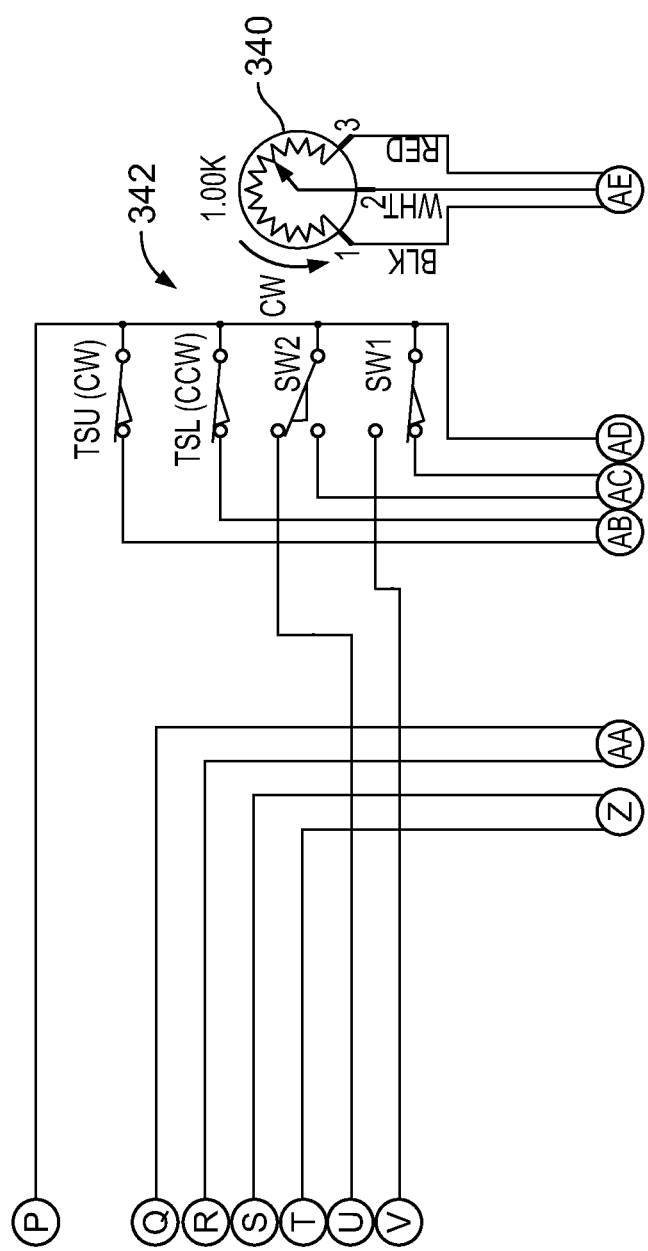
Figure 10D:
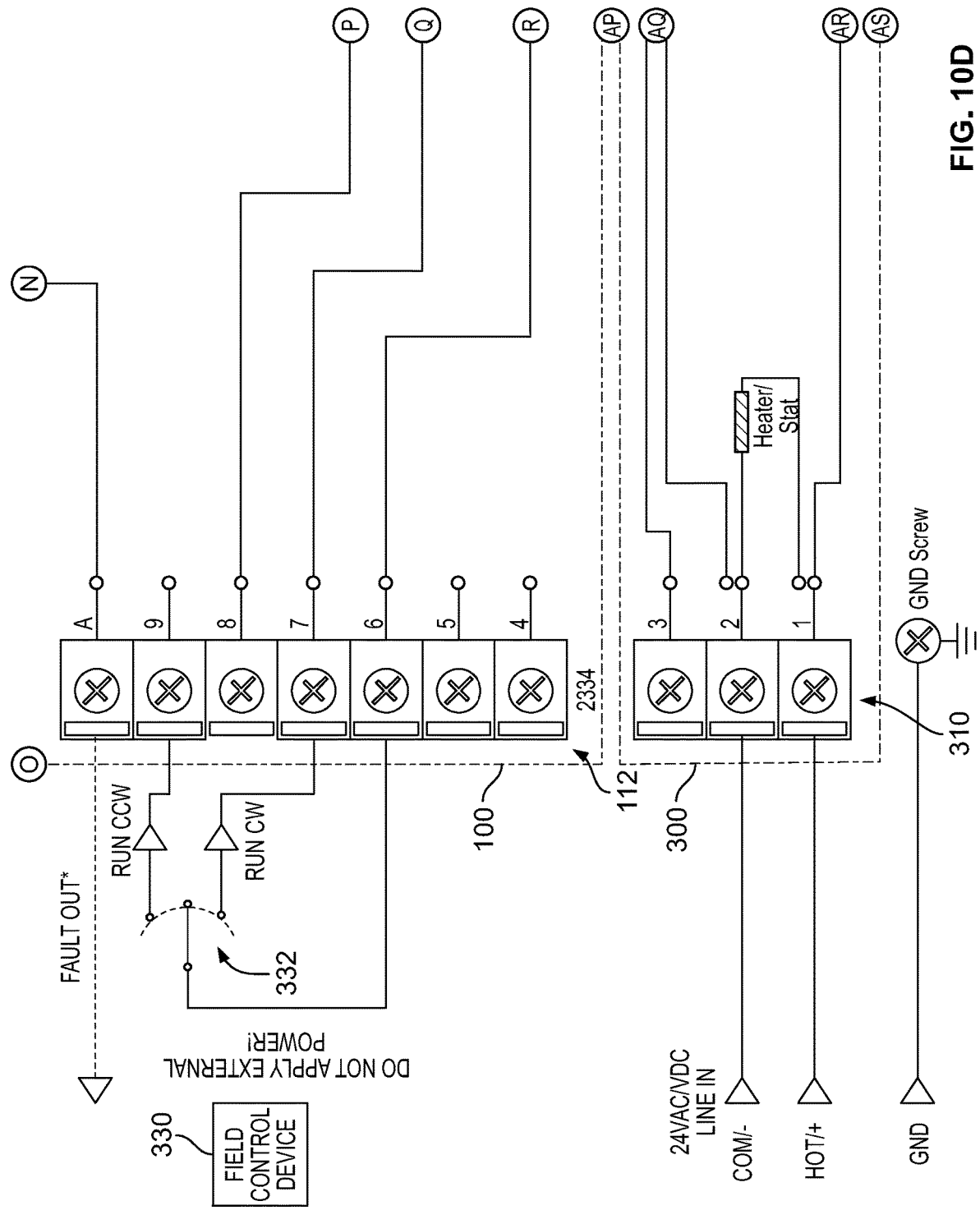
Figure 10E:
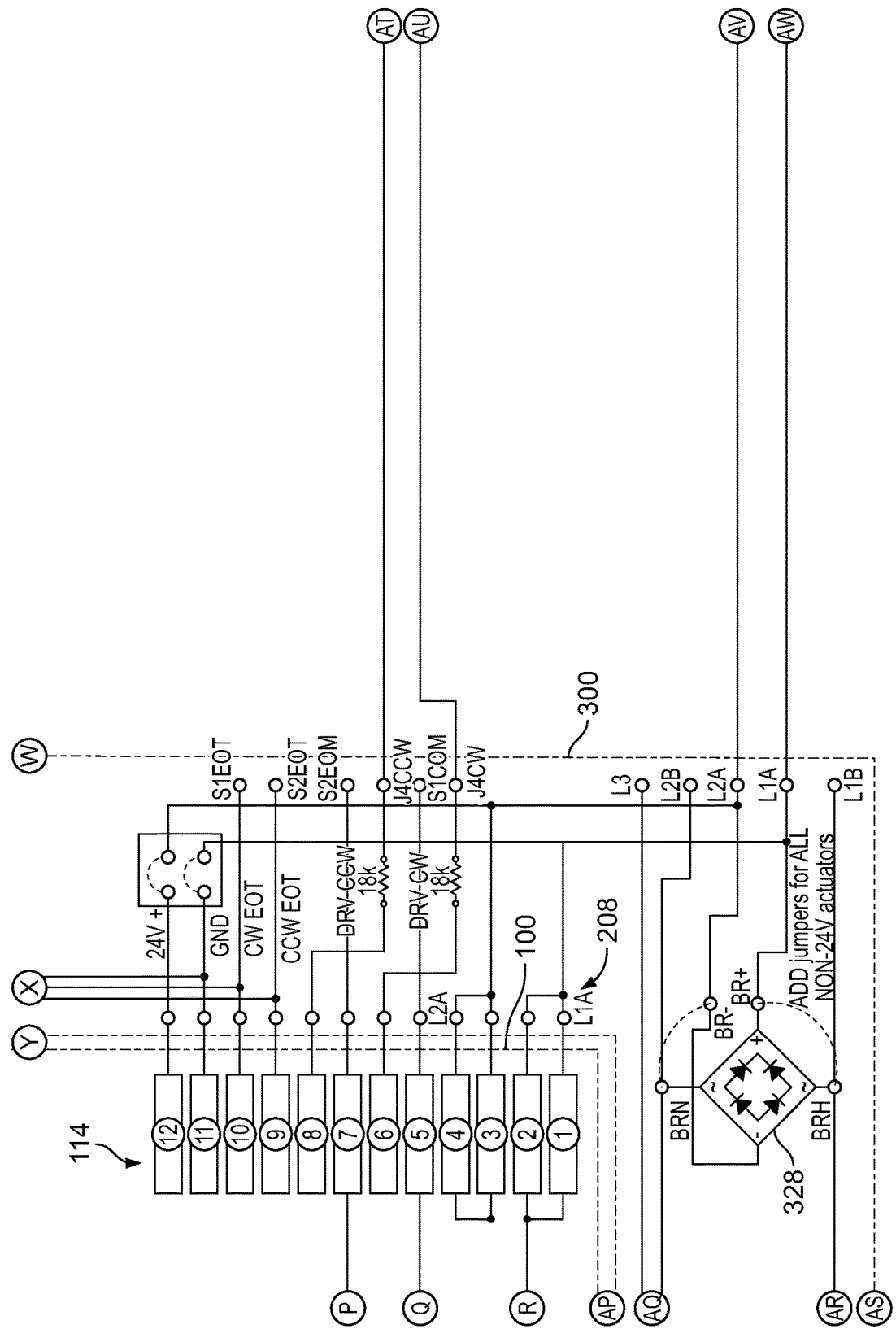
Figure 10F:
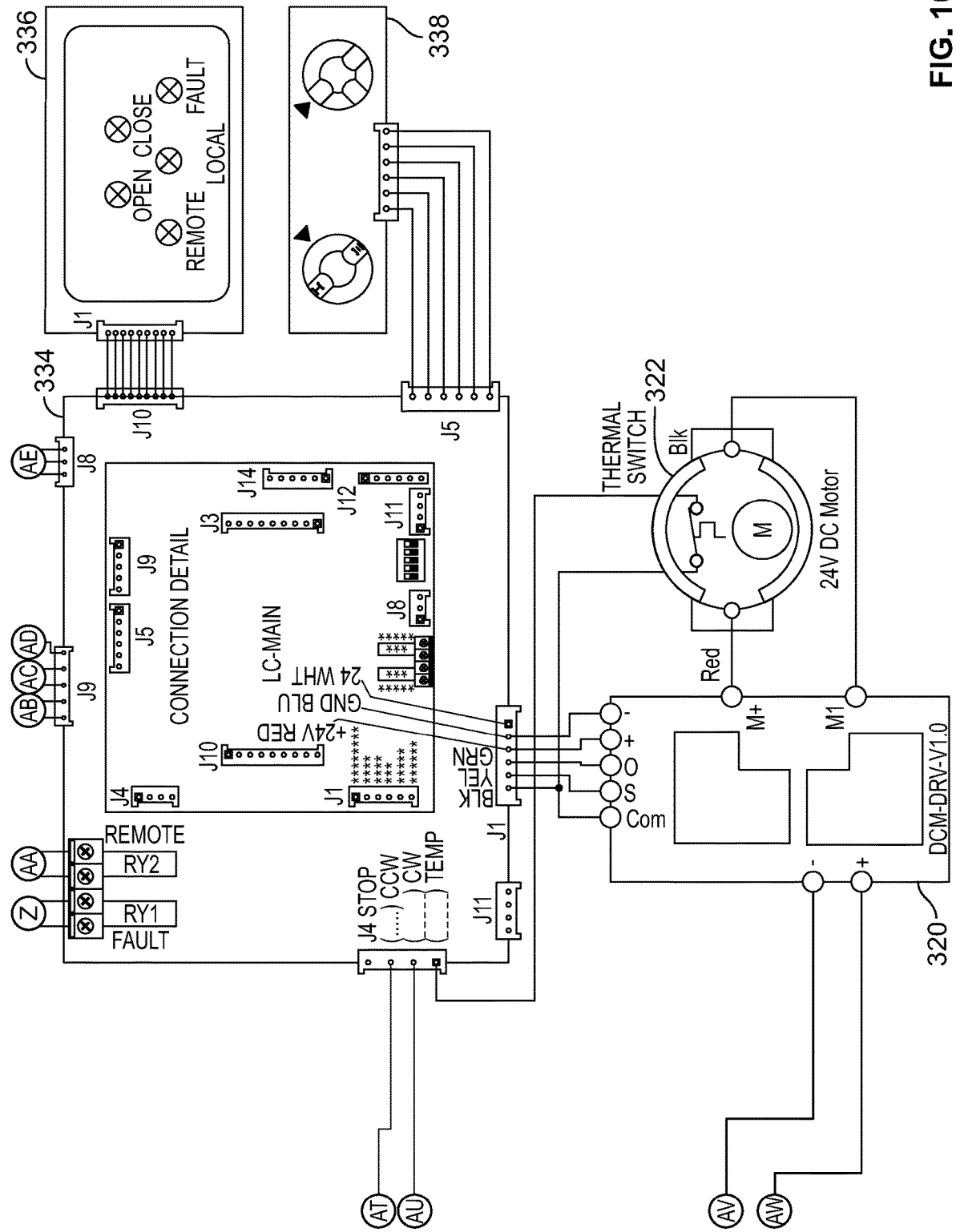
Figure 11A:
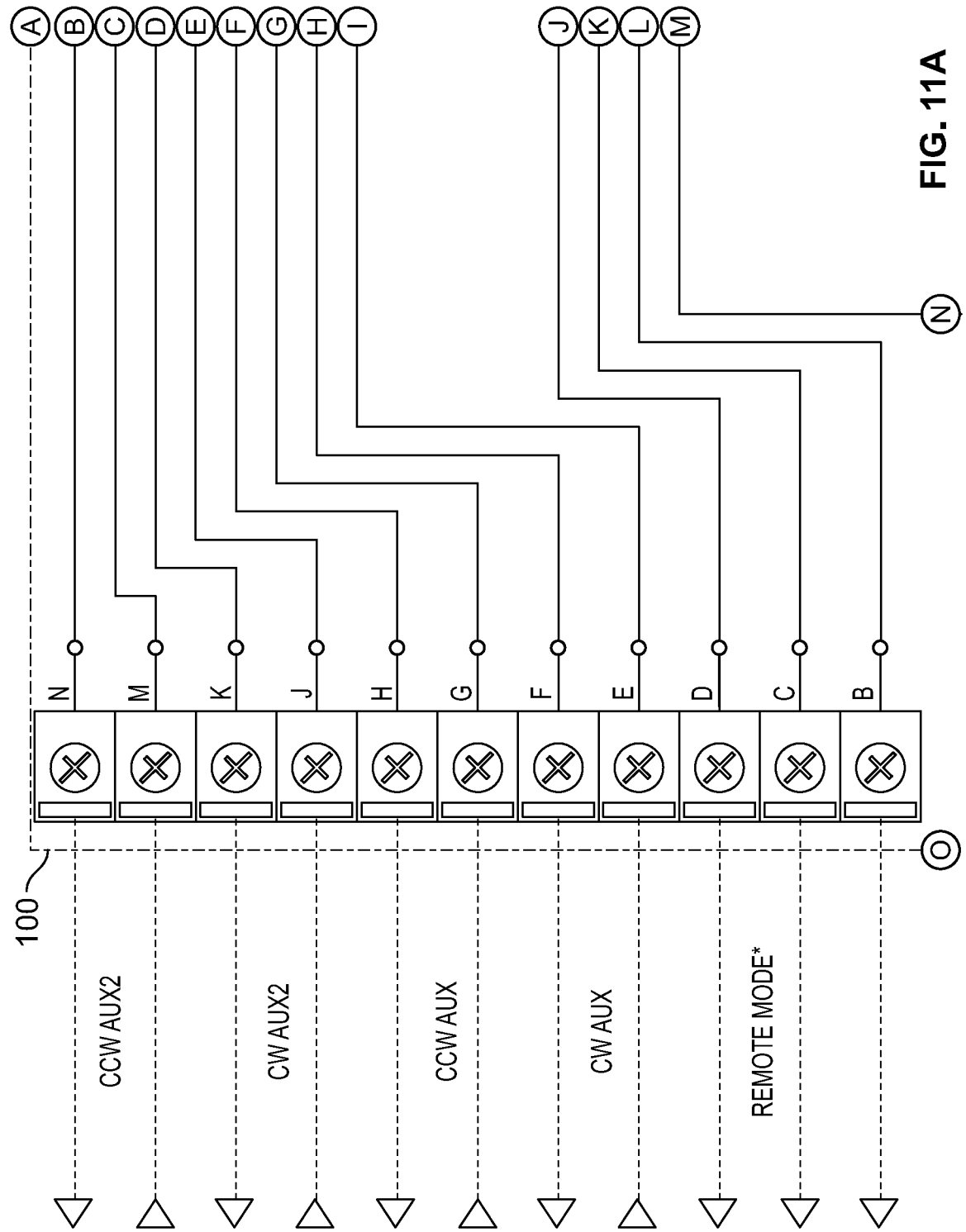
FIG. 11A-11E show a wiring diagram of a backplane and modular wiring interface board for a 120 VAC supply voltage for a 5-wire interface according to the present disclosure.
Figure 11B:
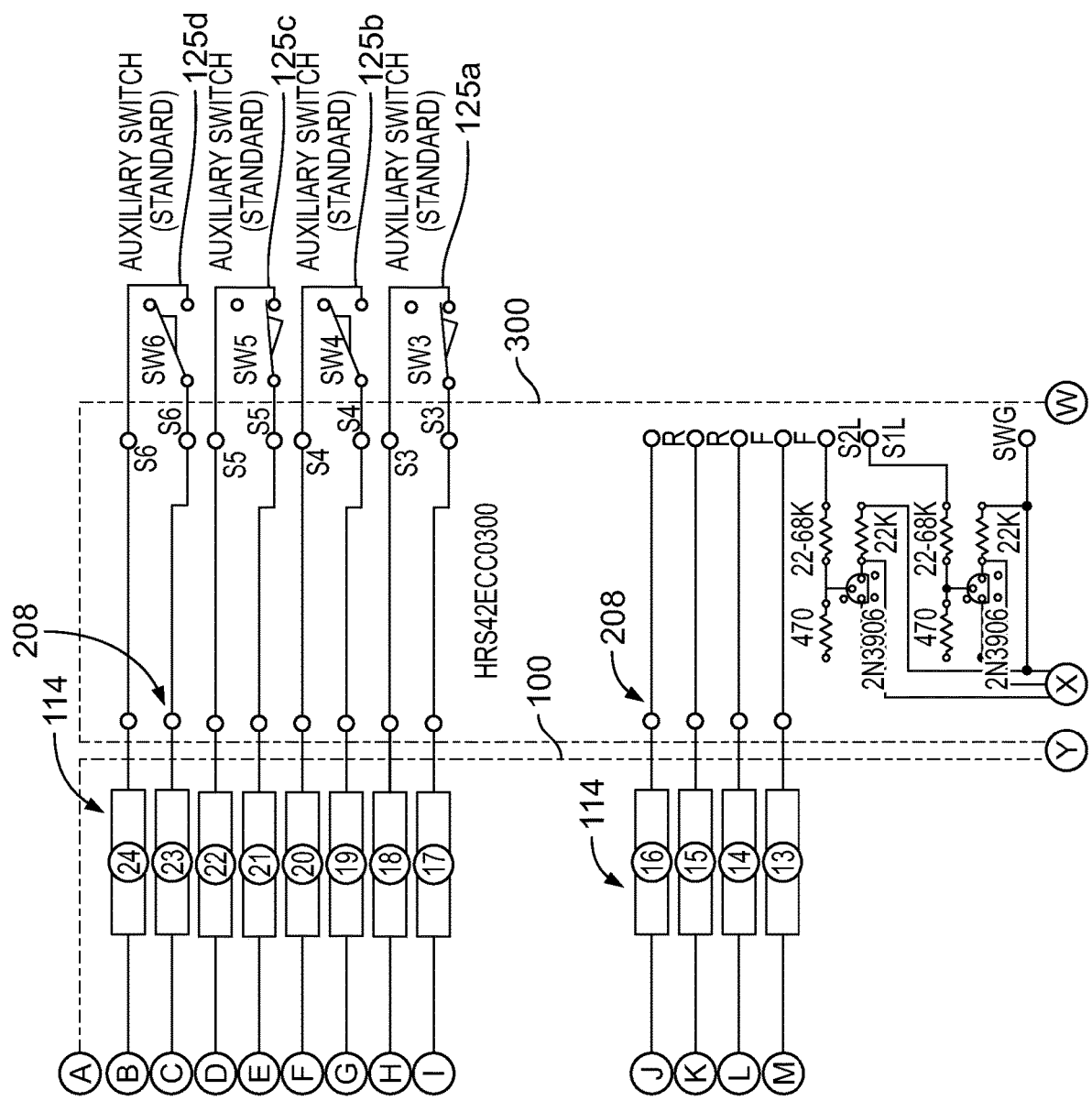
Figure 11C:
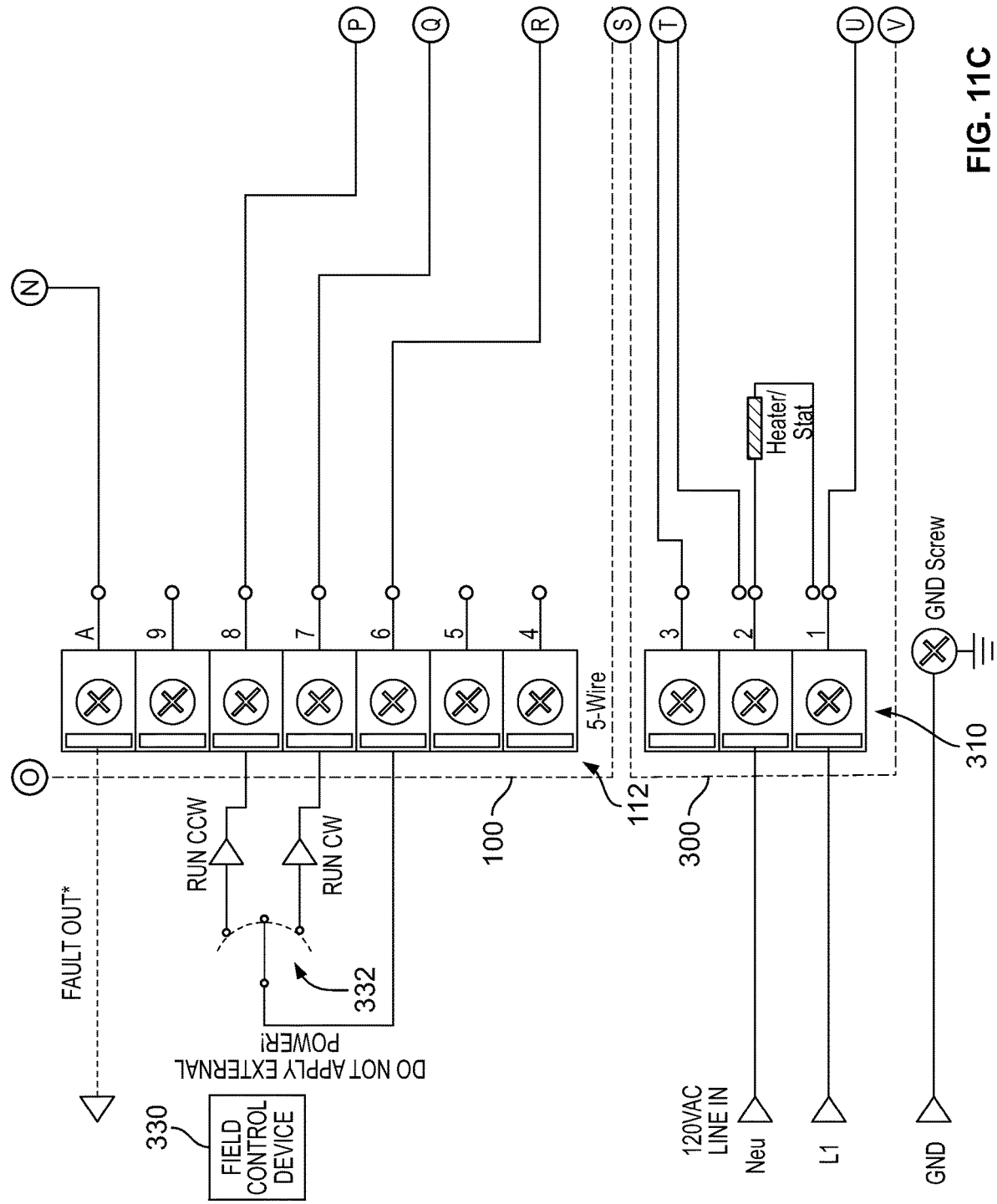
Figure 11D:
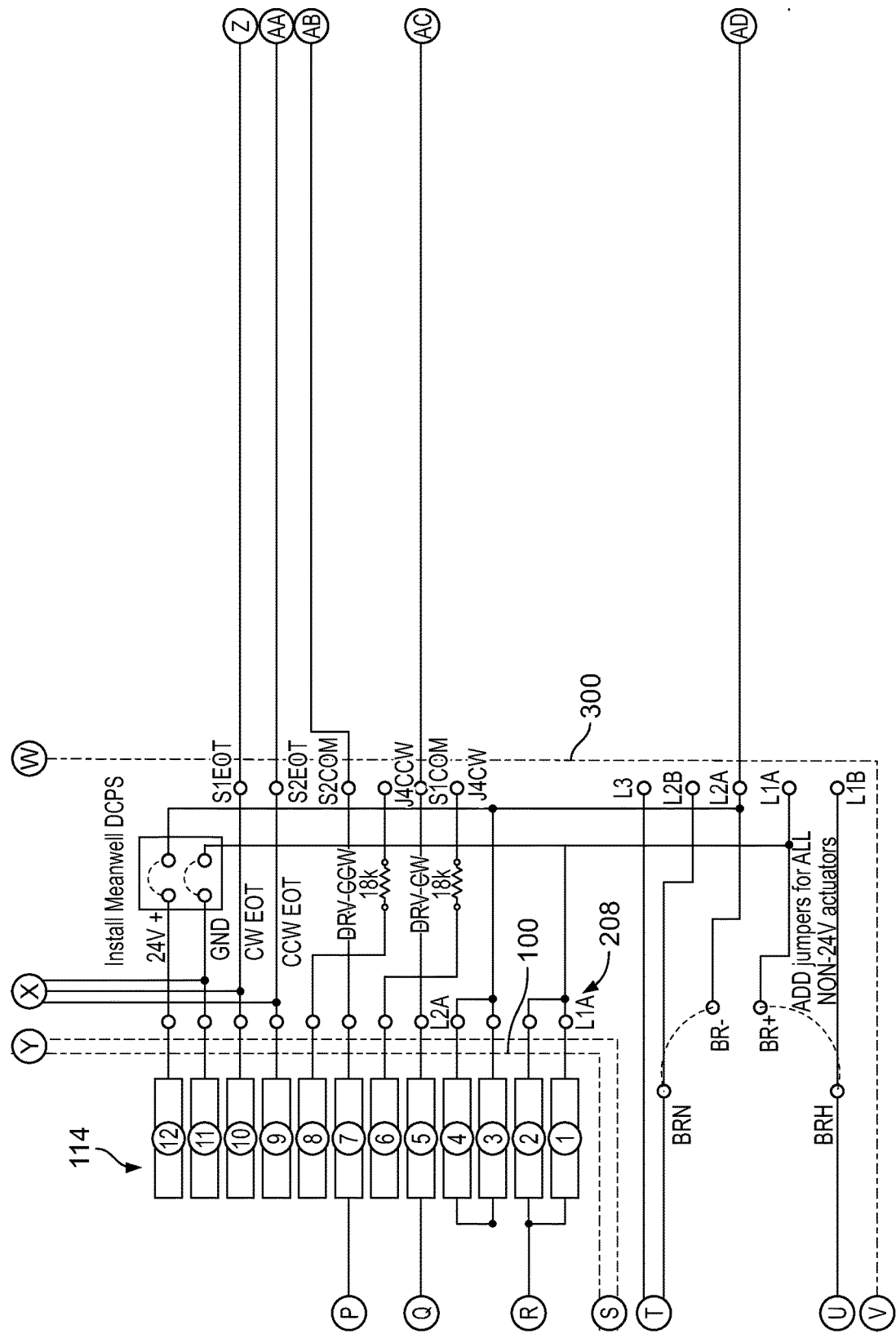
Figure 11E:
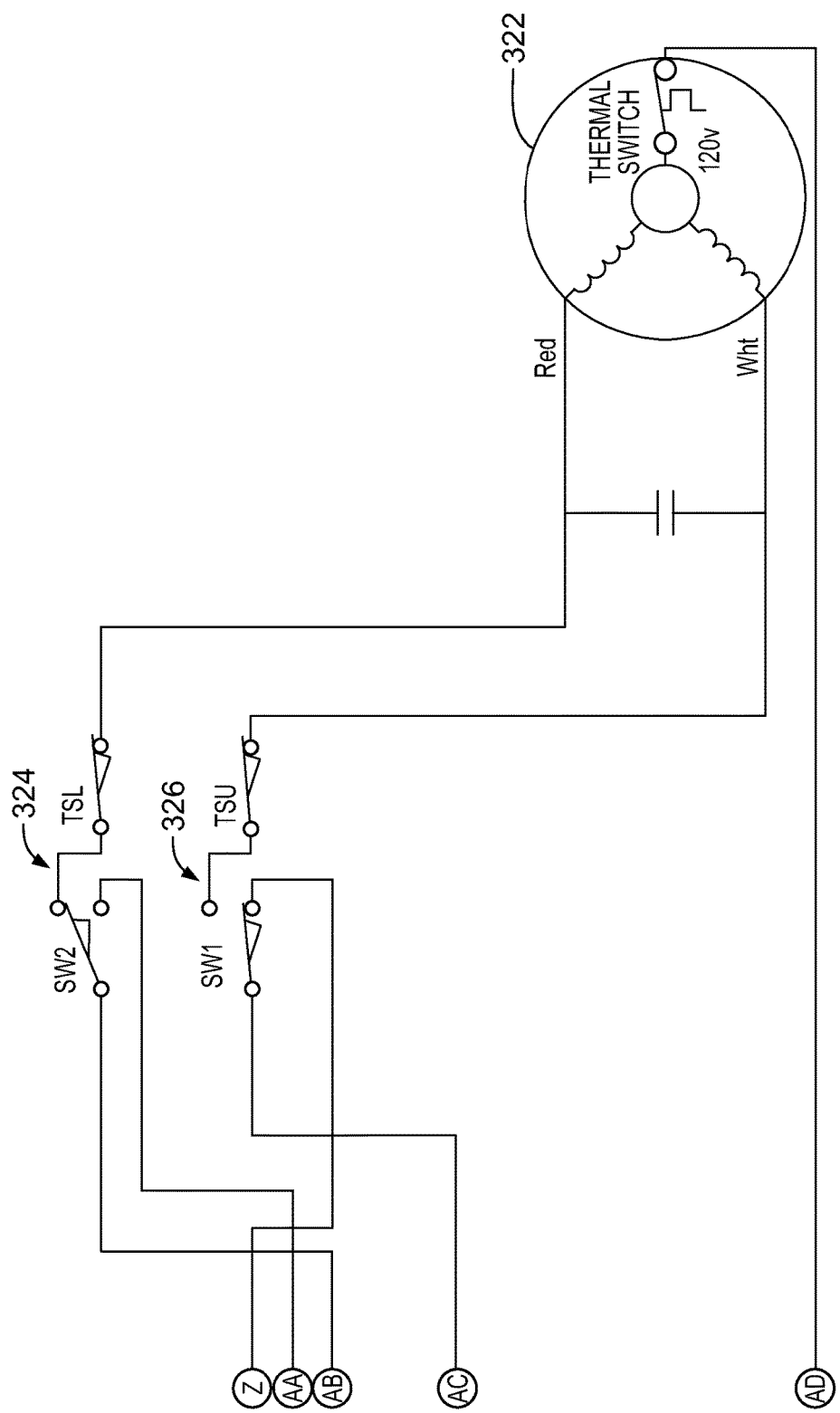
Figure 12A:
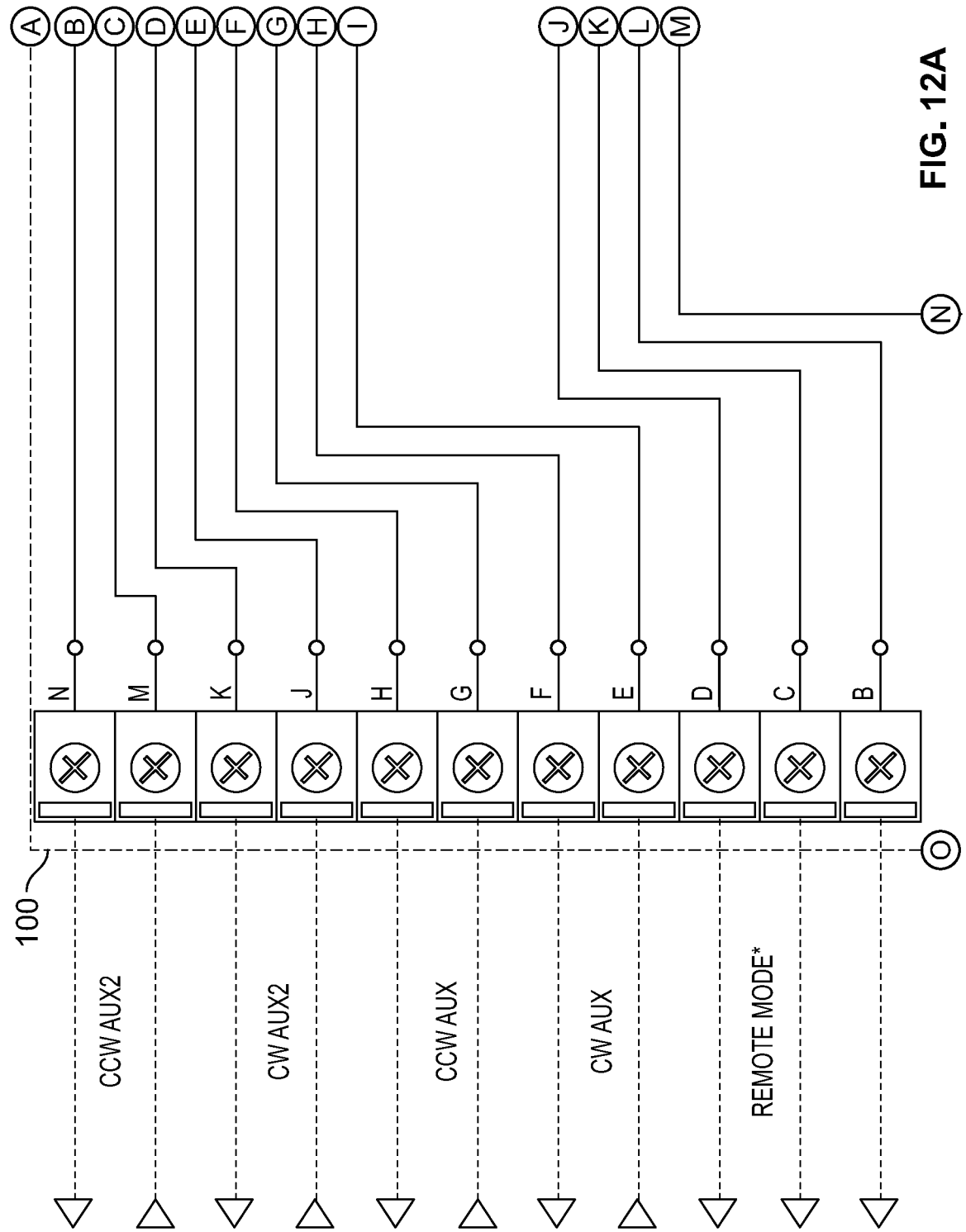
FIG. 12A-12E show a wiring diagram of a backplane and modular wiring interface board for a 120 VAC supply voltage for a 2-wire single contact closure, 3-wire inch/jog, 3-wire momentary, or 4-wire momentary with a stop interface according to the present disclosure.
Figure 12B:
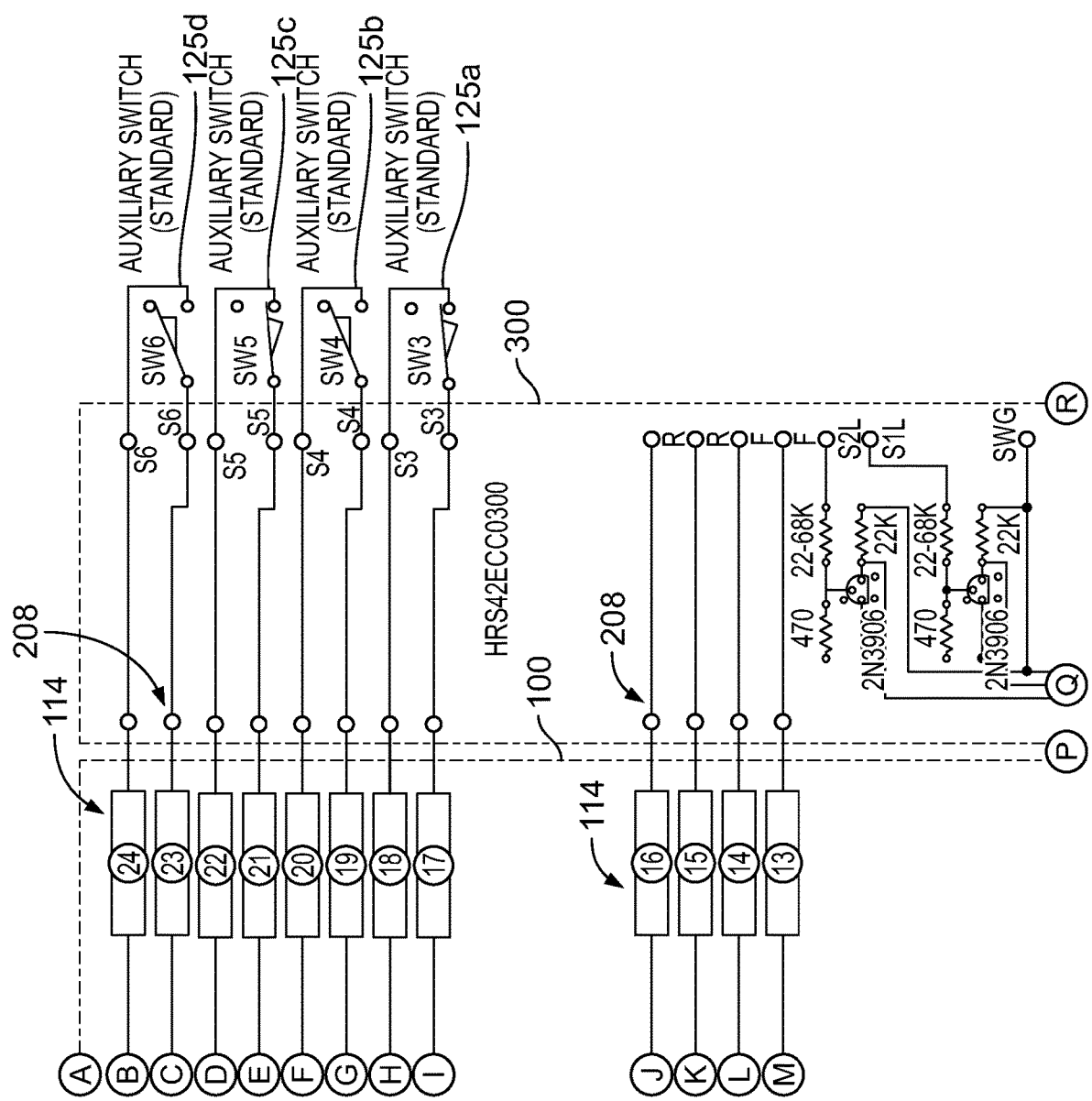
Figure 12C:
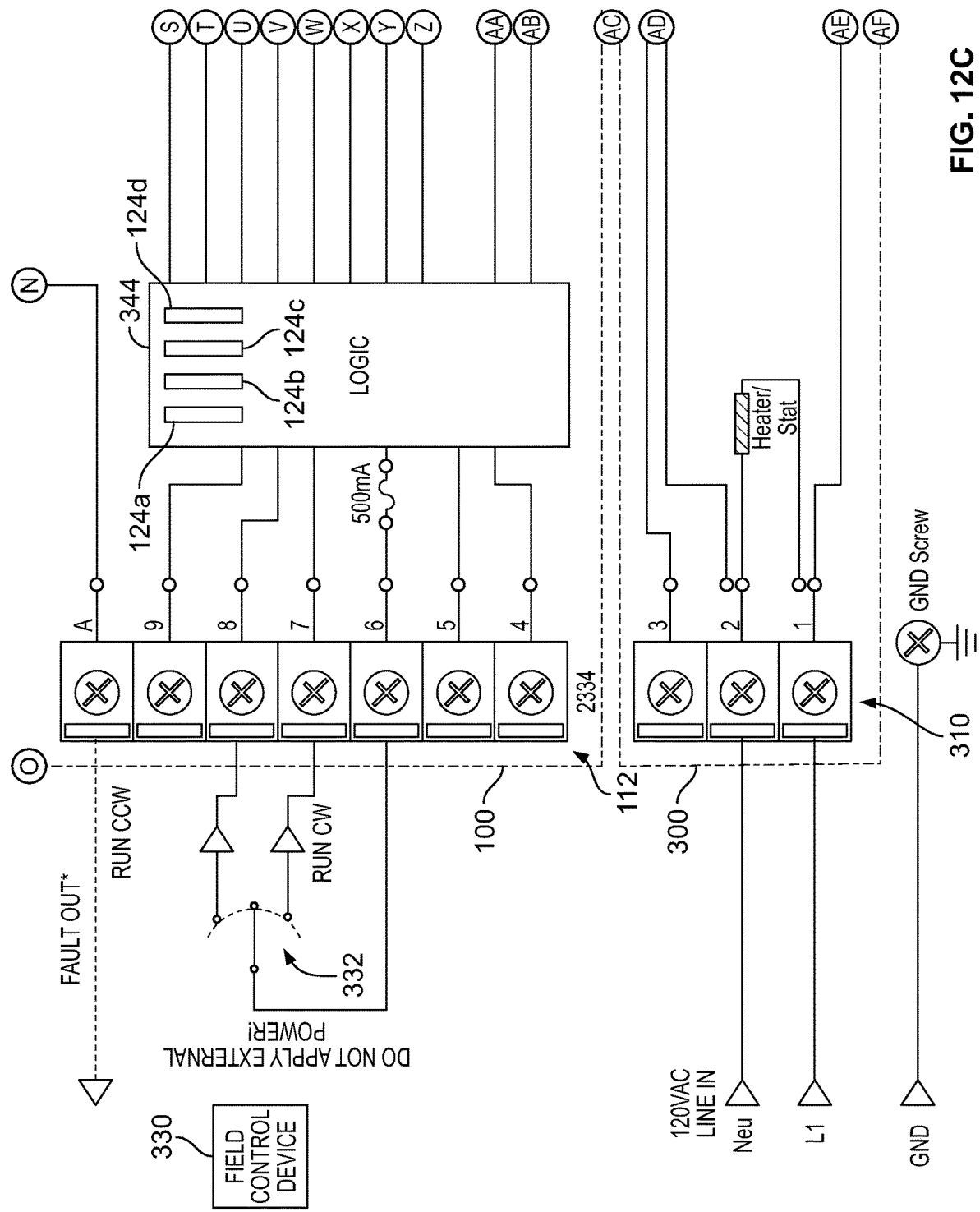
Figure 12D:
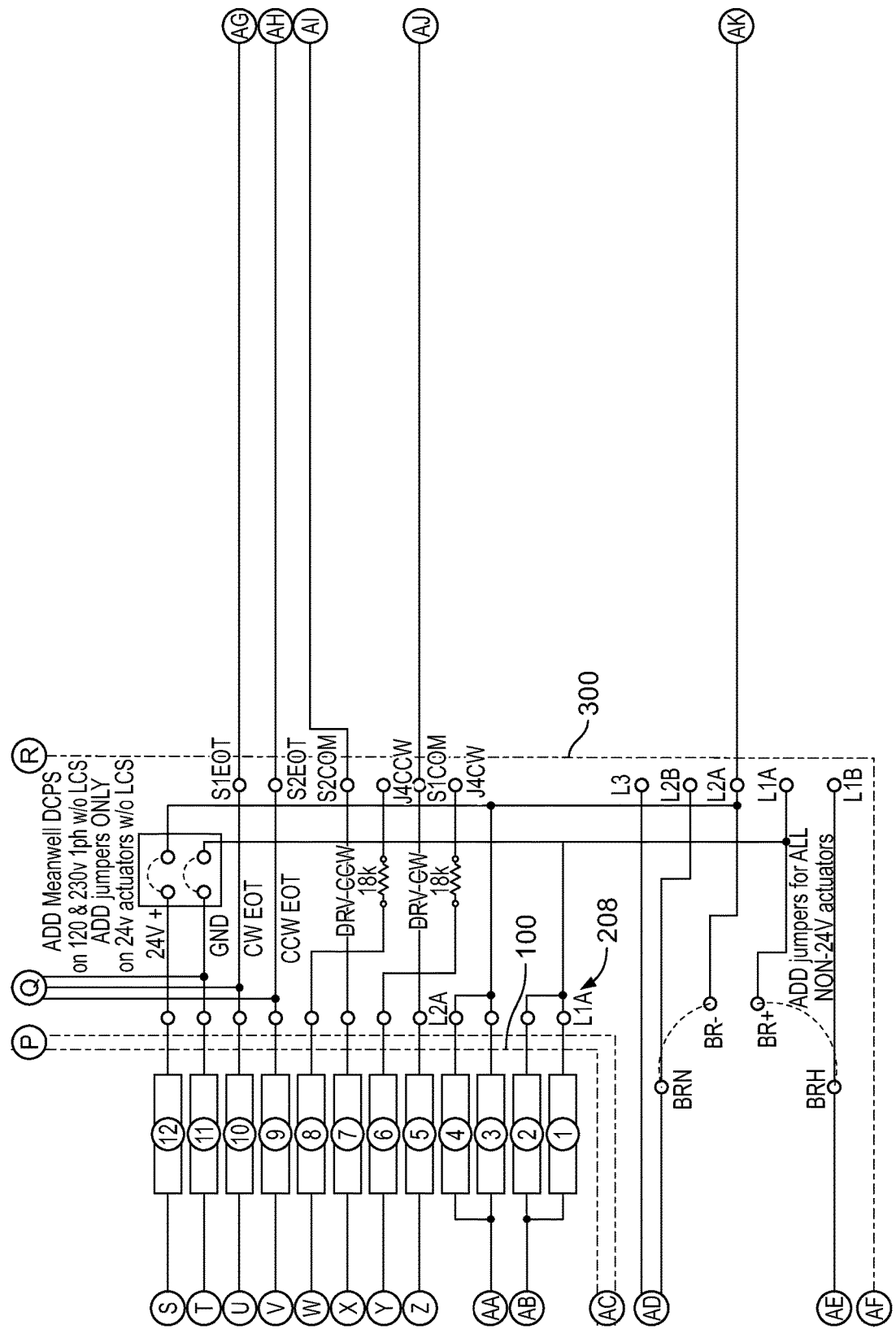
Figure 12E:
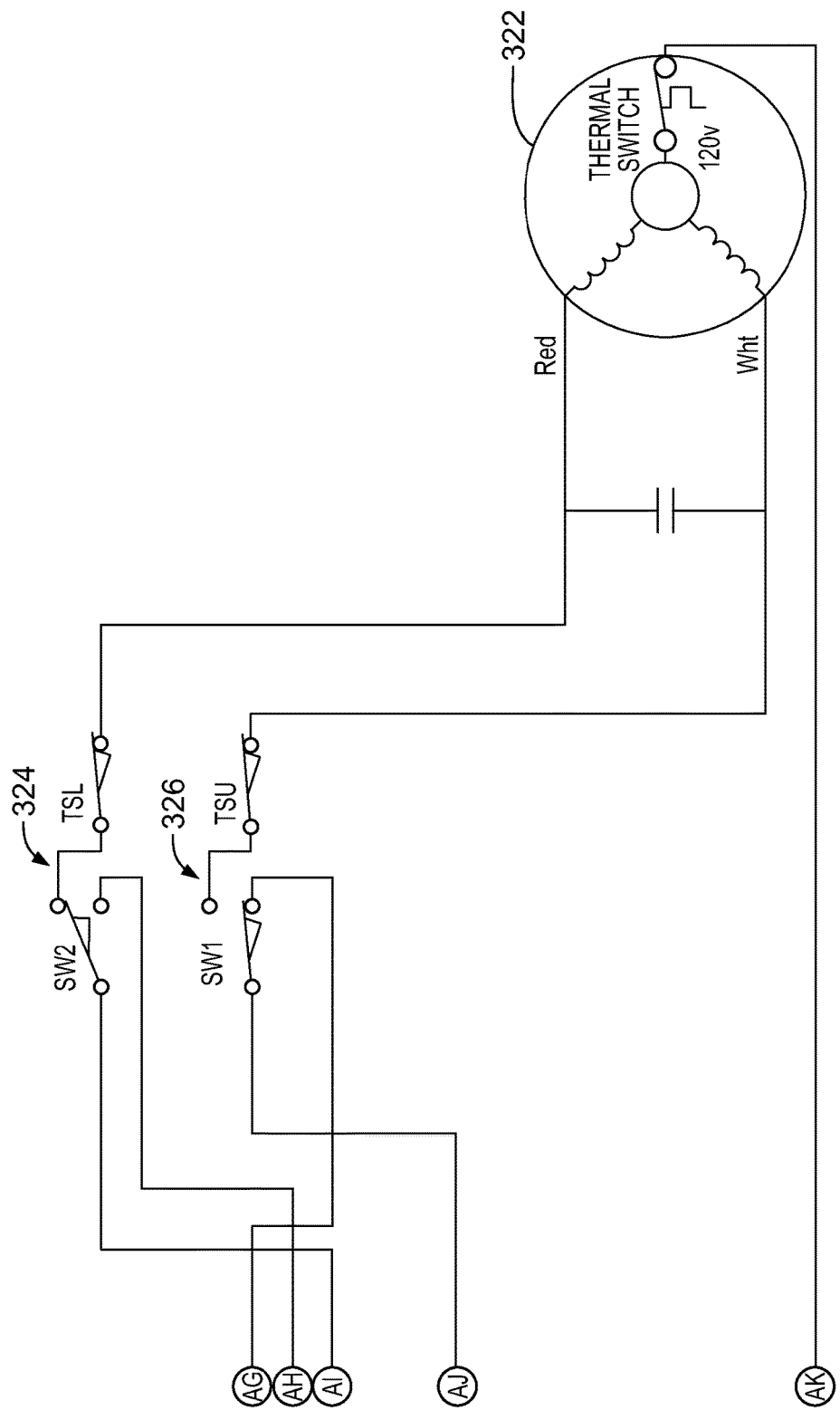
Figure 13A:
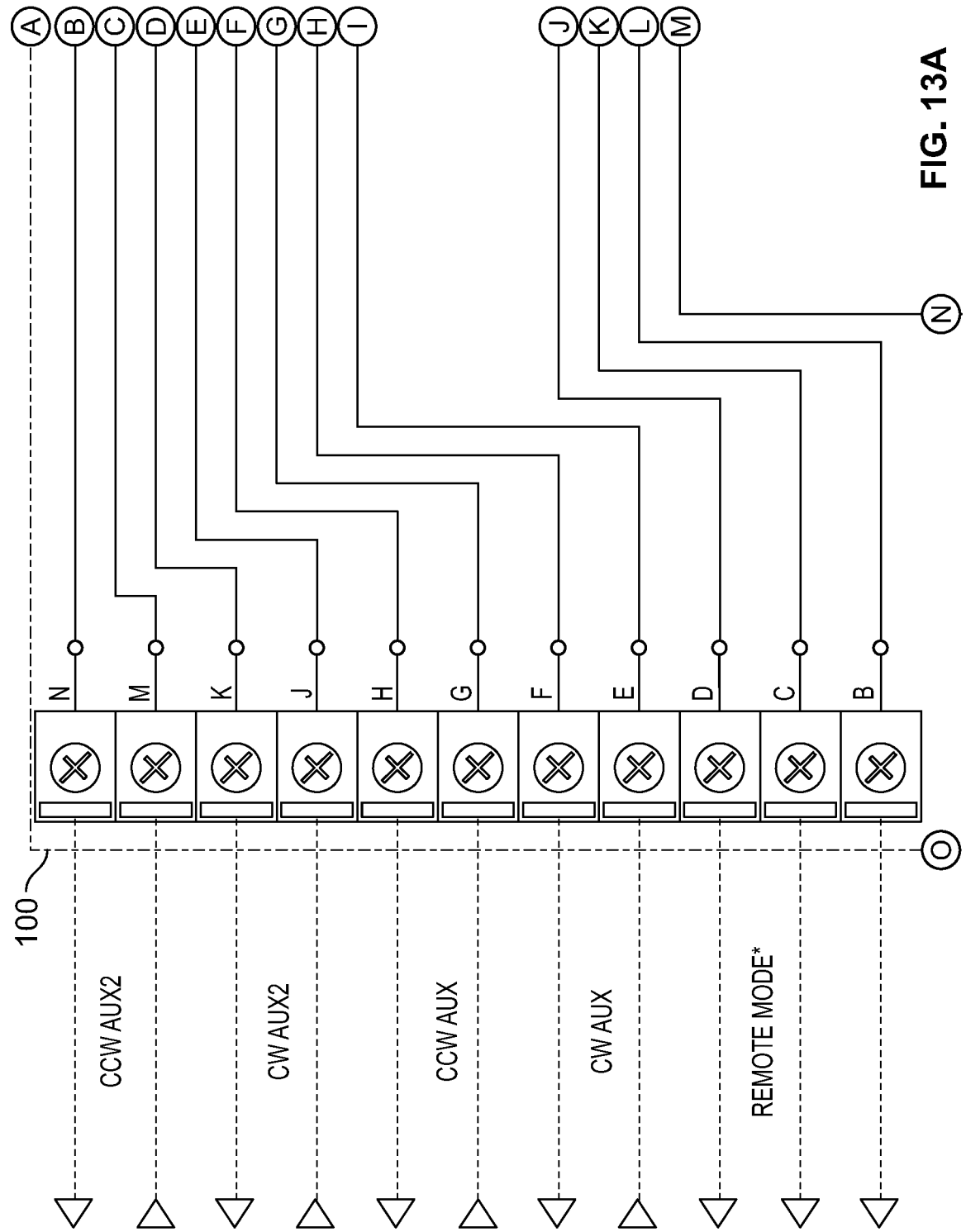
FIGS. 13A-13E show a wiring diagram of a backplane and modular wiring interface board for a 480 VAC three phase supply voltage for a 5-wire interface according to the present disclosure.
Figure 13B:
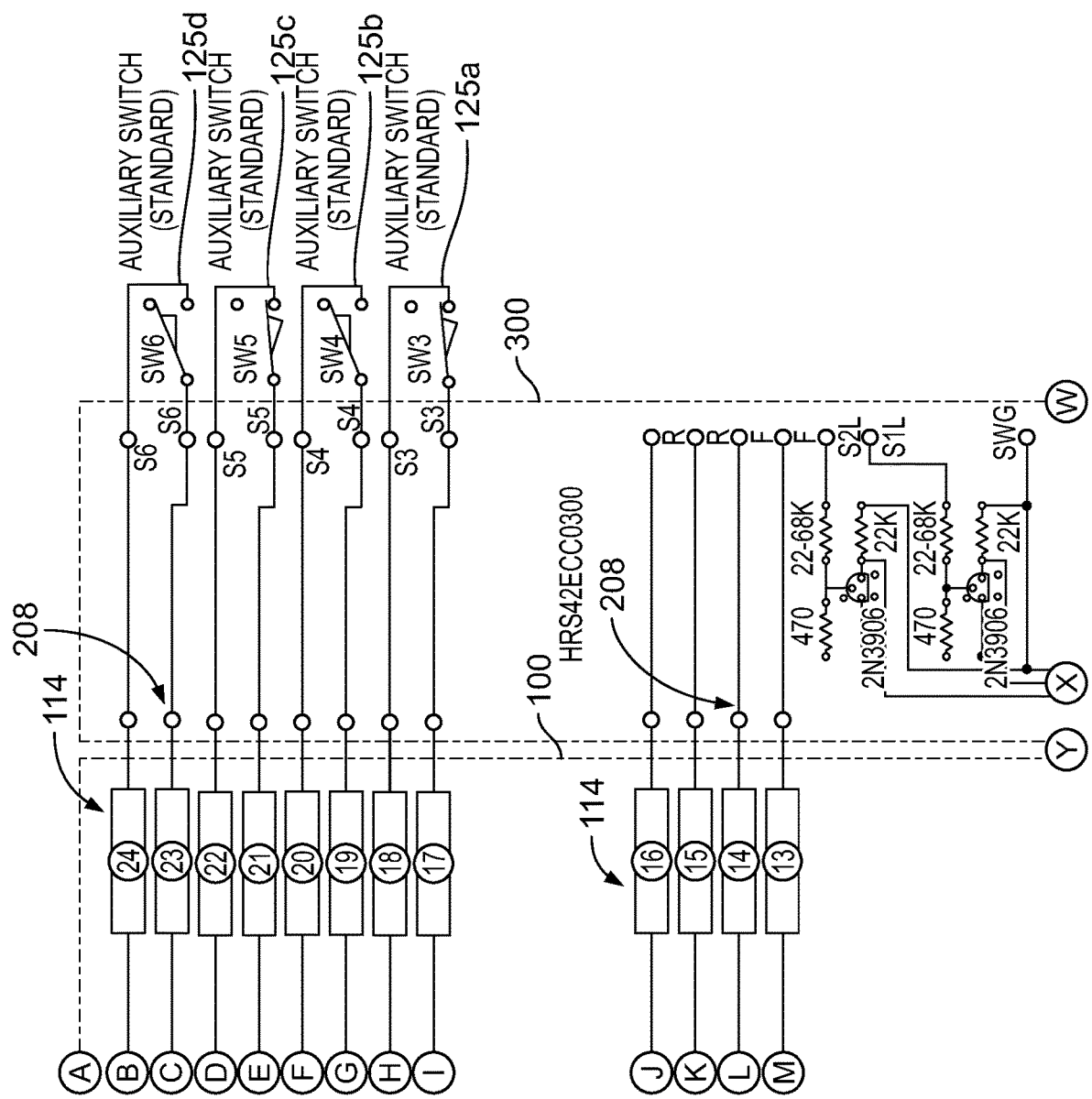
Figure 13C:
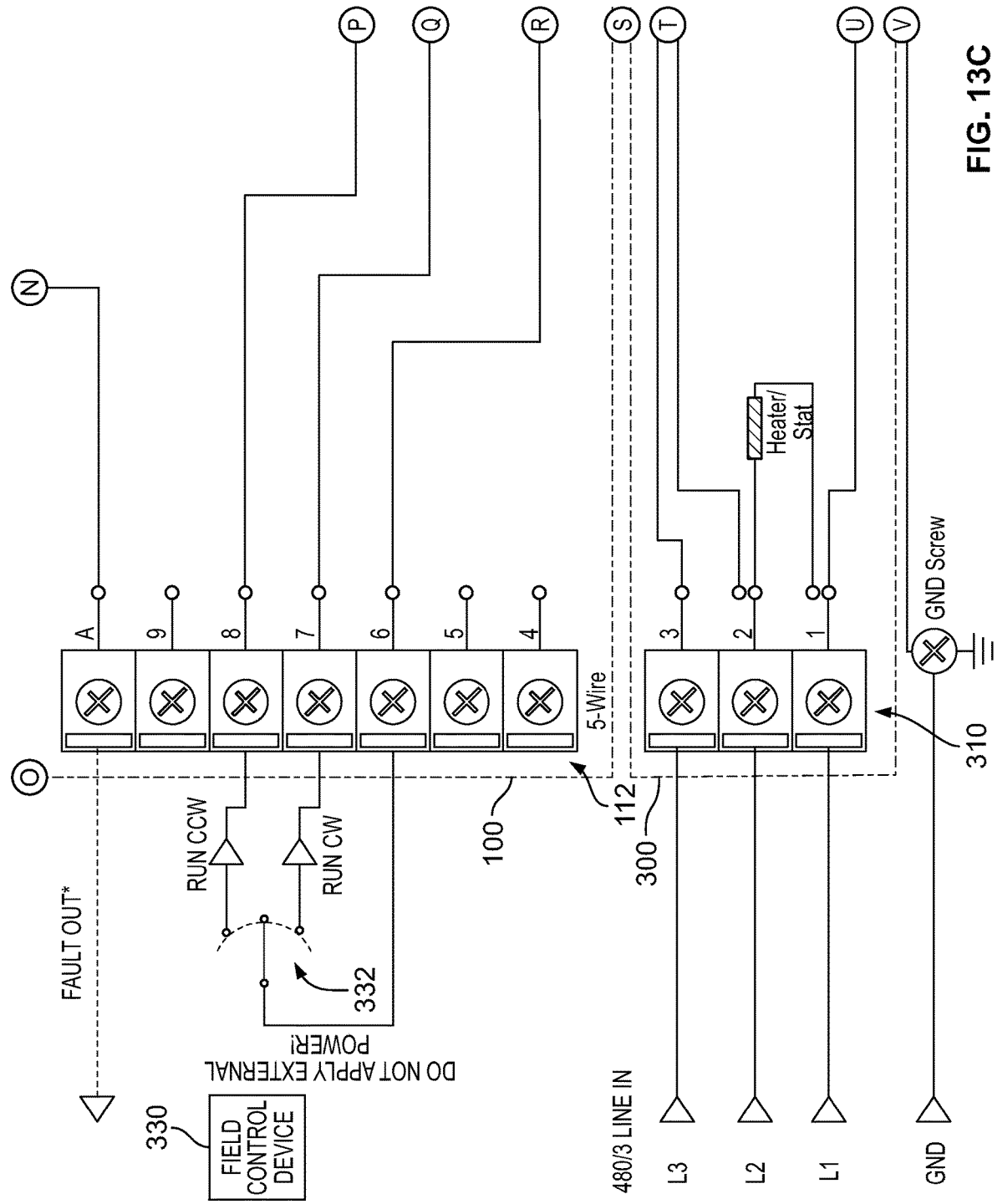
Figure 13D:
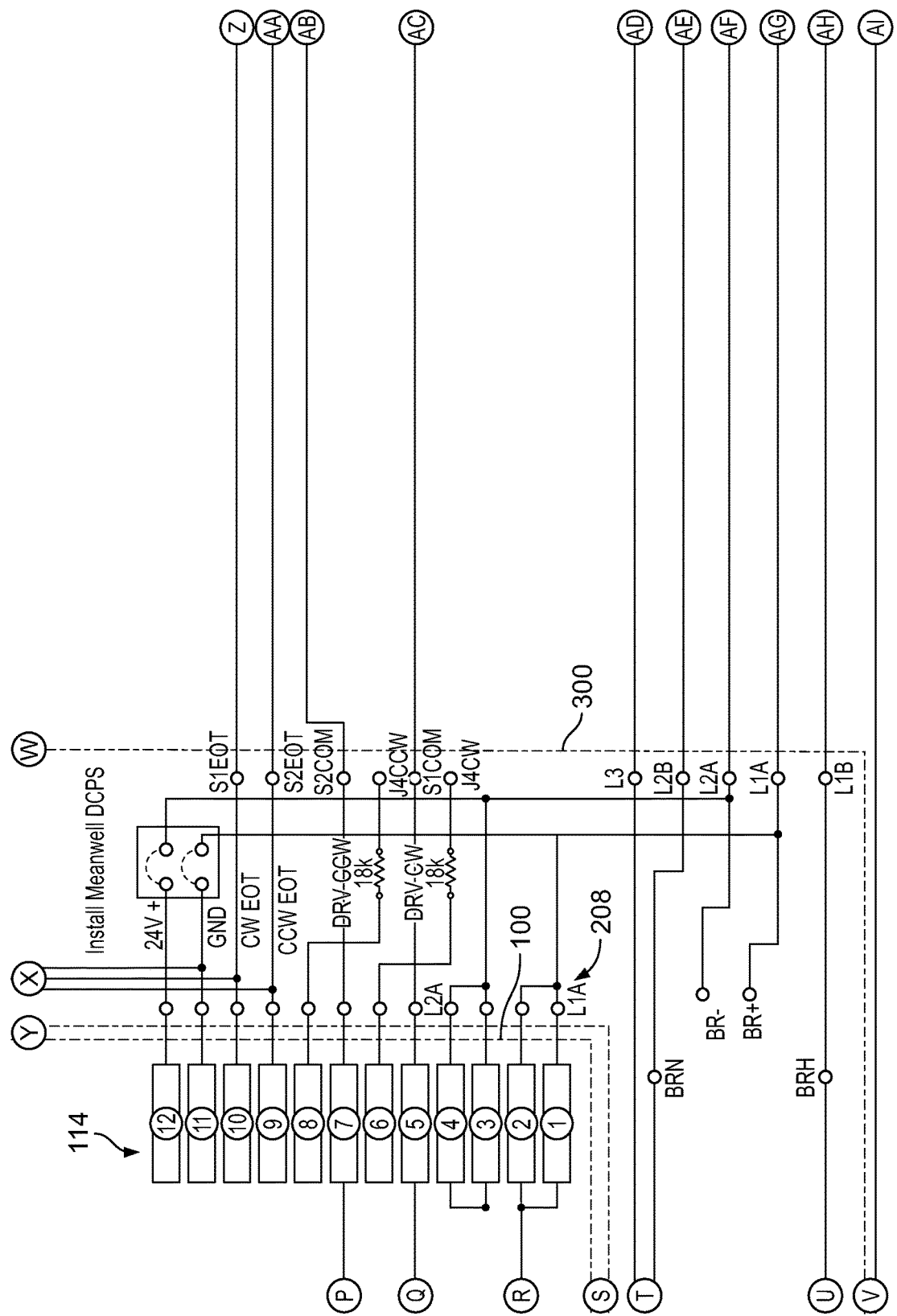
Figure 13E:
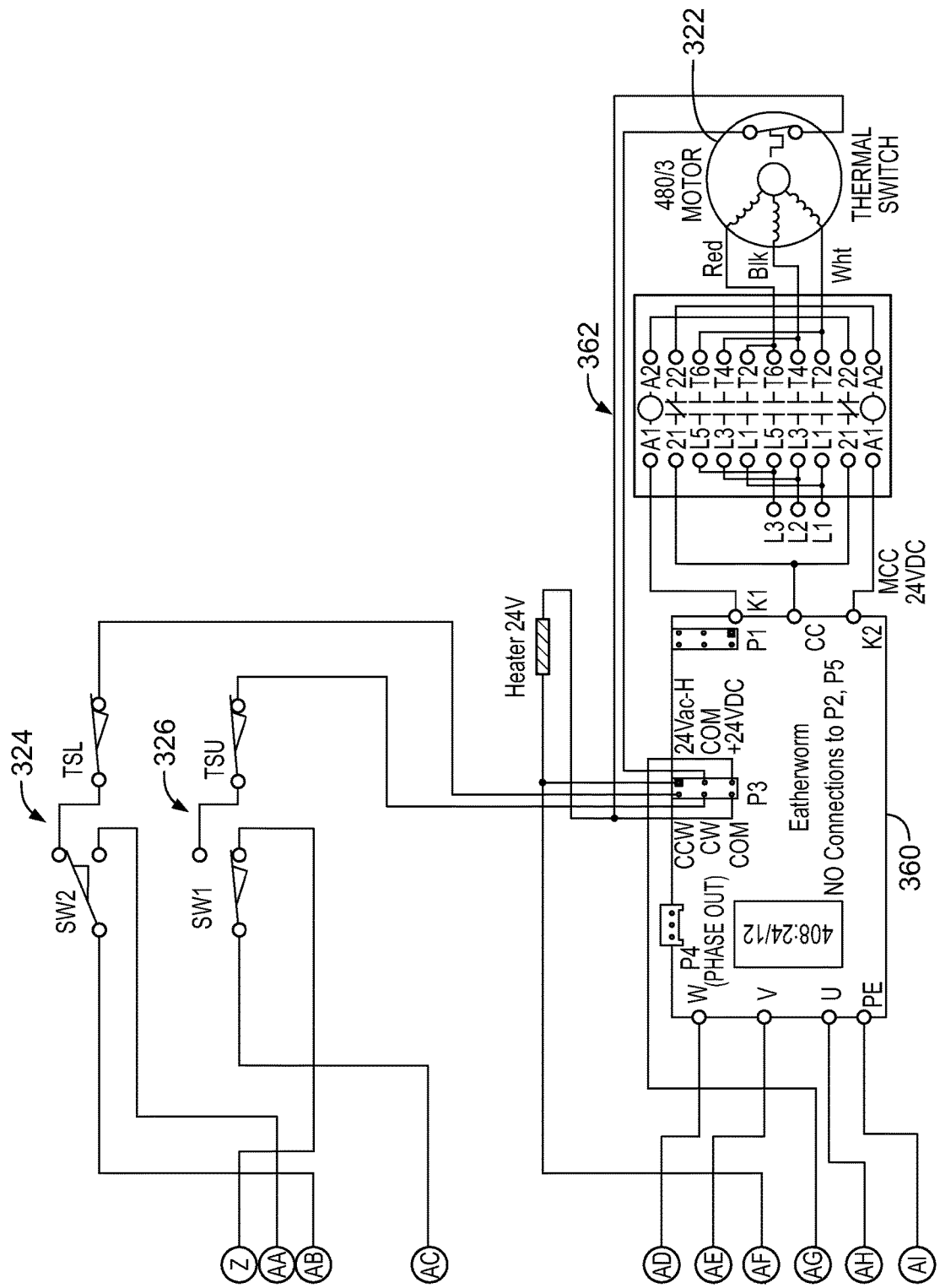
Figure 14A:
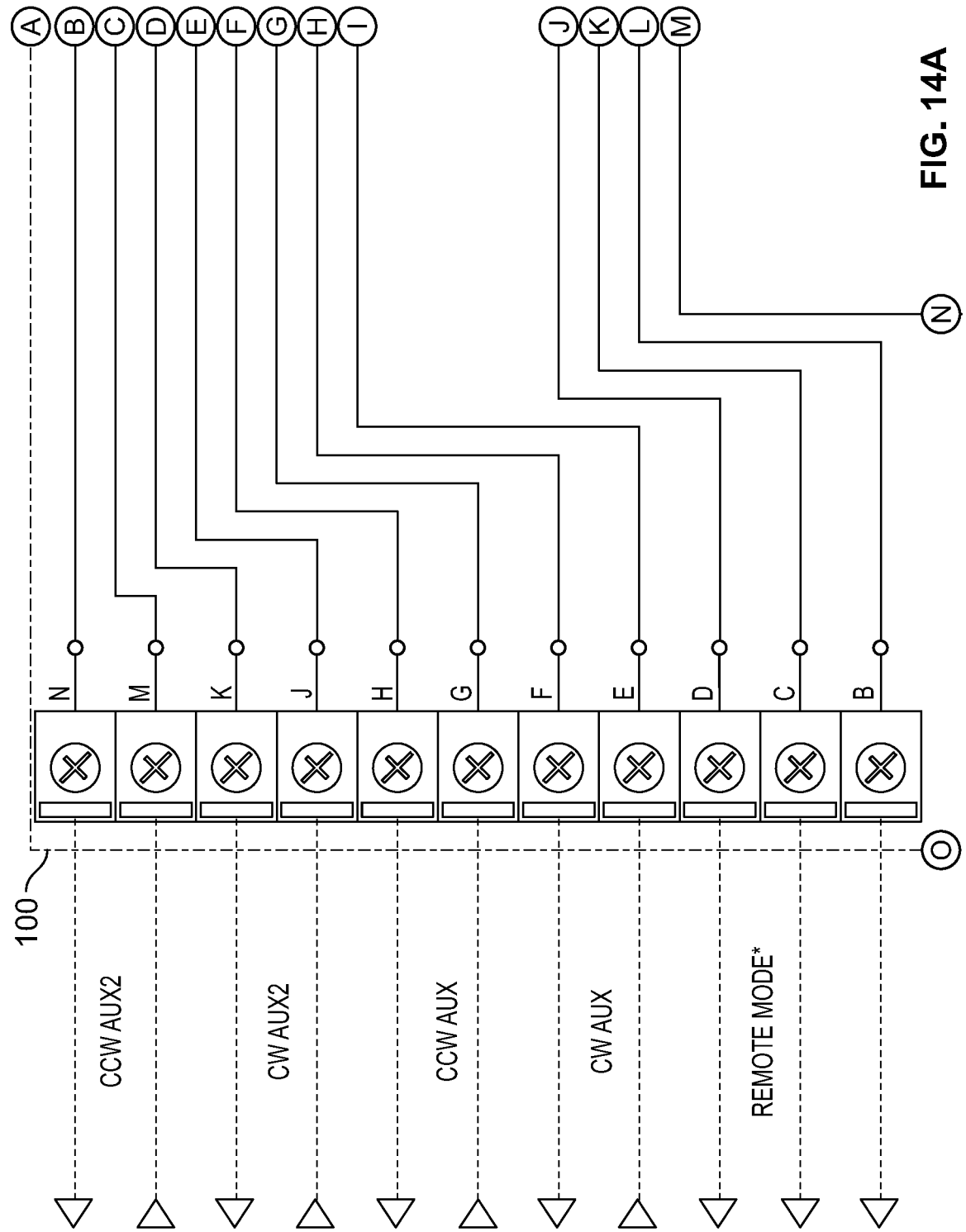
FIGS. 14A-14E show a wiring diagram of a backplane and modular wiring interface board for a 480 VAC three phase supply voltage for 2-wire single contact closure, 3-wire inch/jog, 3-wire momentary, or 4-wire momentary with stop interfaces according to the present disclosure.
Figure 14B:
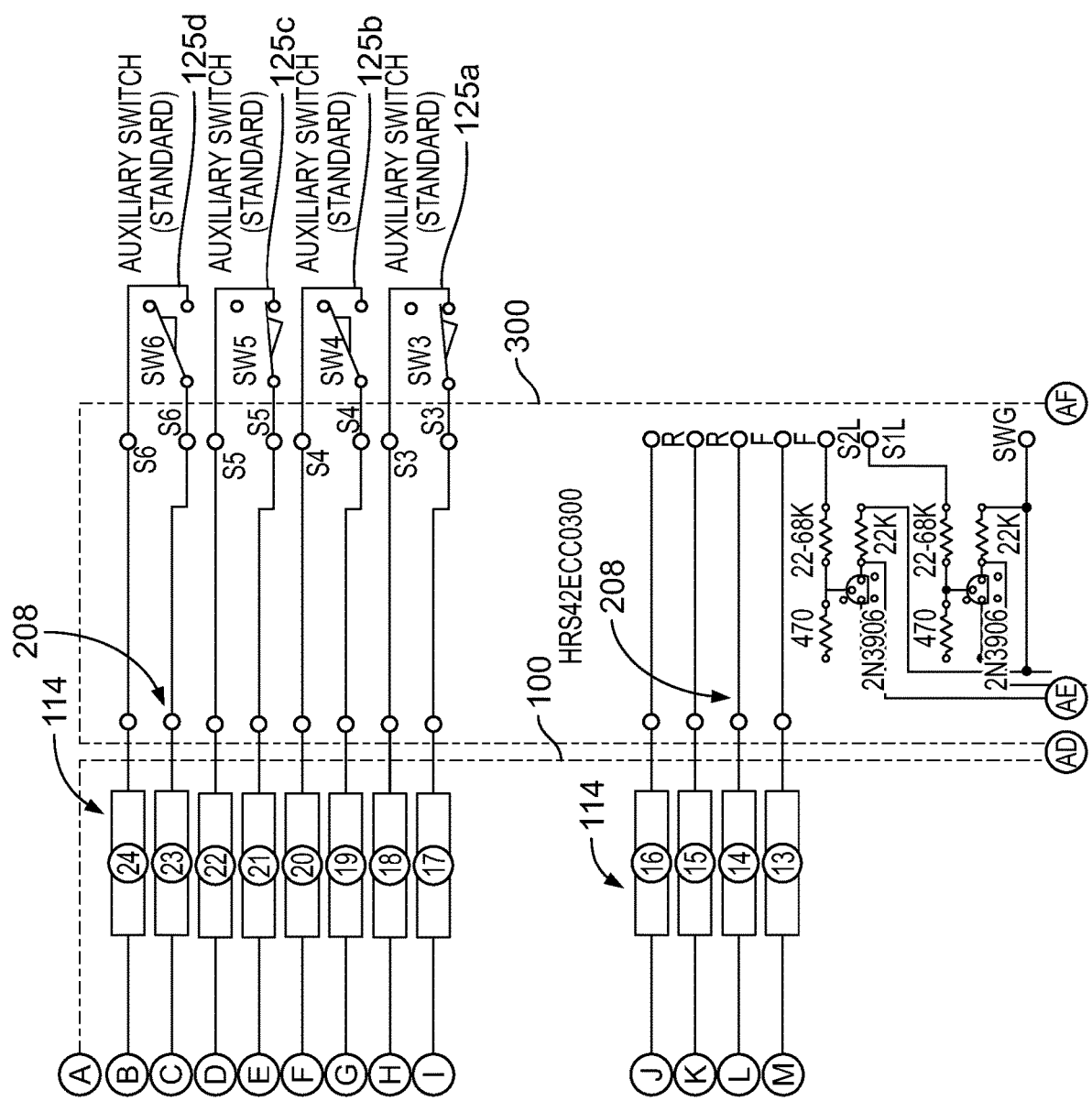
Figure 14C:
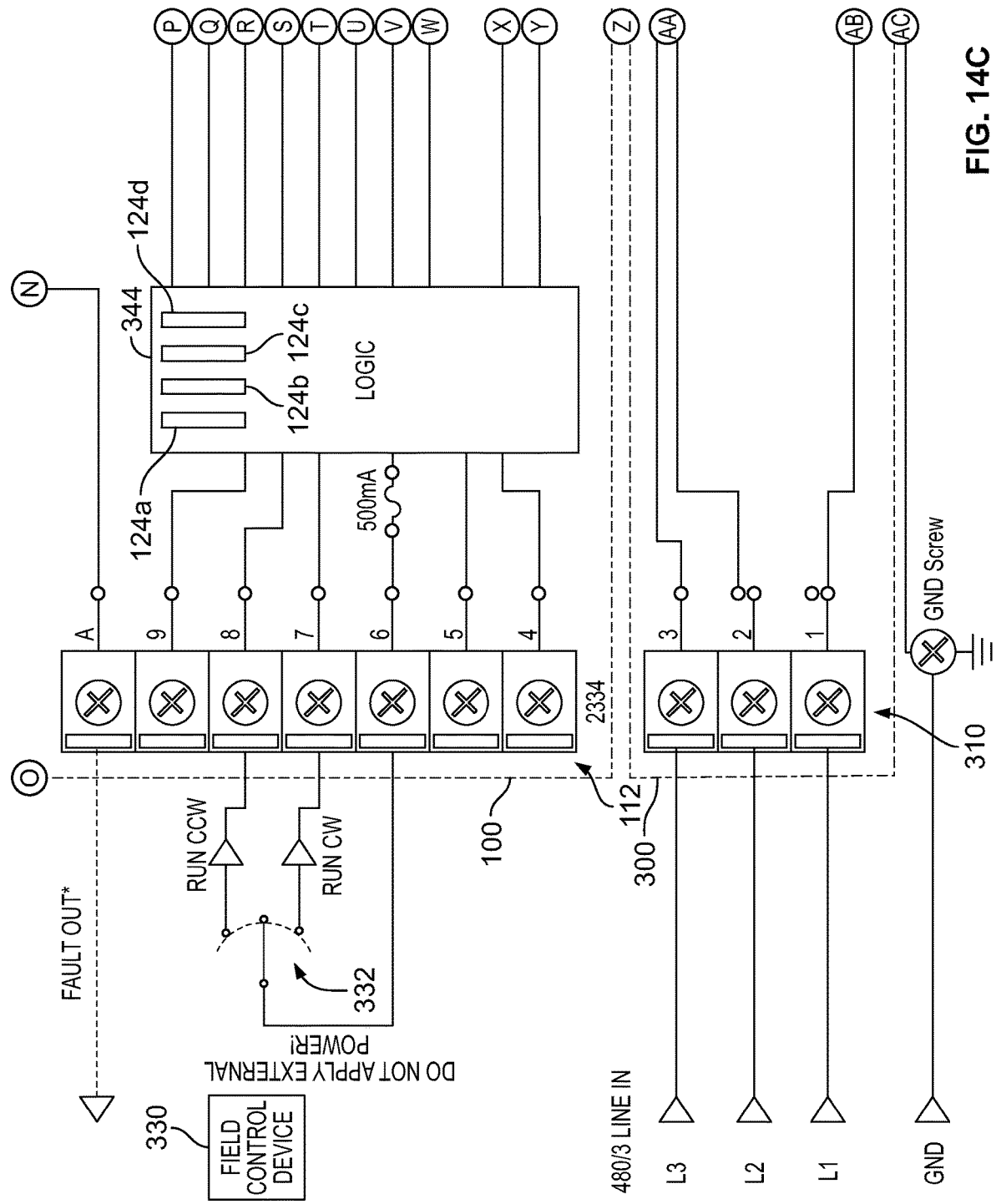
Figure 14D:
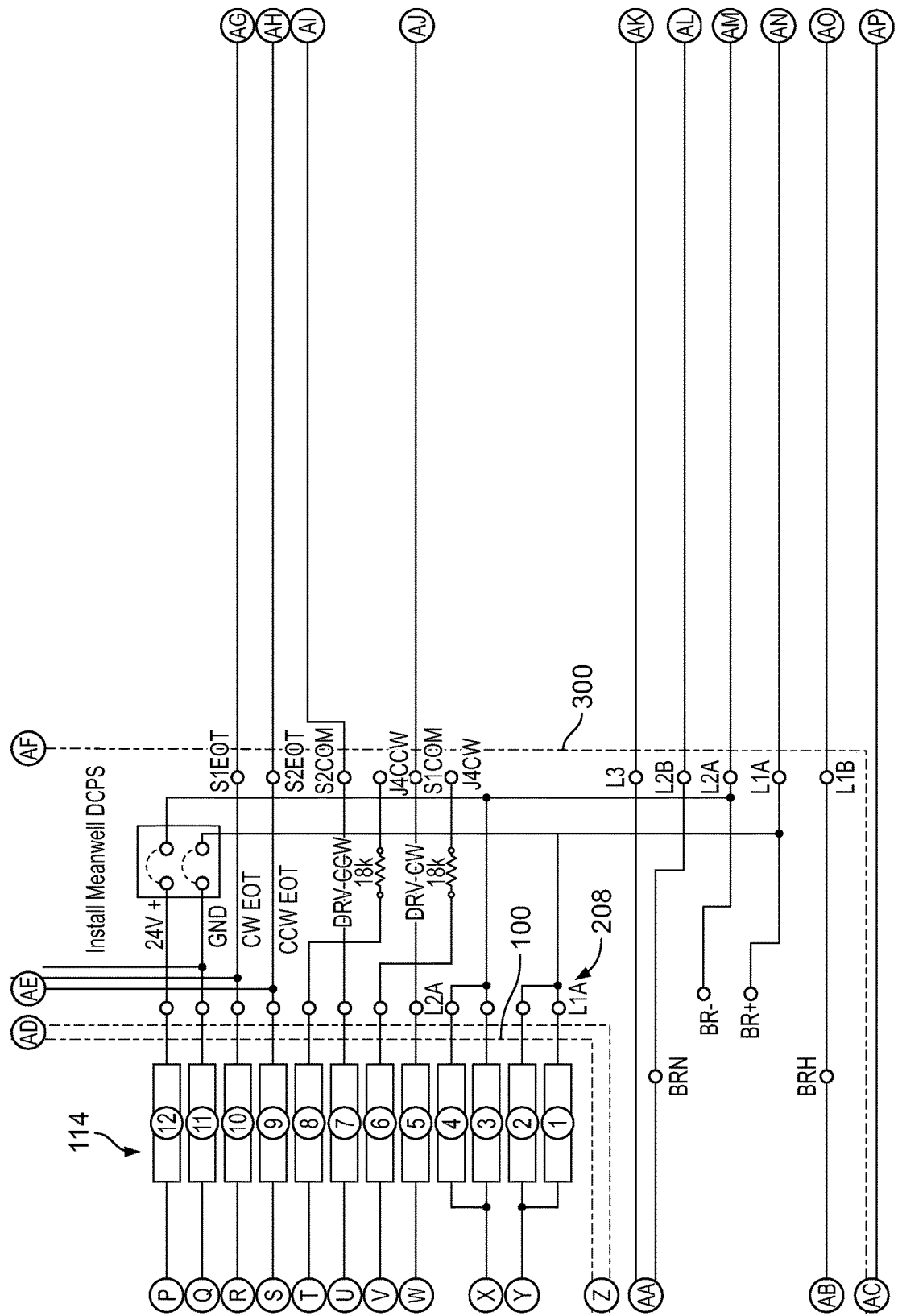
Figure 14E:
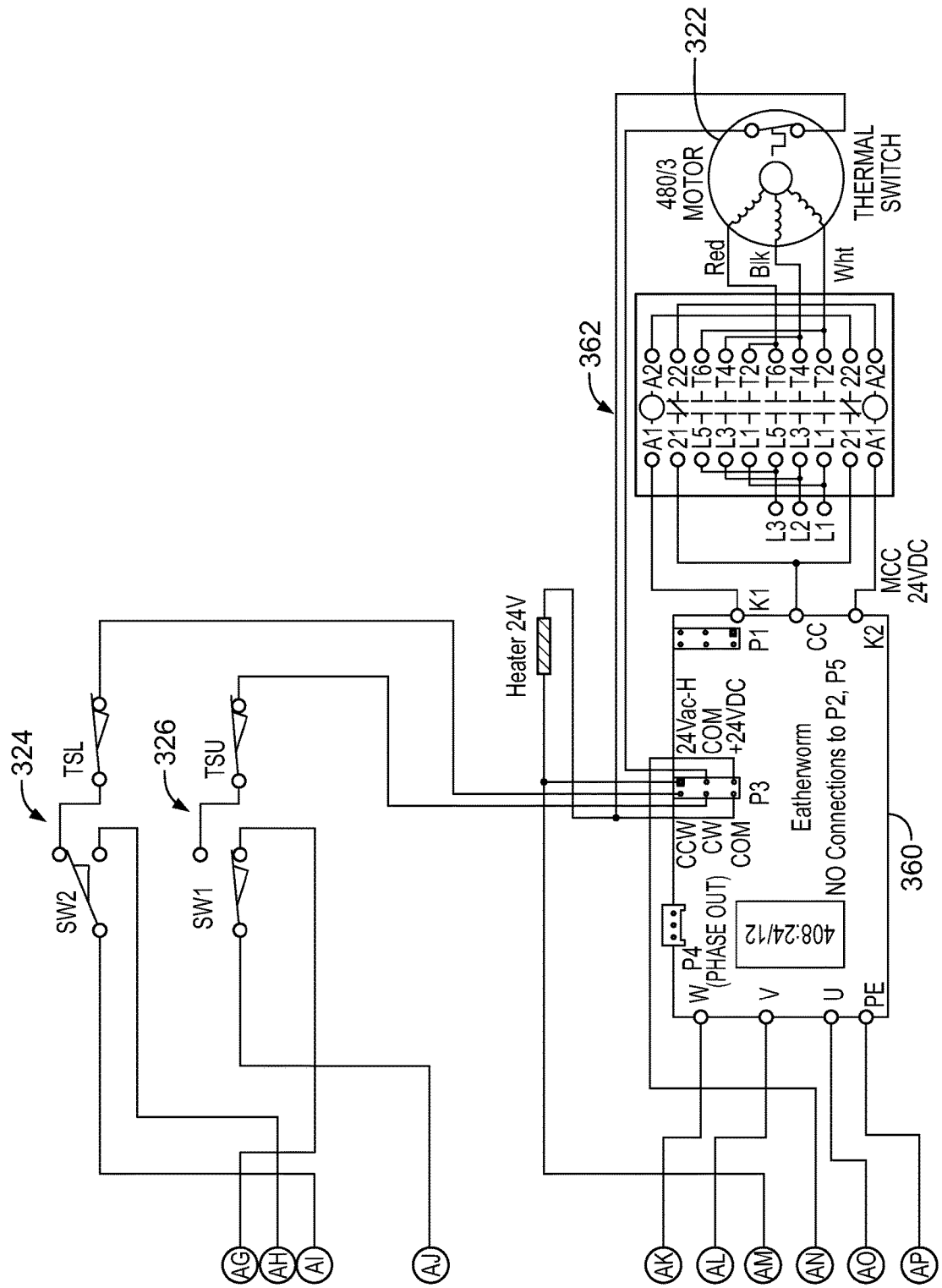

FIGS. 4 and 5 are top and bottom diagrammatic views of the interface board 100 of FIG. 1 showing the electrical components thereof. The interface board 100 includes four switches 124a-d (e.g., switching mechanisms) each positionable in a first position (e.g., an "on" position) or a second position (e.g., an "off" position). In some embodiments, the switches 124a-d can be, for example, DIP switches, auxiliary switches, or the like. Based on the combination of positions of the switches 124a-d, different wiring configurations can be achieved, which is discussed in greater detail below. The terminals 112 can be numbered as terminals 1-9 and terminals A-N. The interface board 100 can include one or more visual indicators 126 (e.g., light-emitting diodes (LEDs), or the like) for providing status and/or error notifications to a user.

The interface board 100 includes a plurality of electrical isolating components 128 (e.g., including one or more opto-relays) that drive operation of the interface board 100 and ensure electrical isolation of the input and/or output of the interface board 100 to protect wiring of the interface board 100, and wiring and/or equipment of the end user. In some embodiments, electrical isolation of the input and/or output of the interface board 100 can be achieved via optics. The components 128 ensure that all inputs and all outputs are electrically isolated on the interface board 100, e.g., the current paths are optically isolated so that there is no direct current path from the input to the output of the interface board 100. As such, any input activity does not transfer to the output activity due to the closed feedback system. The components 128 can include an opto-isolator 130 and opto-solid state relays 129, 131 with zero crossing detection that receives feedback from the field. The interface board 100 provides a degree of protection to the main actuator circuitry through the use of opto-isolators on the output side of the interface board 100. Separation of the board/control wiring circuitry from the main actuator circuitry via the opto-isolators protects the main body of the actuator and offers an additional level of safeguarding against upset events, such as power surges, as the interface board 100 can be significantly damaged and the surge is not transferred to the main actuator circuitry. Under most circumstances, the interface board 100 can be replaced after an upset event and the actuator would resume its functionality. The interface board 100 includes resistors, transistors and capacitors that can be configured based on the voltage used.

The interface board 100 can include a complex programmable logic device (CPLD) 132 (e.g., a microchip, a microcontroller, a processor, a logic processor, a microprocessor, a logic controller, a digital processor, a digital data manipulation component, or any other controller capable of modifying logic signals). In some embodiments, a programmable logic device (PLD) chip, a field programmable gate array (FPGA) chip, a microprocessor chip, or the like, can be used instead of the CPLD 132. The CPLD 132 uses combinatorial logic based on the position of the switches 124a-d and efficiently determines the appropriate wiring configuration. Moreover, the interface board 100 can be constructed without an oscillator that may otherwise generate radio interference. Gates associated with the switches 124a-d are configured based on the position of the switches 124a-d, with the position indicating which gates are active. The CPLD 132 can read a momentary switch closure and latch until feedback is received from the field from the actuator indicating that the actuator has completed its motion, or until a stop or reset command is received.

FIGS. 6A-6F show a wiring diagram of the interface board 100 that can be used for each of the 2-wire single contact closure, 3-wire inch/jog, 3-wire momentary, and 4-wire momentary with stop interfaces. FIG. 6 shows the electrical connections between the terminals 112, contacts 114, switches 124a-d, opto-isolator 130, and CPLD 132.

FIGS. 7A-7E show a wiring diagram of a backplane 300 and interface board 100 for a 24 VAC/VDC supply voltage for 2-wire single contact closure, 3-wire inch/jog, 3-wire momentary, or 4-wire momentary with stop interfaces with internal power supply, and without local control. In some embodiments, the wiring diagram of FIGS. 7A-7E can be for an on/off non-local control actuator for a 3-wire momentary interface. The backplane 300 and interface board 100 are electrically coupled to a relay drive board 320 (e.g., a 24 V high current motor relay drive board) of an actuator which, in turn, is electrically coupled to a motor 322 (e.g., a 24 V DC motor). Electrical limit switches 324, 326 can be disposed between the relay drive board 320 and the backplane 300 and/or the interface board 100. The limit switches 324, 326 can be incorporated into the actuator with the relay drive board 320. Terminals 310 (e.g., terminals 1 and 2) of the backplane 300 receive the main supply voltage in the form of single phase 24 VAC/VDC, which feeds to the relay drive board 320 and powers the motor 322. The backplane 300 therefore acts as the originator for the supply voltage to the interface board 100 (e.g., for each of 230 VAC, 120 VAC, 24 VAC/VDC, and 480/3 VAC). A bridge 328 can be disposed between the terminals 310 and the relay drive board 320. A CPLD 344 (e.g., CPLD 132 of FIG. 4) on the interface board 100 can be used to coordinate communication between the field control device 330, the interface board 100, and the relay drive board 320. The actuator can include one or more auxiliary switches 125a-d electrically connected with contacts 114 of the interface board 100 via the backplane 300. The auxiliary switches 125a-d can be used by the end user for additional control of the actuator or associated devices.

Contacts 114 of the interface board 100 are designed as plug-in contacts to electrically connect with pins or plugs of the edge board connector 200, which can be located in the slot 208. Terminals 112 (e.g., terminals 6-8) of the interface board 100 electrically connect to the field control device 330, with terminal 6 acting as the common output to the field control device 330. It is generally expected to receive two types of control signals as input to the interface board 100 at terminals 7 and 8 (e.g., terminal 7 receives a signal for, and electrically connects to, terminal 6 via a switch for clockwise operation, terminal 8 receives a signal for, and electrically connects to, terminal 6 via a switch for counter-clockwise operation). If internal power is provided to the interface board 100 from the actuator, terminal 6 receives the supply power. If external power is provided to the interface board 100 from the field control device 330 (e.g., 24 VDC, 120 VAC, or the like), terminals 4 and 5 can be used to receive such external power. For example, terminal 4 can receive 120 VAC external control, and terminal 5 can receive 24 VDC external control. It should be understood that only one of terminals 4 and 5 can receive external power at a time. Based on signals from the field control device 330 electrically connected to the interface board 100, a switch 332 can be actuated to connect terminals 6 and 7 to run the motor 322 in a clockwise direction, and can be actuated to connect terminals 6 and 8 to run the motor 322 in a counter-clockwise direction.

Contacts 114 (e.g., contacts 17-24) of the interface board 100 electrically connect with switches 124a-d. In some embodiments, the switches 124a-d can be structurally separate from the CPLD 344 and can be electrically connected (directly or indirectly) with the CPLD 344. In other embodiments, the switches 124a-d can be incorporated into the structure of the CPLD 344. Each of the switches 124a-d can be in a closed or "on" position (e.g., a first position) or in an open or "off" position (e.g., a second position). In some embodiments, as discussed below, switches 124a-b can be in an "off" position, and the combination of positions of switches 124c-d can be used to vary the wiring configuration of the interface board 100. Contacts 208 can be electrically connected to terminals E-N. In some embodiments, terminals E, F, J and K can send signals to the actuator regarding clockwise actuation of the motor 322, and terminals G, H, M and N send signals to the actuator regarding counter-clockwise actuation of the motor 322. Terminal 9 can be used as a "stop" signal in the 4-wire momentary with stop interface. When supplied with local control options, terminals A and B can be used as "Fault Out" dry (e.g., non-powered) contacts and terminals C and D can be used as "Remote Mode" contacts.

The position of the switches 124a-d can be used to reconfigure the wiring of the interface board 100 to accommodate 2-wire single contact closure, 3-wire inch/jog, 3-wire momentary, or 4-wire momentary with stop interfaces, depending on desired use. The purpose of each switch 124a-d position are discussed in detail below and illustrated in Tables 1-4. Based on the position of the switches 124a-d, the interface board 100 can control how terminals 6-9 react to signals coming into the interface board 100 from the field control device 330.

Positioning switch 124a in the "off" position places the actuator in a normal response or direct acting mode, which is defined as "clockwise-to-close," meaning the actuator will rotate in a clockwise direction in order to close the valve to which the actuator is attached. Positioning switch 124a in the "on" position places the actuator in a reverse response mode, which is defined as "clockwise-to-open." In certain applications, depending on the field control wiring, it may be desirable to reverse the response of the actuator.

Positioning the switch 124b in the "off" position places the actuator in a normal operation mode, and outputs from the interface board 100 are allowed to command the actuator. Positioning the switch 124b in the "on" position places the actuator in a disable mode, such that outputs from the interface board 100 are not delivered to the actuator. The disable mode can be used for troubleshooting command signals to the interface board 100 without delivering commands to the actuator. Although discussed herein as being used for disable and troubleshooting modes, in some embodiments, switches 124a-b can be reprogrammed for different commands or operations.

Positioning switches 124a-b in the "off" position and varying the position of the switches 124c-d can select the desired control wiring configuration. Thus, reconfiguring the wiring of the interface board 100 is controlled by the combination of positions of switches 124c-d, with switches 124a-b remaining in the "off" position and having additional functions not directly tied to the input configuration determination of the interface board 100. In some embodiments, the interface board 100 can include only two switches 124c-d for varying the wiring configuration of the interface board 100. As illustrated in Table 1 below, for a 2-wire single contact closure interface wiring configuration, switches 124a-d are each in the "off" position. As illustrated in Table 2 below, for a 3-wire inch/job interface wiring configuration, switches 124a-b, d are in the "off" position, and switch 124c is in the "on" position. As illustrated in Table 3 below, for a 3-wire momentary interface wiring configuration, switches 124a-c are in the "off" position, and switch 124d is in the "on" position. As illustrated in Table 4 below, for a 4-wire momentary with stop interface wiring configuration, switches 124a-b are in the "off" position, and switches 124c-d are in the "on" position. Manual actuation of the switches 124a-d can therefore be used to reconfigure the interface board 100 for different types of wiring configurations. Although referred to herein as being positioned in an "on" position or an "off" position, it should be understood that such positions of the switches 124a-d can be a first position and a second position.

TABLE 1

2-Wire Single Contact Closure, Normal Mode, Direct Acting

| Switch 1 | | Switch 2 | | Switch 3 | | Switch 4 | |
|---|---|---|---|---|---|---|---|
| ON | | ON | | ON | | ON | |
| OFF | ● | OFF | ● | OFF | ● | OFF | ● |

TABLE 2

3-Wire Inch/Jog, Normal Mode, Direct Acting

| Switch 1 | | Switch 2 | | Switch 3 | | Switch 4 | |
|---|---|---|---|---|---|---|---|
| ON | | ON | | ON | ● | ON | |
| OFF | ● | OFF | ● | OFF | | OFF | ● |

TABLE 3

3-Wire Momentary, Normal Mode, Direct Acting

| Switch 1 | | Switch 2 | | Switch 3 | | Switch 4 | |
|---|---|---|---|---|---|---|---|
| ON | | ON | | ON | | ON | ● |
| OFF | ● | OFF | ● | OFF | ● | OFF | |

TABLE 4

4-Wire Momentary with Stop, Normal Mode, Direct Acting

| Switch 1 | | Switch 2 | | Switch 3 | | Switch 4 | |
|---|---|---|---|---|---|---|---|
| ON | | ON | | ON | ● | ON | ● |
| OFF | ● | OFF | ● | OFF | | OFF | |

It should be understood that in some embodiments, the modular wiring interface board 100 can include any number of switching mechanisms (e.g., two, three, four, five, or the like), with the position of two switching mechanisms of the plurality of switching mechanisms being used to vary the wiring configuration of the modular wiring interface board 100. For example, as detailed above, two switching mechanisms of the plurality of switching mechanisms can be used to vary the wiring configuration of the modular wiring interface board 100, and the remaining switching mechanisms (if any) can be used for additional operations without having an effect on the logic or wiring configuration of the modular wiring interface board 100.

FIGS. 8A-8F show a wiring diagram of a backplane 300 and interface board 100 for a 24 VAC/VDC supply voltage for 2-wire single contact closure, 3-wire inch/jog, 3-wire momentary, or 4-wire momentary with stop interfaces with external power supply, and with local control. In some embodiments, the wiring diagram of FIGS. 8A-8F can be for an LED local control equipped on/off actuator for a 4-wire momentary with stop interface. The wiring diagram of FIGS. 8A-8F can be substantially similar to the wiring diagram of FIGS. 7A-7E, except for the distinctions noted herein. In particular, the wiring diagram of FIGS. 8A-8F includes an actuator main CPU 334 electrically disposed between the relay drive board 320 and motor 322, and the backplane 300. The actuator main CPU 334 can be electrically connected to an LED display panel 336 (if equipped), a non-intrusive mode select switch 338 for use in local mode, and a potentiometer 340 for mechanical position feedback. Limit switches 342 can be disposed between the actuator main CPU 334 and the backplane 300. The wiring diagram of FIGS. 8A-8F shows external power supply in the form of either 24 VAC or 24 VDC that can be connected to terminals 4 or 5, respectively, of the interface board 100. Rather than a single switch 332, the wiring diagram of FIGS. 8A-8F includes three switches 350, 352, 354 for controlling and directing the actuator to run counter-clockwise, stop, and run clockwise, respectively.

FIGS. 9A-9E show a wiring diagram of a backplane 300 and interface board 100 for a 24 VAC/VDC supply voltage for a 5-wire interface without local control. The wiring diagram of FIGS. 9A-9E can be substantially similar to the wiring diagram of FIGS. 7A-7E, except for the distinctions noted herein. In particular, rather than including a CPLD 344 with switches 124a-d, the terminals 112 can be electrically connected directly to the contacts 114. The wiring configuration of FIGS. 9A-9E can be used as a standard 5-wire interface board for connection of the control wiring. The interface board 100 of FIGS. 9A-9E includes contacts 114 along a first edge that engage with the slots 208 of the edge board connector 200 and a series of field wiring terminals 112 along an opposite edge. The backplane 300 card with the 5-wire standard interface control wiring configuration, and the interface board 100 of FIGS. 9A-9E inserted into the slots 208 of the edge board connector 200 on the backplane 300 can be considered the standard or baseline actuator configuration. If a user does not select or desire any of the other control wiring configurations, the 5-wire standard interface arrangement can be supplied and used.

If the user desires any of the 2-, 3-, 3-, or 4-wire configurations described above, the interface board 100 of FIGS. 9A-9E can be replaced with the configurable interface board 100 shown in, for example, FIGS. 7A-7E and 8A-8F. The interface board 100 can be factory or field configured by altering the position of the four switches 124a-d in sequences that are defined or assigned to each of the 2-, 3-, 3-, or 4-wire configurations, as noted above in connection with Tables 1-4. The modularity and assignability of the interface board 100 allows for a substantial reduction in the inventory that is carried by manufacturers or the number of distinct products that users generally purchase in order to achieve several distinct control wire configurations. The modularity or assignability of the interface board 100 thereby allows a user to purchase a single model of an actuator and field select the control wiring interface as needed for their application.

FIGS. 10A-10F show a wiring diagram of a backplane 300 and interface board 100 for a 24 VAC/VDC supply voltage for a 5-wire interface and with local control. The wiring diagram of FIGS. 10A-10F can be substantially similar to the wiring diagram of FIGS. 8A-8F, except for the distinctions noted herein. In particular, rather than including a CPLD 344 with switches 124a-d, the terminals 114 of the interface board 100 can be connected directly to contacts 208 of the edge board connector 200.

FIG. 11A-11E show a wiring diagram of a backplane 300 and interface board 100 for a 120 VAC supply voltage for a 5-wire interface. The wiring diagram of FIG. 11A-11E can be substantially similar to the wiring diagram of FIGS. 9A-9E, except for the distinctions noted herein. In particular, the wiring diagram of FIG. 11A-11E includes a 120 VAC supply voltage to terminals 1 and 2 of the backplane 300 for communication with a 120 VAC motor 322. The backplane 300 does not include a bridge 328. The interface board 100 of FIGS. 11A-11E can be swapped in for a 5-wire interface operation of the actuator without the incorporation of switches 124a-d. Rather than receiving a 24 VAC/VDC supply voltage, the interface board 100 of FIGS. 11A-11E can receive a supply voltage of 120 VAC.

FIG. 12A-12E show a wiring diagram of a backplane 300 and interface board 100 for a 120 VAC supply voltage for 2-wire single contact closure, 3-wire inch/jog, 3-wire momentary, or 4-wire momentary with stop interface. The wiring diagram of FIG. 12A-12E can be substantially similar to the wiring diagram of FIGS. 11A-11E, except for the distinctions noted herein. In particular, the wiring diagram of FIG. 12A-12E includes a CPLD 344 with switches 124a-d on the interface board 100 for coordinating communication between the field control device 330, the interface board 100, and the motor 322. The switches 124a-d of the wiring diagram of FIGS. 12A-12E allow for reconfiguring of the interface board 100 for each of the noted interfaces.

FIGS. 13A-13E show a wiring diagram of a backplane 300 and interface board 100 for a 480 VAC three phase supply voltage for a 5-wire interface. The wiring diagram of FIGS. 13A-13E can be substantially similar to the wiring diagram of FIGS. 10A-10F, except for the distinctions noted herein. In particular, the wiring diagram of FIGS. 13A-13E includes 480 VAC three phase supply voltage to terminals 1-3 of the backplane 300 for communication with the motor 322. The wiring diagram of FIGS. 13A-13E includes an auto-phase unit 360 for correcting power supply and logic operating the motor 322 on a three phase voltage motor, and a three phase reversing starter 362 electrically connected between the backplane 300 and the motor 322. The interface board 100 of FIGS. 13A-13E can be swapped in for a 5-wire interface operation of the actuator. Rather than receiving a 24 VAC/VDC or a 120 VAC supply voltage, the interface board 100 of FIGS. 13A-13E can receive a supply voltage of 480 VAC.

FIGS. 14A-14E show a wiring diagram of a backplane 300 and interface board 100 for a 480 VAC three phase supply voltage for 2-wire single contact closure, 3-wire inch/jog, 3-wire momentary, or 4-wire momentary with stop interfaces. The wiring diagram of FIGS. 14A-14E can be substantially similar to the wiring diagram of FIG. 13A-13E, except for the distinctions noted herein. In particular, the wiring diagram of FIGS. 14A-14E includes a CPLD 344 with switches 124a-d on the interface board 100 for coordinating communication between the field control device 330, the interface board 100, components 362, 364, and the motor 322. The switches 124a-d of the wiring diagram of FIGS. 14A-14E allow for reconfiguring of the interface board 100 for each of the noted interfaces.

Although FIGS. 7A-7E, 12A-12E and 14A-14E show the wiring diagrams as three different boards 100 replaceable or interchangeable with the system, in some embodiments, a single interface board 100 having each of the available wiring configurations for 24 VAC/VDC, 120 VAC, and 480 VAC can be provided. In some embodiments, three different boards 100 are provided to reduce the overall size of the interface board 100. The ability to configure the interface board 100 for 24 VAC/VDC, 120 VAC, and 480 VAC commands and 2-wire single contact closure, 3-wire inch/jog, 3-wire momentary, or 4-wire momentary with stop interfaces provides for fifteen different combinations of actuators the system can be used with.

FIGS. 15-18 show wiring diagrams of the interface board 100 for 2-wire single contact closure, 3-wire inch/jog, 3-wire momentary, or 4-wire momentary with stop interfaces, respectively. In each of these wiring configurations, the command or input statement received by the interface board 100 for actuation of the switches 124a-d of the interface board 100 can be output by the position of the limit switches of the actuator (e.g., limit switches 324, 326, 342). The start/stop commands input to the interface board 100 are therefore based on the signals received from the limit switches of the actuator.

Figure 15:
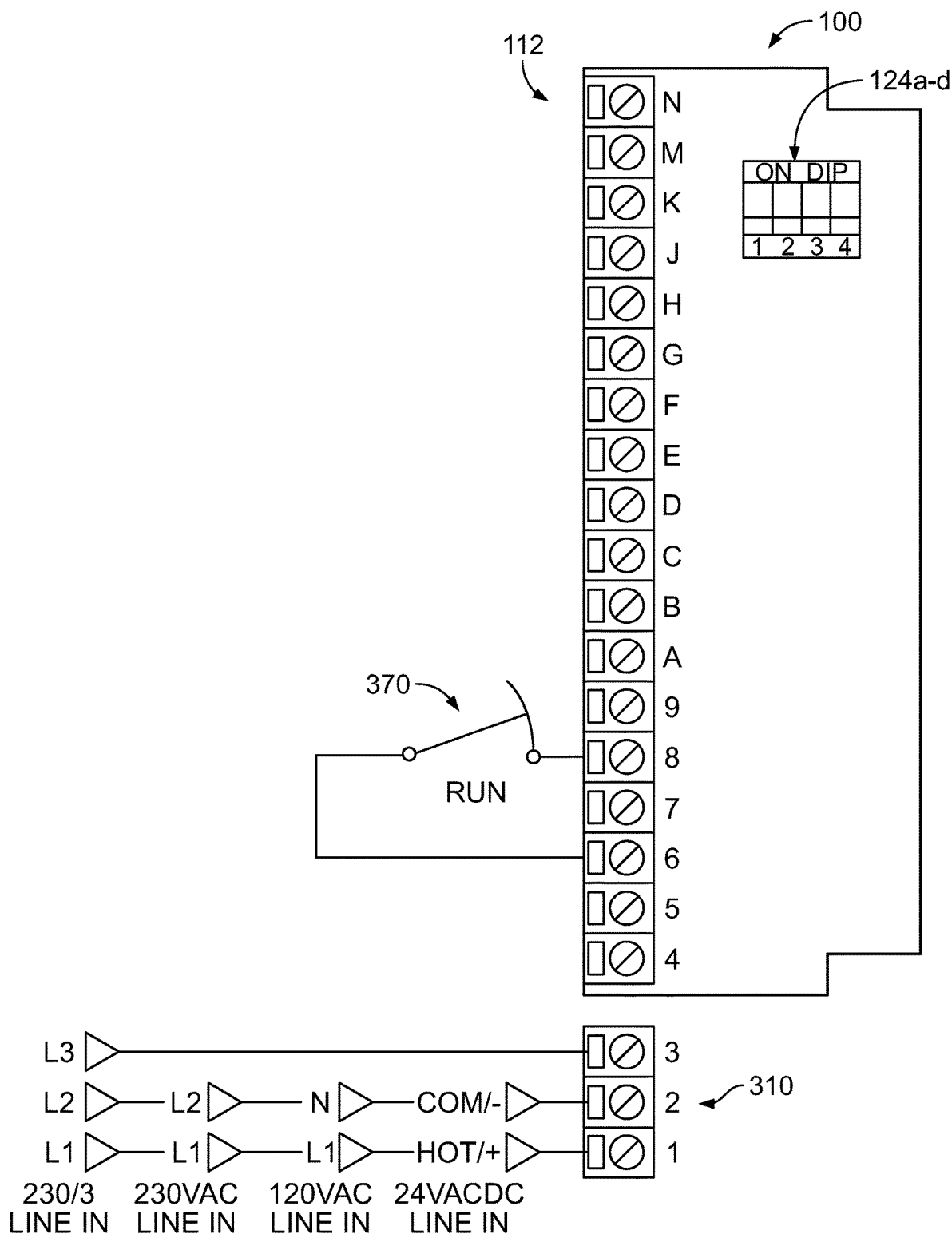
FIG. 15 is a wiring diagram of a modular wiring interface board for a 2-wire single contact closure interface with internal power support according to the present disclosure.

FIG. 15 is a wiring diagram of the interface board 100 for a 2-wire single contact closure interface with internal power support. The wiring configuration of FIG. 15 corresponds with the position of switches 124a-d shown in Table 1 above. In particular, FIG. 15 shows the specific switch position and wiring connection of terminals 6 and 8 of the interface board 100 for operation in the 2-wire single contact closure interface mode. The interface board 100 includes a single switch 370 electrically connecting terminals 6 and 8. The run switch 370 closure drives the actuator in its opposite of normal position. The switch 124a-d settings can be positioned in a normally open (NO) or normally closed (NC) operation. NO operation refers to an actuator starting in an open position and driving closed when switch 370 is closed. NC operation refers to an actuator starting in a closed position and driving open when switch 370 is closed. Supply voltage lines to terminals 310 can be, e.g., three phase 480 VAC, single phase 230 VAC, single phase 120 VAC, single phase 24 VAC/VDC, or the like. In some embodiments, externally powered field commands can be provided with 24 VDC and/or 120 VAC.

Figure 16:
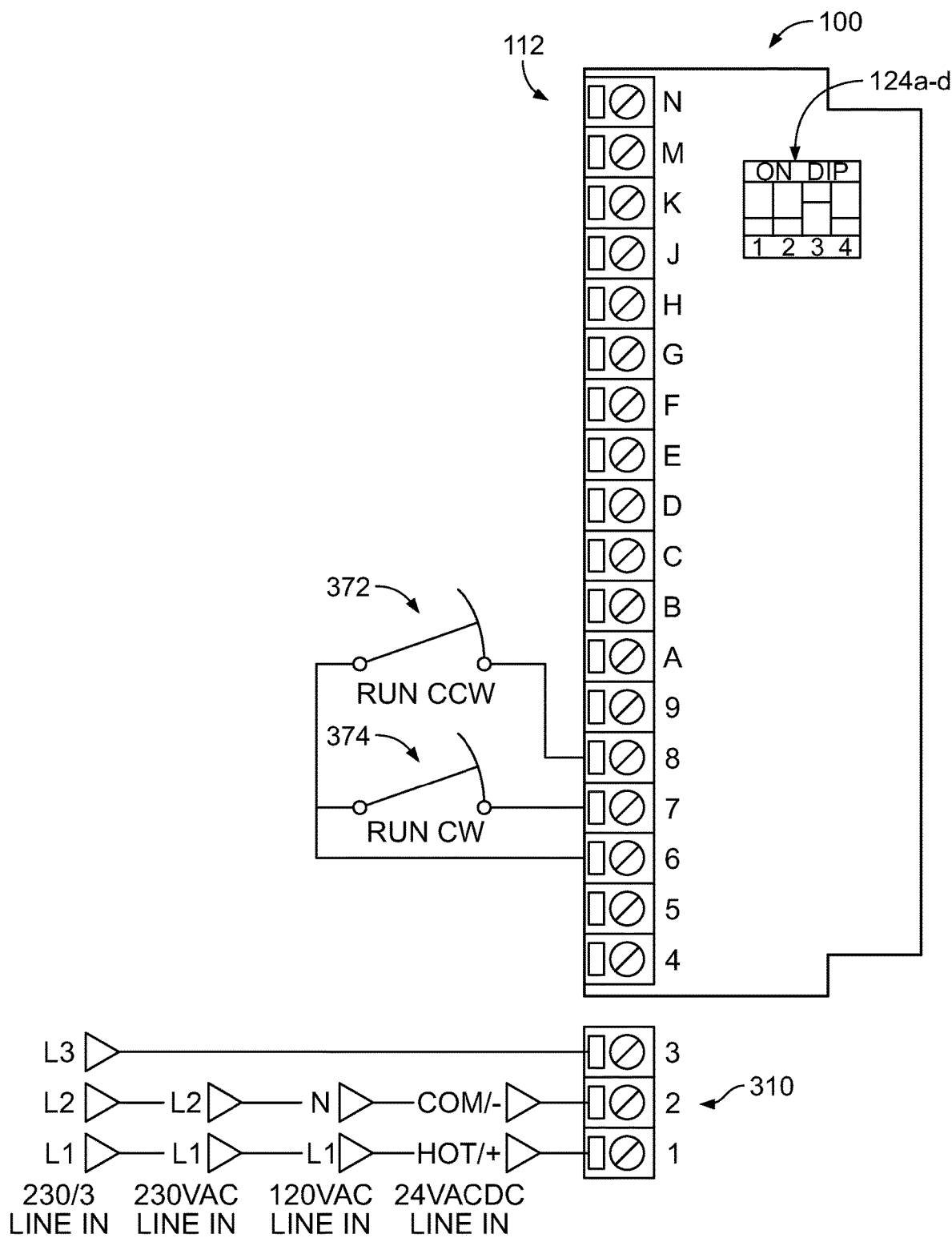
FIG. 16 is a wiring diagram of a modular wiring interface board for a 3-wire inch/jog interface with internal power support according to the present disclosure.

FIG. 16 is a wiring diagram of the interface board 100 for a 3-wire inch/jog interface with internal power support. The wiring configuration of FIG. 16 corresponds with the position of switches 124a-d shown in Table 2 above. In particular, FIG. 16 shows the specific switch position and wiring connection of terminals 6, 7 and 8 of the interface board 100 for operation in the 3-wire inch/jog interface. The interface board 100 includes two switches 372, 374. Switch 372 electrically connects terminals 6 and 8 for counter-clockwise operation, and switch 374 electrically connects terminals 6 and 7 for clockwise operation. Contact closure of either direction causes the actuator to run in the corresponding direction as long as contact of the switch 372, 374 remains closed. Opening the contact stops the actuator travel. Supply voltage lines to terminals 310 can be, e.g., three phase 230 VAC, single phase 230 VAC, single phase 120 VAC, single phase 24 VAC/VDC, or the like. In some embodiments, externally powered field commands can be provided with 24 VDC and/or 120 VAC.

Figure 17:
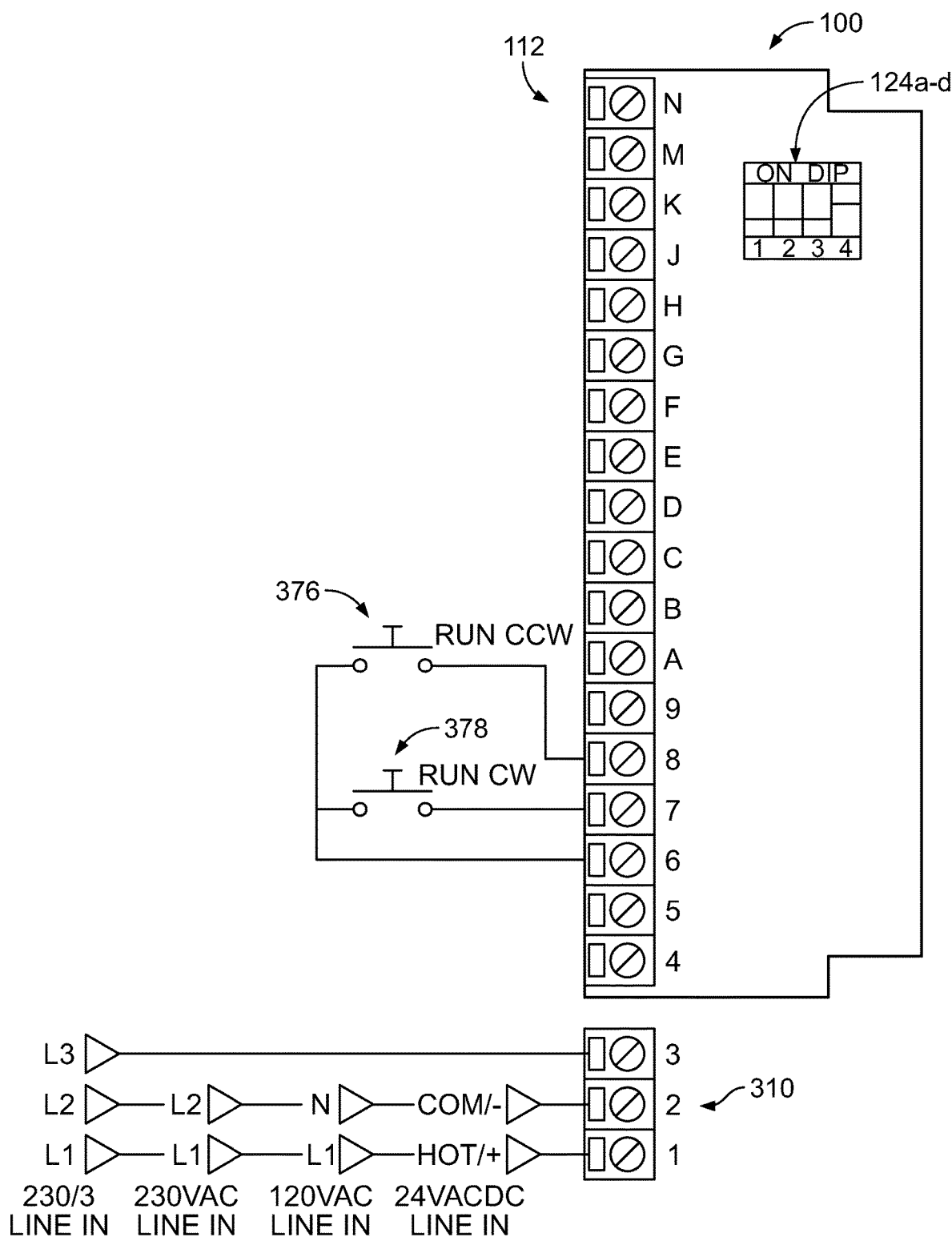
FIG. 17 is a wiring diagram of a modular wiring interface board for a 3-wire momentary interface with internal power support according to the present disclosure.

FIG. 17 is a wiring diagram of the interface board 100 for a 3-wire momentary with internal power support. The wiring configuration of FIG. 17 corresponds with the position of switches 124a-d shown in Table 3 above. In particular, FIG. 17 shows the specific switch position and wiring connection of terminals 6, 7 and 8 of the interface board 100 for operation in the 3-wire momentary interface. The interface board 100 includes two push or press switches 376, 378. Switch 376 electrically connects terminals 6 and 8 for counter-clockwise operation, and switch 378 electrically connects terminals 6 and 7 for clockwise operation. Momentary press of the clockwise or counter-clockwise switches 378, 376 causes the actuator to run to its intended end of travel position, which the actuator must travel to before it can be reversed. Supply voltage lines to terminals 310 can be, e.g., three phase 230 VAC, single phase 230 VAC, single phase 120 VAC, single phase 24 VAC/VDC, or the like. In some embodiments, externally powered field commands can be provided with 24 VDC and/or 120 VAC.

Figure 18:
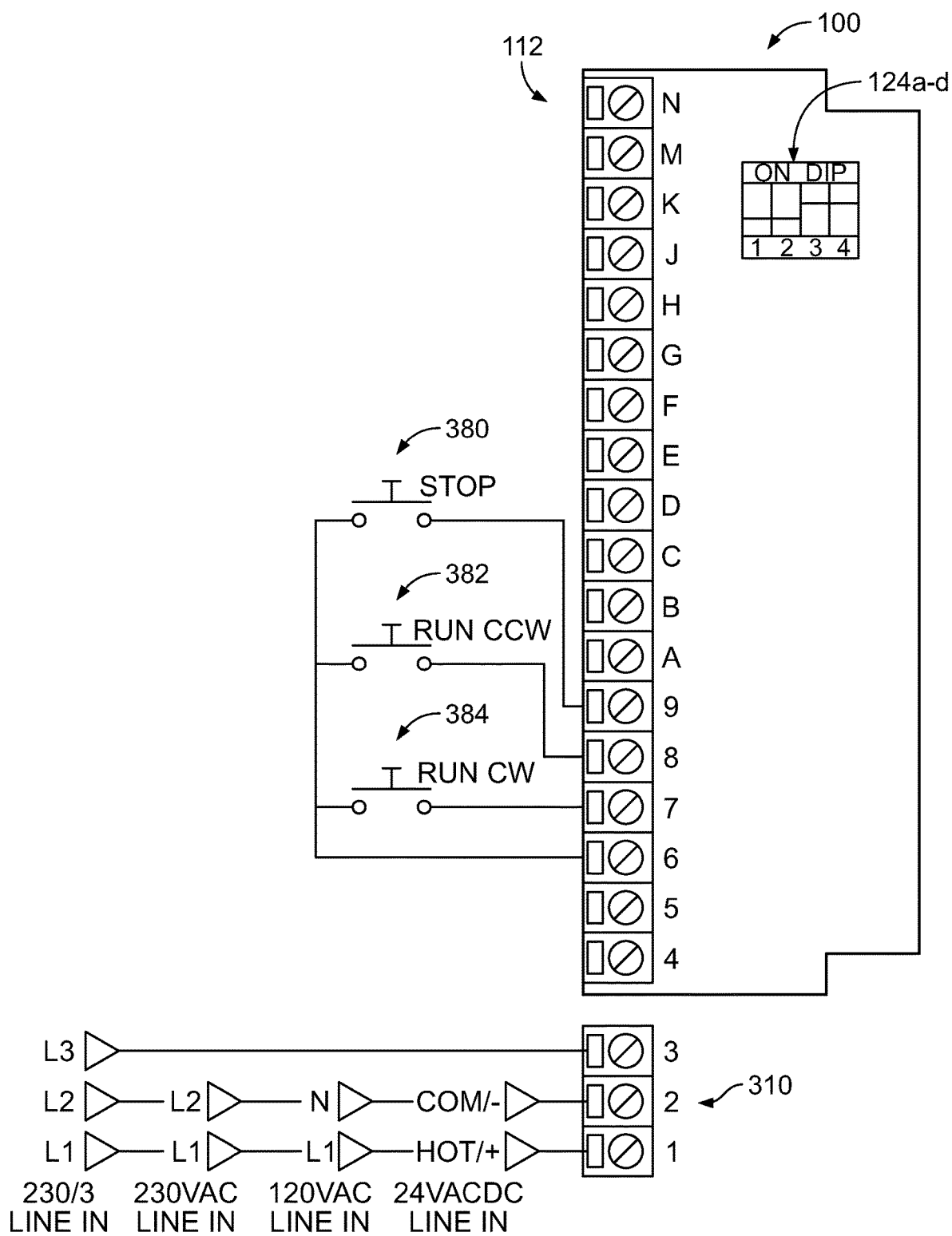
FIG. 18 is a wiring diagram of a modular wiring interface board for a 4-wire momentary with a stop interface and internal power support according to the present disclosure.

FIG. 18 is a wiring diagram of the interface board 100 for a 4-wire momentary with stop interface with internal power support. The wiring configuration of FIG. 18 corresponds with the position of switches 124a-d shown in Table 4 above. In particular, FIG. 18 shows the specific switch position and wiring connection of terminals 6, 7, 8 and 9 of the interface board 100 for operation in the 4-wire momentary with stop interface. The interface board 100 includes three push or press switches 380, 382, 384. Switch 380 electrically connects terminals 6 and 9 for a stop operation, switch 382 electrically connects terminals 6 and 8 for counter-clockwise operation, and switch 384 electrically connects terminals 6 and 7 for clockwise operation. Momentary press of the clockwise switch 384 or counter-clockwise switch 382 causes the actuator to run clockwise or counter-clockwise, respectively, to its intended end of travel position. A momentary press of the stop switch 380 stops travel of the actuator at its current position where it will remain until one of the switches 382, 384 is actuated. Supply voltage lines to terminals 310 can be, e.g., three phase 230 VAC, single phase 230 VAC, single phase 120 VAC, single phase 24 VAC/VDC, or the like. In some embodiments, externally powered field commands can be provided with 24 VDC and/or 120 VAC.

Figure 19:
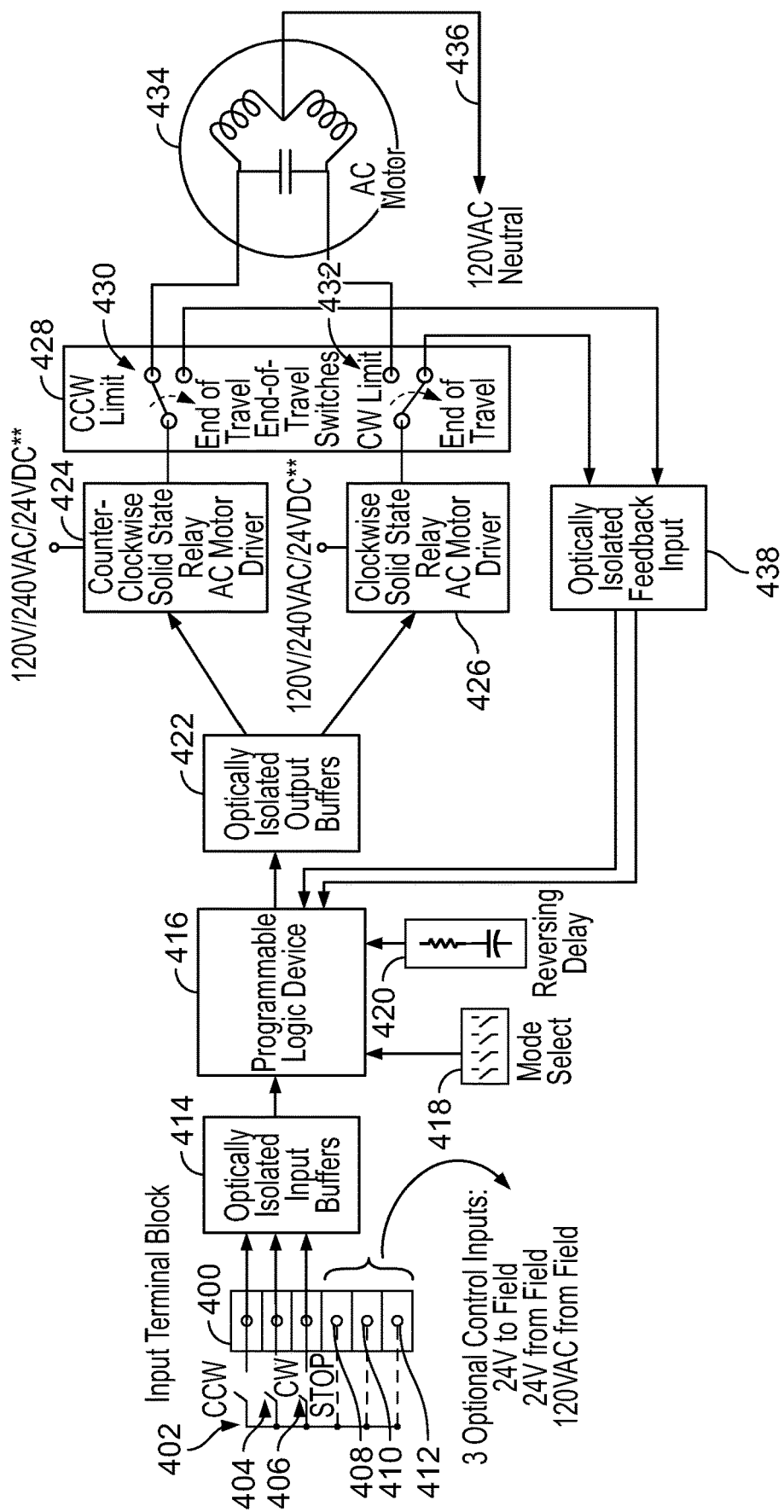
FIG. 19 is a block diagram of a modular wiring interface board for 2-wire single contact closure, 3-wire inch/jog, 3-wire momentary, or 4-wire momentary with stop interfaces according to the present disclosure.

FIG. 19 is a block diagram of a modular wiring interface board for 2-wire single contact closure, 3-wire inch/jog, 3-wire momentary, or 4-wire momentary with stop interfaces. The input terminal block 400 includes switches 402, 404, 406 for counter-clockwise operation, clockwise operation, and stop operation of the actuator, respectively. The input terminal block 400 includes three optional control inputs 408, 410, 412. For example, input 408 can be a 24 VAC connection to the field device, input 410 can be a 24 VAC connection from the field device, and input 412 can be a 120 VAC connection from the field device. The board includes optically isolated input buffers 414 that are electrically connected to and receive signals from the input terminal block 400.

The buffers 414 are electrically connected, and transmit signals, to a programmable logic device 416 (e.g., a CPLD). Switches 418 (e.g., four DIP switches) can be electrically connected to and transmit signals to the logic device 416 to select the wiring mode of operation of the board. The switches 418 can correspond with switches 124a-d on the interface board 100 shown in FIGS. 4 and 6-18. Although DIP switches 418 are discussed, in some embodiments, rotary switches, a header and jumper system, an auto-sensing/auto-selecting microprocessor, or the like, can be used to accommodate the different control wiring configurations. For example, rather than manual selectable switches 418, a microprocessor can be used to auto-sense the field wiring and/or input signal and auto-switch the wiring configuration to accommodate the command voltage.

Positioning a first switch of the switches 418 in the on position interchanges between the clockwise and counter-clockwise inputs. Positioning a second switch of the switches 418 in the on position disables the drive outputs. Positioning third and fourth switches of the switches 418 in the off position configures the interface board 100 for 2-wire momentary drive operation. In some embodiments, such positioning of the switches 418 can result in a delay on reverse. In some embodiments, the delay on reverse can be, e.g., about 0.5 seconds, or the like. Positioning the third switch in the off position and the fourth switch in the on position configures the interface board 100 for 3-wire momentary or latch mode, with the drive fully counter-clockwise or clockwise with momentary inputs. Positioning the third switch in the on position and the fourth switch in the off position configures the interface board 100 for 3-wire inch/jog mode, with counter-clockwise or clockwise press only driving while commanded (e.g., in contact). Positioning the third and fourth switches in the on position configures the interface board 100 for 4-wire momentary with stop or latched mode, with the drive fully counter-clockwise or clockwise with momentary inputs, or the drive is in the stop position. Tables 1-4 illustrate the different positions of switches 418 and the wiring configuration associated with each position. A reversing delay 420 can be electrically connected to and sends signals to the logic device 416.

Optically isolated output drivers 422 can be electrically connected to and receive signals from the logic device 416. A counter-clockwise solid state relay AC motor driver 424 can be electrically connected to and receive signals from the output drivers 422, and provides an output of, e.g., 120 VAC, 240 VAC, or the like. A clockwise solid state relay AC motor driver 426 can be electrically connected to and receive signals from the output drivers 422, and provides an output of, e.g., 120 VAC, 240 VAC, or the like. Solid state relays 424, 426 can drive 120 VAC and 240 VAC motors. In some embodiments, the outputs from the solid state relays 424, 426 can be configured to drive 24 VDC relays in a local control system. For example, for 120 VAC and 240 VAC motors, the solid state relay 424, 426 can directly drive the motor 434 via switching. A 24 VDC relay can be driven by the actuator having an actuator board with an internal circuit including switch logic for the low power DC signal (e.g., not driving the motor directly, but controlling the motor with relays built into the actuator).

End-of-travel switches 428 can be electrically connected to and receive signals from the motor drivers 424, 426. For example, a counter-clockwise limit switch 430 can receive signals from the motor driver 424, and a clockwise limit switch 432 can receive signals from the motor driver 426. The end-of-travel switches 428 can be electrically connected to and transmit signals to an AC motor 434. The AC motor 434 can include a 120 VAC neutral return 436. Optically isolated feedback input 438 can be electrically connected to and receive signals from the limit switches 430, 432, and transmits signals to the logic device 416.

Figure 20:
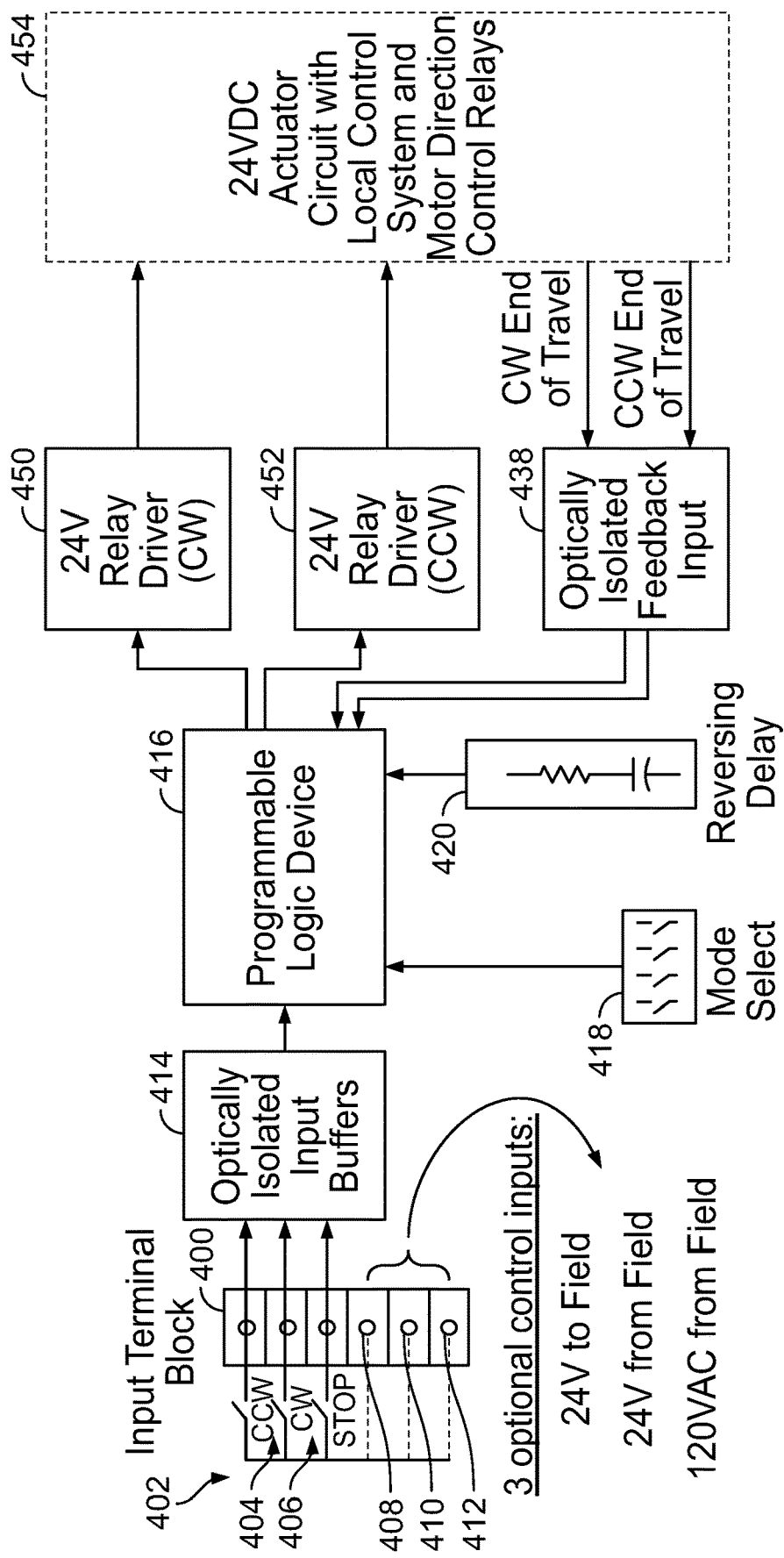
FIG. 20 is a block diagram of a modular wiring interface board for 2-wire single contact closure, 3-wire inch/jog, 3-wire momentary, or 4-wire momentary with stop interfaces according to the present disclosure, including a 24 VDC output from the modular wiring interface board to a 24 VDC local control relay drive input.

FIG. 20 is a block diagram of a modular wiring interface board for 2-wire single contact closure, 3-wire inch/jog, 3-wire momentary, or 4-wire momentary with stop interfaces according to the present disclosure, including a 24 VDC output from the modular wiring interface board to a 24 VDC local control relay drive input. The input terminal block 400, switches 402-406, optional control inputs 408-412, optically isolated input buffers 414, programmable logic device 416, switches 418, reversing delay 420, and optically isolated feedback input 438 can be substantially similar in structure and/or function to those shown and discussed in FIG. 19. A 24 VDC clockwise relay driver 450 and a 24 VDC counter-clockwise relay driver 452 can be electrically connected to and receive signals from the logic device 416. The drivers 450, 452 output signals to a 24 VDC actuator 454 (e.g., an actuator circuit with local control and motor direction control relays). The actuator 454 outputs a return signal to the optically isolated feedback input 438 which, in return, outputs feedback signals to the programmable logic device 416. In some embodiments, the 24 VDC relay drive output can be provided on the interface board to power the solid state relays. The 24 VDC relay drive output can drive the relay coils directly, with the solid state relay having coils isolated from their contacts. In such embodiments, if two additional electric terminals are added to the edge-board connector, the assembler and/or end user can be provided with the option of using the 24 VDC relay drive output by virtue of choosing a wiring connection to the 24 VDC relay drive or the 120/240 VAC motor drive.

The exemplary interface board 100 therefore accepts 24 VDC externally generated commands, 120 VAC externally generated commands, or 24 VDC internally generated commands (e.g., generated internally from the actuator). In some embodiments, the interface board 100 can be configured to accept 12 VDC or 120 VAC internal commands. As noted above, although a dedicated interface board 100 is discussed for each of the above-listed command voltages due to space constraints within the actuators for which this interface board 100 is designed, in some embodiments, the interface board 100 can be designed with componentry and circuitry to accommodate each of the command voltages listed above on a single "universal" board. The interface board 100 can output signals ranging from 50 VAC to 250 VAC via opto-solid state relays with zero crossing detection. Output signals in the 10 VDC to 90 VDC range can also be generated. Limit switches within the actuator can trip at the end-of-travel position, providing a signal back into the logic controller via the opto-isolators, thereby shutting off the drive signal.

The modular interface board 100 allows field configurability of a base series of actuators, providing up to four additional wiring configurations to a particular base actuator (as compared to traditional actuators with specific main voltage and specific control voltage characteristics that necessitated separate purchases/manufacturing). The interface board 100 includes a limited number of wiring terminal connecting points compared to high-end actuators, which can have several dozen possible connection terminals, depending on input voltage and desired functionality. The interface board 100 uses a mechanical switching mechanism and method (e.g., via DIP switches) to configure the interface board 100 according to the user's available input voltage and desired functionality.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

What is claimed is:

1. A modular wiring interface board for an actuator, comprising:
   a body;
   a plurality of electrical terminals each configured to receive a signal from a field control device for controlling an actuator;
   a switch panel for altering of switch positions; and
   a processor in electrical communication with the plurality of electrical terminals and the switch panel;
   wherein the processor reconfigures a wiring configuration of the plurality of electrical terminals to accommodate different field control devices based on said switch positions.

2. The modular wiring interface board of claim 1, wherein the switch panel includes at least one of a dual in-line package (DIP) switch, a rotary switch, an auxiliary switch, or a header and jumper system positionable into said switch positions.

3. The modular wiring interface board of claim 1, comprising one or more electrical contacts configured to be placed in electrical communication with a backplane that receives a main supply voltage,
   wherein the main supply voltage is at least one of 12 VDC, 24 VDC, 24 VAC, 120 VAC, 240 VAC, or 480 VAC, and the modular wiring interface board is configurable for use with the main supply voltage received by the backplane.

4. The modular wiring interface board of claim 1, wherein at least one of the plurality of electrical terminals is configured to receive a control voltage, and the control voltage is at least one of 12 VDC, 12 VAC, 24 VAC, 24 VDC, 48 VDC, 120 VAC, or 230 VAC.

5. The modular wiring interface board of claim 1, wherein the switch panel includes a plurality of switching mechanisms positionable into said switch positions.

6. The modular wiring interface board of claim 5, wherein each of the plurality of switching mechanisms is at least one of a dual in-line package (DIP) switch, a rotary switch, an auxiliary switch, or a header and jumper system.

7. The modular wiring interface board of claim 1, wherein the wiring configuration of the modular wiring interface board is at least one of a 2-wire single contact closure interface, a 3-wire inch/jog interface, a 3-wire momentary interface, or a 4-wire momentary with stop interface.

8. The modular wiring interface board of claim 7, wherein for the 2-wire single contact closure interface wiring configuration, a first switch of the switch panel is positioned in a second position, and a second switch of the switch panel is positioned in a second position.

9. The modular wiring interface board of claim 7, wherein for the 3-wire inch/jog interface wiring configuration, a first switch of the switch panel is positioned in a first position, and a second switch of the switch panel is positioned in a second position.

10. The modular wiring interface board of claim 7, wherein for the 3-wire momentary interface wiring configuration, a first switch of the switch panel is positioned in a second position, and a second switch of the switch panel is positioned in a first position.

11. The modular wiring interface board of claim 7, wherein for the 4-wire momentary with stop interface wiring configuration, a first switch of the switch panel is positioned in a first position, and a second switch of the switch panel is positioned in a first position.

12. The modular wiring interface board of claim 7, wherein for the 2-wire single contact closure interface wiring configuration, a first switch of the switch panel is positioned in a second position, a second switch of the switch panel is positioned in a second position, a third switch of the switch panel is positioned in a second position, and a fourth switch of the switch panel is positioned in a second position.

13. The modular wiring interface board of claim 7, wherein for the 3-wire inch/jog interface wiring configuration, a first switch of the switch panel is positioned in a second position, a second switch of the switch panel is positioned in a second position, a third switch of the switch panel is positioned in a first position, and a fourth switch of the switch panel is positioned in a second position.

14. The modular wiring interface board of claim 7, wherein for the 3-wire momentary interface wiring configuration, a first switch of the switch panel is positioned in a second position, a second switch of the switch panel is positioned in a second position, a third switch of the switch panel is positioned in a second position, and a fourth switch of the switch panel is positioned in a first position.

15. The modular wiring interface board of claim 7, wherein for the 4-wire momentary with stop interface wiring configuration, a first switch of the switch panel is positioned in a second position, a second switch of the switch panel is positioned in a second position, a third switch of the switch panel is positioned in a first position, and a fourth switch of the switch panel is positioned in a first position.

16. The modular wiring interface board of claim 1, comprising electrical isolating components configured to isolate all input and all output signals of the modular wiring interface board.

17. The modular wiring interface board of claim 16, wherein the electrical isolating components include at least one opto-relay and at least one opto-isolator.

18. The modular wiring interface board of claim 1, wherein the processor is a complex programmable logic device (CPLD).

19. A modular wiring interface board for an actuator, comprising:
a body;
a plurality of electrical terminals each configured to receive a signal from a field control device for controlling an actuator; and
a processor in electrical communication with the plurality of electrical terminals;
wherein the processor is configured to automatically sense a field wiring of, or input signal to, the plurality of electrical terminals and reconfigure a wiring configuration of the plurality of electrical terminals based on the sensed field wiring or input signal to accommodate different field control devices.

20. The modular wiring interface board of claim 19, comprising one or more electrical contacts configured to be placed in electrical communication with a backplane that receives a main supply voltage,
wherein the main supply voltage is at least one of 12 VDC, 24 VDC, 24 VAC, 120 VAC, 240 VAC, or 480 VAC, and the modular wiring interface board is configurable for use with the main supply voltage received by the backplane.

21. The modular wiring interface board of claim 19, wherein at least one of the plurality of electrical terminals is configured to receive a control voltage, and the control voltage is at least one of 12 VDC, 12 VAC, 24 VAC, 24 VDC, 48 VDC, 120 VAC, or 230 VAC.

22. The modular wiring interface board of claim 19, wherein the wiring configuration of the modular wiring interface board is at least one of a 2-wire single contact closure interface, a 3-wire inch/jog interface, a 3-wire momentary interface, or a 4-wire momentary with stop interface.

23. The modular wiring interface board of claim 19, comprising electrical isolating components configured to isolate all input and all output signals of the modular wiring interface board.

24. The modular wiring interface board of claim 23, wherein the electrical isolating components include at least one opto-relay and at least one opto-isolator.

25. The modular wiring interface board of claim 19, wherein the processor is a complex programmable logic device (CPLD).

* * * * *